United States Patent
Araki et al.

(10) Patent No.: US 6,636,393 B1
(45) Date of Patent: Oct. 21, 2003

(54) MAGNETIC TRANSDUCER AND THIN-FILM MAGNETIC HEAD HAVING A STACKED STRUCTURE INCLUDING AN INTERLAYER HAVING A HIGH ELECTRICAL RESISTANCE

(75) Inventors: Satoru Araki, Chuo-ku (JP); Yoshihiro Tsuchiya, Chuo-ku (JP); Masashi Sano, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/425,200

(22) Filed: Oct. 22, 1999

(30) Foreign Application Priority Data

Aug. 12, 1999 (JP) .......................................... 11-228850
Sep. 3, 1999 (JP) .......................................... 11-250638

(51) Int. Cl.⁷ ............................................... G11B 5/39
(52) U.S. Cl. .................................................. 360/324.11
(58) Field of Search ........................... 360/324.1, 324.11, 360/324.12

(56) References Cited

U.S. PATENT DOCUMENTS

| | | | |
|---|---|---|---|
| 5,408,377 A | | 4/1995 | Gurney et al. ......... 360/324.11 |
| 5,828,529 A | | 10/1998 | Gill .............................. 360/325 |
| 6,038,107 A | * | 3/2000 | Pinarbasi ............... 360/324.11 |
| 6,046,892 A | * | 4/2000 | Aoshima et al. ....... 360/324.11 |
| 6,051,309 A | * | 4/2000 | Fujikata et al. ............. 428/332 |
| 6,134,090 A | * | 10/2000 | Mao et al. ................ 360/324.1 |
| 6,282,068 B1 | * | 8/2001 | Pinarbasi ............... 360/324.11 |
| 6,292,335 B1 | * | 9/2001 | Gill ........................ 360/324.11 |
| 6,295,187 B1 | * | 9/2001 | Pinarbasi ............... 360/324.11 |
| 6,317,298 B1 | * | 11/2001 | Gill ........................ 360/324.11 |
| 6,327,122 B1 | * | 12/2001 | Pinarbasi ............... 360/324.11 |
| 6,338,899 B1 | * | 1/2002 | Fukuzawa et al. .......... 428/332 |
| 6,340,533 B1 | * | 1/2002 | Ueno et al. ................. 428/611 |
| 6,341,052 B2 | * | 1/2002 | Hayashi ................... 360/324.1 |
| 6,353,518 B2 | * | 3/2002 | Pinarbasi ............... 360/324.11 |
| 6,353,519 B2 | * | 3/2002 | Pinarbasi ............... 360/324.11 |
| 6,356,419 B1 | * | 3/2002 | Gill ........................ 360/324.11 |
| 6,388,847 B1 | * | 5/2002 | Horng et al. ........... 360/324.11 |

FOREIGN PATENT DOCUMENTS

JP          11-7614        1/1999

OTHER PUBLICATIONS

Y. Kamiguchi et al., *CoFe Specular Spin Valves With A Nano Oxide Layer*, Digest of Intermag 99, pp. 5527–5530 (1999).

* cited by examiner

Primary Examiner—Jefferson Evans
(74) Attorney, Agent, or Firm—Oliff & Berridge, PLC.

(57) ABSTRACT

A magnetic transducer and a thin film magnetic head capable of increasing a resistance change are provided. A spin valve film has a stacked structure comprising a soft magnetic layer, a nonmagnetic layer, a ferromagnetic layer, an antiferromagnetic layer and a protective layer which are stacked in sequence on an underlying layer. Electrical resistance is changed in accordance with a relative angle between the orientation of magnetization of the ferromagnetic layer and the orientation of magnetization of the soft magnetic layer. The ferromagnetic layer includes an inner ferromagnetic layer, a coupling layer and an outer ferromagnetic layer. The inner ferromagnetic layer and the outer ferromagnetic layer are magnetically coupled to each other sandwiching the coupling layer, whereby the magnetizations oriented in opposite directions are generated. A ferromagnetic interlayer having magnetism and the electrical resistance higher than the electrical resistance of the inner ferromagnetic layer is included in the inner ferromagnetic layer closest to the nonmagnetic layer in the ferromagnetic layer. When a current flows through the stack, the ferromagnetic interlayer reflects at least some electrons and limits a route for the electrons and thus a rate of resistance change is increased.

39 Claims, 17 Drawing Sheets

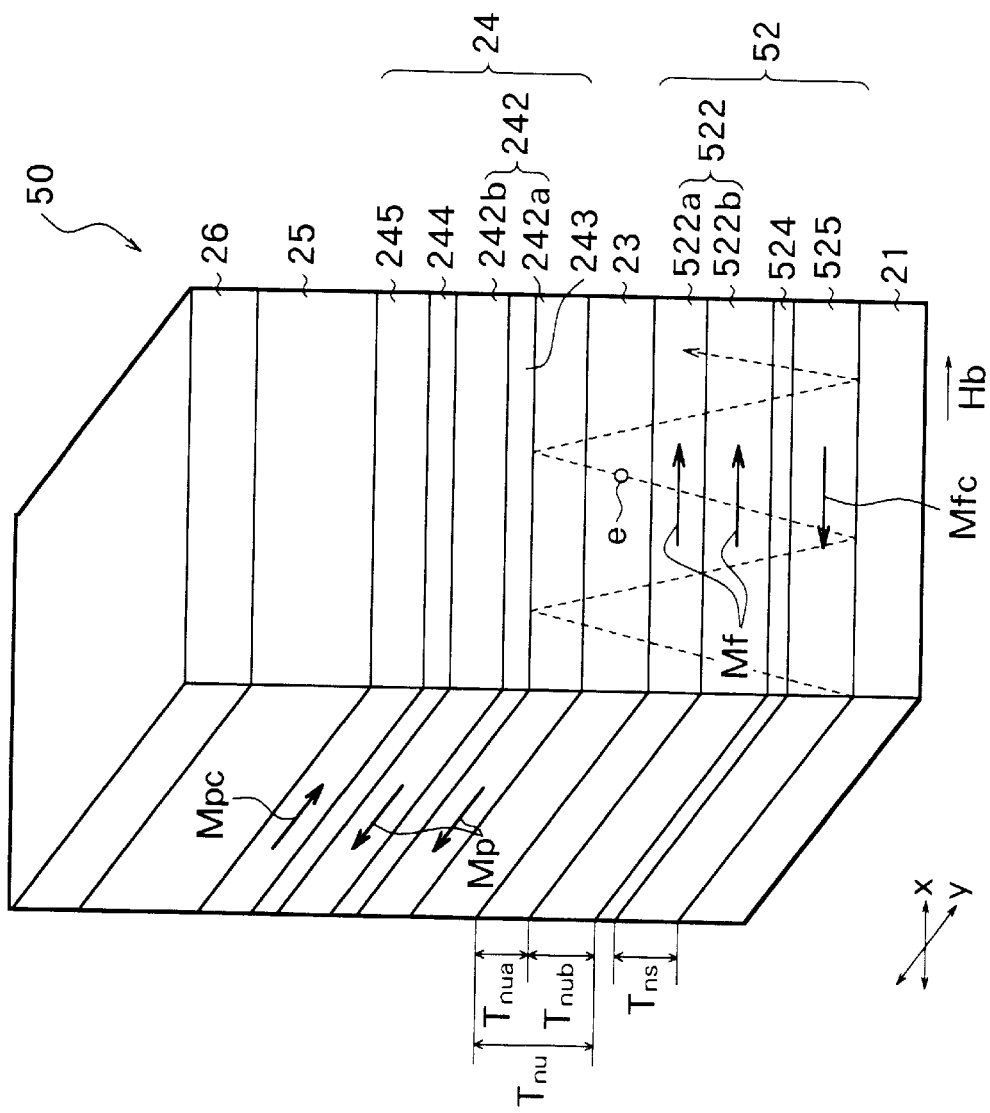

MAGNETIC TRANSDUCER AND THIN-FILM MAGNETIC HEAD HAVING A STACKED STRUCTURE INCLUDING AN INTERLAYER HAVING A HIGH ELECTRICAL RESISTANCE

BACKGROUND OF THE INVENTION

1. Field of the Invention

The invention relates to a magnetic transducer and a thin film magnetic head using the same and more particularly to a magnetic transducer and a thin film magnetic head which can obtain the more excellent rate of resistance change.

2. Description of the Related Art

Recently, an improvement in performance of a thin film magnetic head has been sought in accordance with an improvement in a surface recording density of a hard disk or the like. A composite thin film magnetic head, which has a stacked structure comprising a reproducing head having a magnetoresistive effect (hereinafter referred to as an MR element) that is one of magnetic transducers and a recording head having an inductive-type magnetic transducer, is widely used as the thin film magnetic head.

MR elements include an AMR element using a magnetic film (an AMR film) exhibiting an anisotropic magnetoresistive effect (an AMR effect), a GMR element using a magnetic film (a GMR film) exhibiting a giant magnetoresistive effect (a GMR effect), and so on.

The reproducing head using the AMR element is called an AMR head, and the reproducing head using the GMR element is called a GMR head. The AMR head is used as the reproducing head whose surface recording density exceeds 1 gigabit per square inch, and the GMR head is used as the reproducing head whose surface recording density exceeds 3 gigabits per square inch.

As the GMR film, a "multilayered type (antiferromagnetic type)" film, an "inductive ferromagnetic type" film, a "granular type" film, a "spin valve type" film and the like are proposed. Of these types of films, the spin valve type film is the GMR film which is considered to be relatively simple in structure, to exhibit a great change in resistance even under a low magnetic field and to be suitable for mass production.

FIG. 22 shows the structure of a general spin valve type GMR film (hereinafter referred to as a spin valve film). A surface indicated by reference symbol S in the drawing corresponds to the surface facing a magnetic recording medium. This spin valve film has the stacked structure comprising an underlying layer 91, a soft magnetic layer 92 made of a soft magnetic material, a nonmagnetic layer 93 made of a nonmagnetic material, a ferromagnetic layer 94 made of a ferromagnetic material, an antiferromagnetic layer 95 made of an antiferromagnetic material and a protective layer 96, the layers 92, 93, 94, 95 and 96 being stacked in this order on the underlying layer 91. Exchange coupling occurs on an interface between the ferromagnetic layer 94 and the antiferromagnetic layer 95, and thus the orientation of magnetization Mp of the ferromagnetic layer 94 is fixed in a fixed direction. On the other hand, the orientation of magnetization Mf of the soft magnetic layer 92 is freely changed in accordance with an external magnetic field.

A direct current is fed through the ferromagnetic layer 94, the nonmagnetic layer 93 and the soft magnetic layer 92 in the direction of a biasing magnetic field Hb, for example. This current is subjected to the resistance in accordance with a relative angle between the orientation of the magnetization Mf of the soft magnetic layer 92 and the orientation of the magnetization Mp of the ferromagnetic layer 94. Application of a signal magnetic field causes the change in the orientation of the magnetization Mf of the soft magnetic layer 92 and thus the change in electrical resistance of the spin valve film. The change in the resistance is detected as the change in a voltage. Recently, the greater a rate of resistance change (sometimes referred to as a rate of MR change) has been desired in order to allow magnetic recording at ultra-high density exceeding 20 gigabits per square inch.

A cited reference "CoFe specular spin valves with a nano oxide layer", 1999 Digests of INTERMAG 99, published by May 18, 1999 reports that the rate of resistance change is improved by providing an oxide layer called an NOL layer for the ferromagnetic layer of the spin valve film.

Moreover, U.S. Pat. No. 5,408,377 discloses the spin valve film having the structure comprising the soft magnetic layer including therein a coupling layer (an AF coupling film) made of ruthenium (Ru) in order to increase the rate of resistance change. Furthermore, U.S. Pat. No. 5,828,529 discloses another spin valve film having the structure comprising the ferromagnetic layer including therein the coupling layer made of ruthenium.

However, there is no description about the material and film thickness of the oxide layer called the NOL layer in the above-described cited reference "CoFe specular spin valves with a nano oxide layer", 1999 Digests of INTERMAG 99, published on May 18, 1999. Moreover, it is not clear the part of where the NOL layer is formed in the ferromagnetic layer.

Additionally, the improvement in the rate of resistance change is not given specifically and a relationship between the rate of resistance change and any other properties is not clear in U.S. Pat. Nos. 5,408,377 and 5,828,529.

SUMMARY OF THE INVENTION

The invention is made in view of the above problems. It is an object of the invention to provide a magnetic transducer and a thin film magnetic head which can increase a rate of resistance change and can also obtain good values of other properties.

A magnetic transducer of the invention comprises a nonmagnetic layer having a pair of facing surfaces, a soft magnetic layer formed on one surface of the nonmagnetic layer, a ferromagnetic layer formed on the other surface of the nonmagnetic layer and capable of having two magnetizations oriented in opposite directions, and an antiferromagnetic layer formed on the ferromagnetic layer on the side opposite to the nonmagnetic layer, wherein the ferromagnetic layer includes a ferromagnetic interlayer having magnetism and the ferromagnetic interlayer has higher electrical resistance than at least a part of the rest of the ferromagnetic layer.

In the magnetic transducer of the invention, the ferromagnetic layer has two magnetizations oriented in opposite directions, thereby reducing an influence of a magnetic field generated by the ferromagnetic layer upon the soft magnetic layer. Moreover, the electrical resistance of the ferromagnetic interlayer is higher than the electrical resistance of at least a part of the rest of the ferromagnetic layer. Thus, when a sense current flows through the magnetic transducer, the ferromagnetic interlayer reflects at least some electrons and thus limits a route by which the electrons move. As a result, the rate of resistance change is increased and thus even a low signal magnetic field can be detected. Furthermore, since the ferromagnetic interlayer has the magnetism, two portions in the ferromagnetic layer facing each other. across the ferromagnetic interlayer are magnetically integrated with each other.

The magnetic transducer of the invention can further adopt the following modes in addition to the above-described configuration.

In the magnetic transducer of the invention, it is desirable that a distance $D_{k1}$ between the nonmagnetic layer and the ferromagnetic interlayer is from 1.5 nm to 3 nm inclusive. Moreover, it is desirable that a thickness of the ferromagnetic interlayer is from 0.5 nm to 1 nm inclusive.

Desirably, the ferromagnetic layer includes an inner ferromagnetic layer, an outer ferromagnetic layer and a coupling layer sandwiched therebetween, and the inner ferromagnetic layer and the outer ferromagnetic layer are magnetically coupled to each other sandwiching the coupling layer. Such a configuration allows the ferromagnetic layer to have two magnetizations oriented in opposite directions. In this case, desirably, a relationship between the distance $D_{k1}$ between the nonmagnetic layer and the ferromagnetic interlayer and a distance $D_{k2}$ between the ferromagnetic interlayer and the coupling layer of the ferromagnetic layer is defined as $1.2 \leq D_{k1}/D_{k2} \leq 3$.

Additionally, the inner ferromagnetic layer may have a first inner ferromagnetic layer and a second inner ferromagnetic layer, and the ferromagnetic interlayer may be formed between the first inner ferromagnetic layer and the second inner ferromagnetic layer. In this case, desirably, the first inner ferromagnetic layer, the ferromagnetic interlayer, the second inner ferromagnetic layer, the coupling layer and the outer ferromagnetic layer are arranged in this order on the nonmagnetic layer. Such an arrangement allows limiting the route for the electrons to a particularly narrow range, thereby further increasing the rate of resistance change.

Desirably, a relationship between a thickness $T_{ku1}$ of the first inner ferromagnetic layer of the inner ferromagnetic layer and a thickness $T_{ku2}$ of the second inner ferromagnetic layer thereof is defined as $1.2 \leq T_{ku1}/T_{kus} \leq 3$. Moreover, desirably, a relationship between the sum total of the thickness $T_{ku1}$ of the first inner ferromagnetic layer, the thickness $T_{ku2}$ of the second inner ferromagnetic layer and a thickness $T_{kn}$ of the ferromagnetic interlayer and a thickness $T_{ks}$ of the outer ferromagnetic layer is defined as $1.2 \leq (T_{ku1}+T_{ku2}+T_{kn})/T_{ks} \leq 3$.

Furthermore, desirably, the soft magnetic layer includes an inner soft magnetic layer, an outer soft magnetic layer and a coupling layer sandwiched therebetween, and the inner soft magnetic layer and the outer soft magnetic layer are magnetically coupled to each other sandwiching the coupling layer.

The soft magnetic layer may include a soft magnetic interlayer having magnetism, and the soft magnetic interlayer may have higher electrical resistance than at least a part of the rest of the soft magnetic layer. In such a configuration, when the sense current flows through the magnetic transducer, the route for the electrons is further limited by the ferromagnetic interlayer in the ferromagnetic layer and the soft magnetic interlayer in the soft magnetic layer. Consequently, the rate of resistance change is further increased. In this case, desirably, the thickness of the soft magnetic interlayer is from 0.5 nm to 1 nm inclusive. Moreover, desirably, a distance $D_{n1}$ between the nonmagnetic layer and the soft magnetic interlayer is from 1.5 nm to 3 nm inclusive. Desirably, a distance $D_{n2}$ between the coupling layer and the soft magnetic interlayer of the soft magnetic layer is from 0.8 nm to 2.0 nm inclusive. Furthermore, desirably, a relationship between the distance $D_{n1}$ between the nonmagnetic layer and the soft magnetic interlayer and the distance $D_{n2}$ between the soft magnetic interlayer and the coupling layer of the soft magnetic layer is defined as $1.2 \leq D_{n1}/D_{n2} \leq 3$.

In addition, the inner soft magnetic layer may have a first inner soft magnetic layer and a second inner soft magnetic layer, and the soft magnetic interlayer may be formed between the first inner soft magnetic layer and the second inner soft magnetic layer. In this case, desirably, the first inner soft magnetic layer, the soft magnetic interlayer, the second inner soft magnetic layer, the coupling layer and the outer soft magnetic layer are arranged in this order on the nonmagnetic layer. Moreover, desirably, a relationship between the sum total of a thickness $T_{nu1}$ of the first inner soft magnetic layer, a thickness $T_{nu2}$ of the second inner soft magnetic layer and a thickness $T_{nn}$ of the soft magnetic interlayer and a thickness $T_{ns}$ of the outer soft magnetic layer is defined as $0.35 \leq T_{ns}/(T_{nu1}+T_{nn}+T_{nu2}) \leq 0.70$.

Another magnetic transducer of the invention comprises a nonmagnetic layer having a pair of facing surfaces, a soft magnetic layer formed on one surface of the nonmagnetic layer and capable of having two magnetizations oriented in opposite directions, a ferromagnetic layer formed on the other surface of the nonmagnetic layer, and an antiferromagnetic layer formed on the ferromagnetic layer on the side opposite to the nonmagnetic layer, wherein the soft magnetic layer includes a soft magnetic interlayer having magnetism and the soft magnetic interlayer has higher electrical resistance than at least a part of the rest of the soft magnetic layer.

In another magnetic transducer of the invention, the soft magnetic layer has two magnetizations oriented in opposite directions and thus an effective thickness of the soft magnetic layer is reduced. As a result, the rate of resistance change is increased. Moreover, the electrical resistance of the soft magnetic interlayer is higher than the electrical resistance of at least a part of the rest of the soft magnetic layer. Thus, when the sense current flows through the magnetic transducer, the soft magnetic interlayer reflects at least some electrons and thus limits the route for the electrons. As a consequence, the rate of resistance change is further increased. Moreover, since the soft magnetic interlayer has the magnetism, two portions in the soft magnetic layer facing each other across the soft magnetic interlayer are magnetically integrated with each other and therefore a coercive force is reduced.

Another magnetic transducer of the invention can further adopt the following modes in addition to the above-described configuration.

Desirably, the distance $D_{n1}$ between the nonmagnetic layer and the soft magnetic interlayer is from 1.5 nm to 3 nm inclusive. Moreover, desirably, the thickness of the soft magnetic interlayer is from 0.5 nm to 1 nm inclusive.

The soft magnetic layer may include an inner soft magnetic layer, an outer soft magnetic layer and a coupling layer sandwiched therebetween, and the inner soft magnetic layer and the outer soft magnetic layer may be magnetically coupled to each other sandwiching the coupling layer. Such a configuration enables the soft magnetic layer to have two magnetizations oriented in opposite directions. Moreover, desirably, the distance between the coupling layer and the soft magnetic interlayer of the soft magnetic layer is from 0.8 nm to 2.0 nm inclusive. Desirably, a relationship between the distance $D_{n1}$ between the nonmagnetic layer and the soft magnetic interlayer, and the distance $D_{n2}$ between the soft magnetic interlayer and the coupling layer of the soft magnetic layer is defined as $1.2 \leq D_{n1}/D_{n2} \leq 3$.

In addition, the inner soft magnetic layer may have a first inner soft magnetic layer and a second inner soft magnetic layer, and the soft magnetic interlayer may be formed between the first inner soft magnetic layer and the second inner soft magnetic layer. In this case, desirably, the first inner soft magnetic layer, the soft magnetic interlayer, the second inner soft magnetic layer, the coupling layer and the outer soft magnetic layer are arranged in this order on the nonmagnetic layer. Such an arrangement permits limiting the route for the electrons to a particularly narrow range, thereby further increasing the rate of resistance change. Desirably, a relationship between the thickness $T_{nu1}$ of the first inner soft magnetic layer and the thickness $T_{nu2}$ of the second inner soft magnetic layer is defined as $1.2 \leq T_{nu1}/T_{nu2} \leq 3$. Desirably, a relationship between the sum total of the thickness $T_{nu1}$ of the first inner soft magnetic layer, the thickness $T_{nu2}$ of the second inner soft magnetic layer and the thickness $T_{nn}$ of the soft magnetic interlayer and the thickness $T_{ns}$ of the outer soft magnetic layer is defined as $0.35 \leq T_{ns}/(T_{nu1}+T_{nn}+T_{nu2}) \leq 0.70$.

Furthermore, desirably, the first inner soft magnetic layer includes a nonmagnetic-layer-side layer close to the nonmagnetic layer and an interlayer-side layer close to the soft magnetic interlayer. Furthermore, desirably, the ferromagnetic layer includes a ferromagnetic interlayer having magnetism, and the ferromagnetic interlayer has higher electrical resistance than at least a part of the rest of the ferromagnetic layer.

Still another magnetic transducer of the invention comprises a nonmagnetic layer having a pair of facing surfaces, a soft magnetic layer formed on one surface of the nonmagnetic layer, a ferromagnetic layer formed on the other surface of the nonmagnetic layer, and an antiferromagnetic layer formed on the ferromagnetic layer on the side opposite to the nonmagnetic layer, wherein the ferromagnetic layer has a first ferromagnetic layer, a second ferromagnetic layer, a third ferromagnetic layer, a magnetic interlayer sandwiched between the first ferromagnetic layer and the second ferromagnetic layer, and a nonmagnetic interlayer sandwiched between the second ferromagnetic layer and the third ferromagnetic layer.

A further magnetic transducer of the invention comprises a nonmagnetic layer having a pair of facing surfaces, a soft magnetic layer formed on one surface of the nonmagnetic layer, a ferromagnetic layer formed on the other surface of the nonmagnetic layer, and an antiferromagnetic layer formed on the ferromagnetic layer on the side opposite to the nonmagnetic layer, wherein the soft magnetic layer has a first soft magnetic layer, a second soft magnetic layer, a third soft magnetic layer, a magnetic interlayer sandwiched between the first soft magnetic layer and the second soft magnetic layer, and a nonmagnetic interlayer sandwiched between the second soft magnetic layer and the third soft magnetic layer.

A thin film magnetic head of the invention has a magnetic transducer. The magnetic transducer comprises a ferromagnetic layer capable of having two magnetizations oriented in opposite directions, wherein the ferromagnetic layer includes a ferromagnetic interlayer having magnetism and the ferromagnetic interlayer has higher electrical resistance than at least a part of the rest of the ferromagnetic layer.

Another thin film magnetic head of the invention has a magnetic transducer. The magnetic transducer comprises a soft magnetic layer capable of having two magnetizations oriented in opposite directions, wherein the soft magnetic layer includes a soft magnetic interlayer having magnetism and the soft magnetic interlayer has higher electrical resistance than at least a part of the rest of the soft magnetic layer.

Still another thin film magnetic head of the invention has a magnetic transducer. The magnetic transducer comprises a ferromagnetic layer capable of having two magnetizations oriented in opposite directions, wherein the ferromagnetic layer has a first ferromagnetic layer, a second ferromagnetic layer, a third ferromagnetic layer, a magnetic interlayer sandwiched between the first ferromagnetic layer and the second ferromagnetic layer, and a nonmagnetic interlayer sandwiched between the second ferromagnetic layer and the third ferromagnetic layer.

A further thin film magnetic head of the invention has a magnetic transducer. The magnetic transducer comprises a soft magnetic layer capable of having two magnetizations oriented in opposite directions, wherein the soft magnetic layer has a first soft magnetic layer, a second soft magnetic layer, a third soft magnetic layer, a magnetic interlayer sandwiched between the first soft magnetic layer and the second soft magnetic layer, and a nonmagnetic interlayer sandwiched between the second soft magnetic layer and the third soft magnetic layer.

Other and further objects, features and advantages of the invention will appear more fully from the following description.

BRIEF DESCRIPTION OF THE DRAWINGS

FIG. 19 is a perspective view of an alternative to the stack of the MR element according to the first embodiment;

DETAILED DESCRIPTION OF THE PREFERRED EMBODIMENTS

Embodiments of the invention will be described in detail below with reference to the drawings.

[First embodiment]

<Configuration of MR Element and Thin Film Magnetic Head>

First, the configuration of an MR element that is one specific example of a magnetic transducer according to a first embodiment of the invention and a thin film magnetic head using the same will be described with reference to FIGS. 1 to 7.

Figure 1:
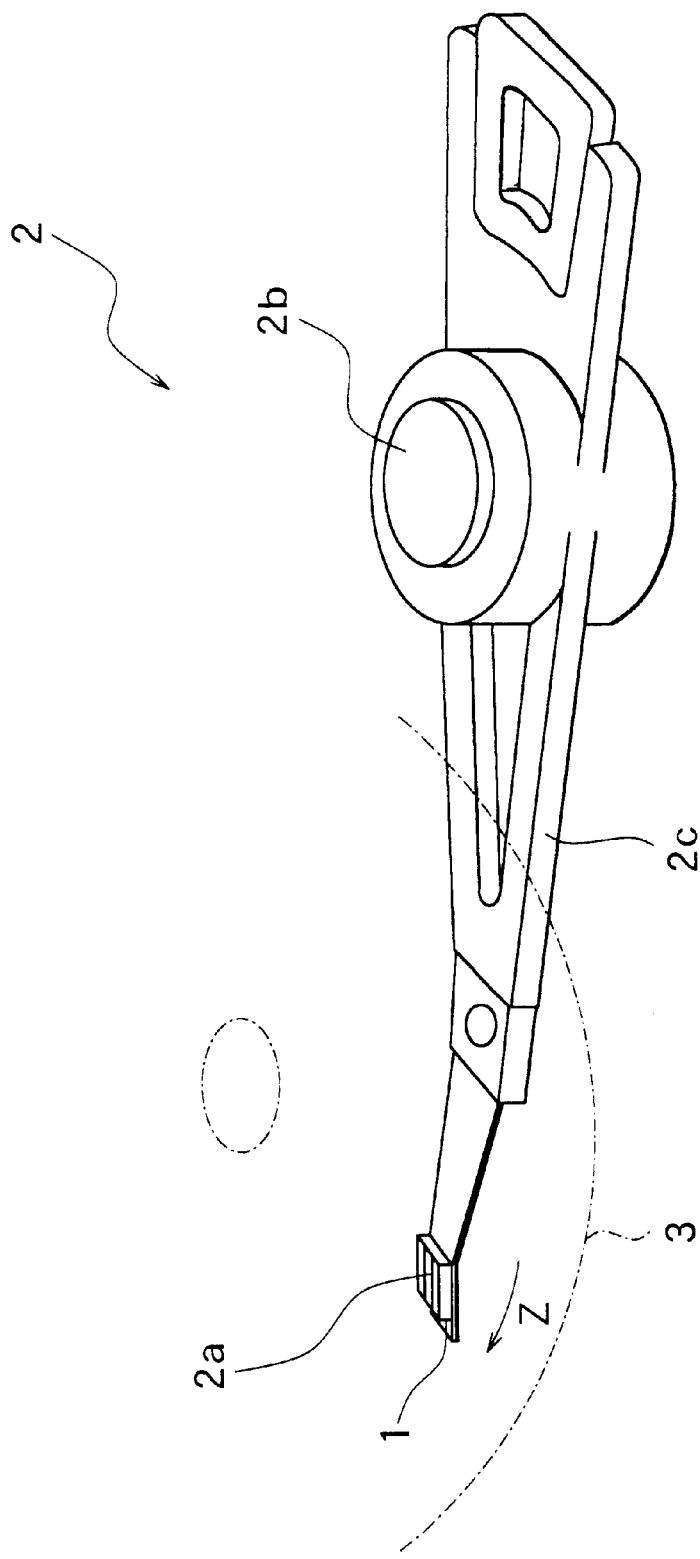
FIG. 1 is a perspective view of a configuration of an actuator arm comprising a thin film magnetic head including an MR element according to a first embodiment of the invention.

FIG. 1 shows the configuration of an actuator arm 2 comprising a thin film magnetic head 1 according to this embodiment. The actuator arm 2 is used in a hard disk drive not shown or the like, for example. The actuator arm 2 has a slider 2a on which the thin film magnetic head 1 is formed. For example, the slider 2a is mounted on the end of an arm section 2c rotatably supported by a supporting pivot 2b. The arm section 2c rotates by a driving force of a voice coil motor not shown, for example, and thus the slider 2a moves in a direction x in which the slider 2a crosses a track line along a recording surface of a magnetic recording medium 3 such as a hard disk (a lower surface of the recording surface in FIG. 1). For example, the magnetic recording medium 3 rotates in a direction z substantially perpendicular to the direction x in which the slider 2a crosses the track line. Thus, the rotation of the magnetic recording medium 3 and the movement of the slider 2a allow information to be recorded on the magnetic recording medium 3 or allow the recorded information to be readout from the magnetic recording medium 3.

Figure 2:
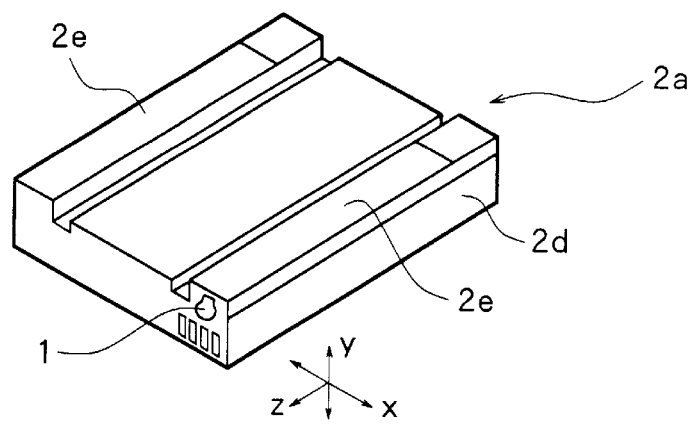
FIG. 2 is a perspective view of the configuration of a slider of the actuator arm shown in FIG. 1.

FIG. 2 shows the configuration of the slider 2a shown in FIG. 1. The slider 2a has a block-shaped base 2d made of $Al_2O_3.TiC$ (altic), for example. The base 2d is formed into a substantially hexahedral shape, for instance, and one face of this hexahedron faces closely to the recording surface of the magnetic recording medium 3 (see FIG. 1). The surface facing the recording surface of the magnetic recording medium 3 is called an air bearing surface (ABS) 2e. When the magnetic recording medium 3 rotates, an airflow generated between the recording surface of the magnetic recording medium 3 and the air bearing surface 2e allows the slider 2a to move slightly to separated from the recording surface in a direction y opposite to the recording surface. Thus, a fixed distance is provided between the air bearing surface 2e and the magnetic recording medium 3. The thin film magnetic head 1 is formed on one side (the left side in FIG. 2) adjacent to the air bearing surface 2e of the base 2d.

Figure 3:
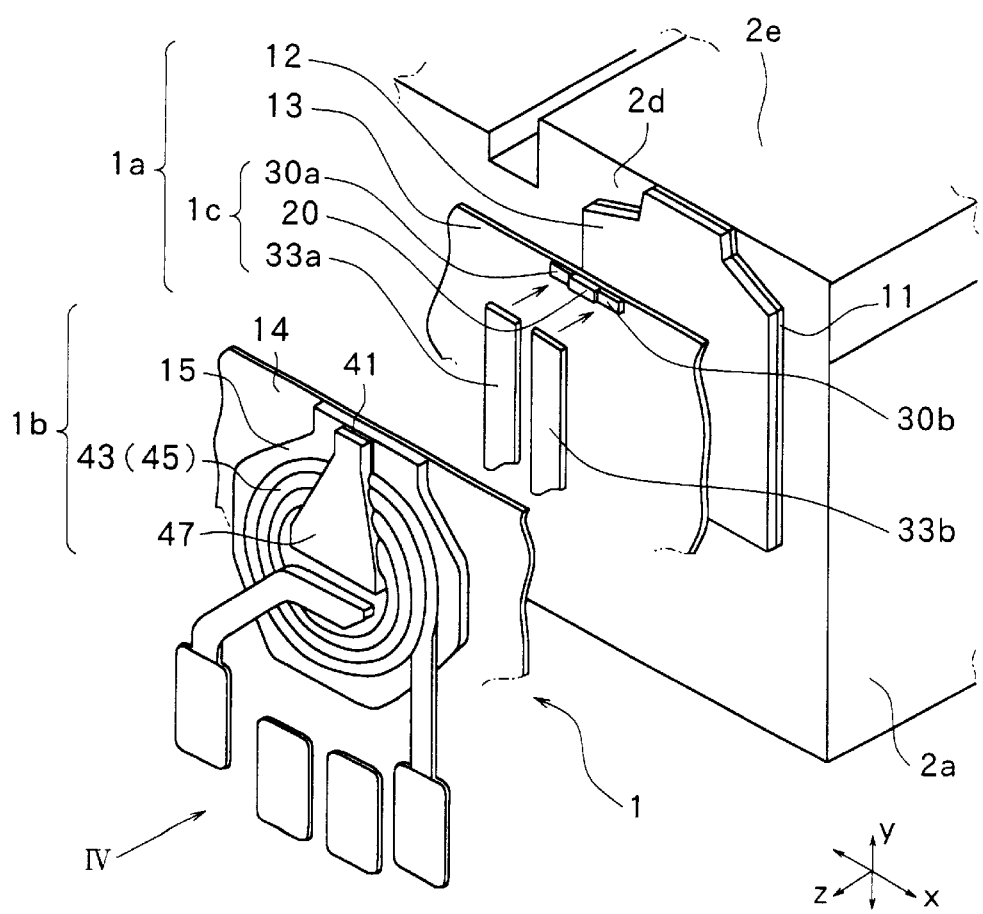
FIG. 3 is an exploded perspective view of the configuration of the thin film magnetic head according to the first embodiment.
Figure 4:
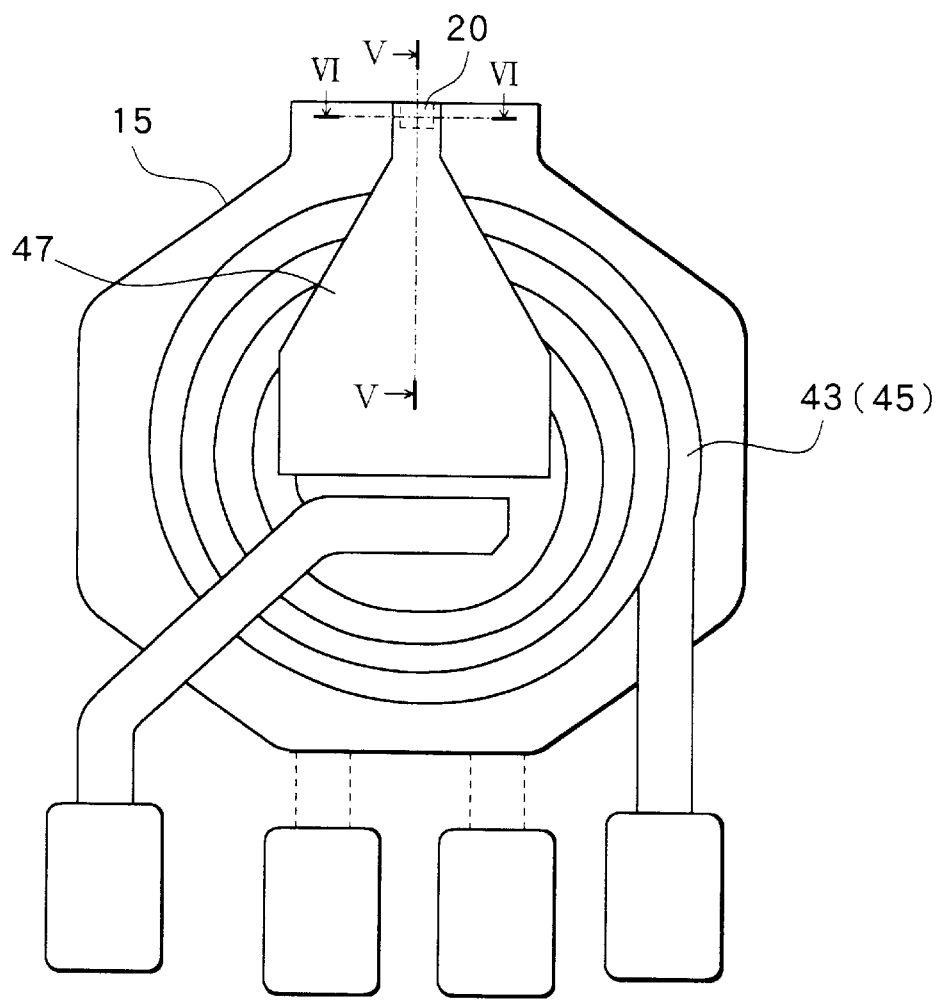
FIG. 4 is a plan view of a structure of the thin film magnetic head shown in FIG. 3 viewed from the direction of arrow IV.
Figure 5:
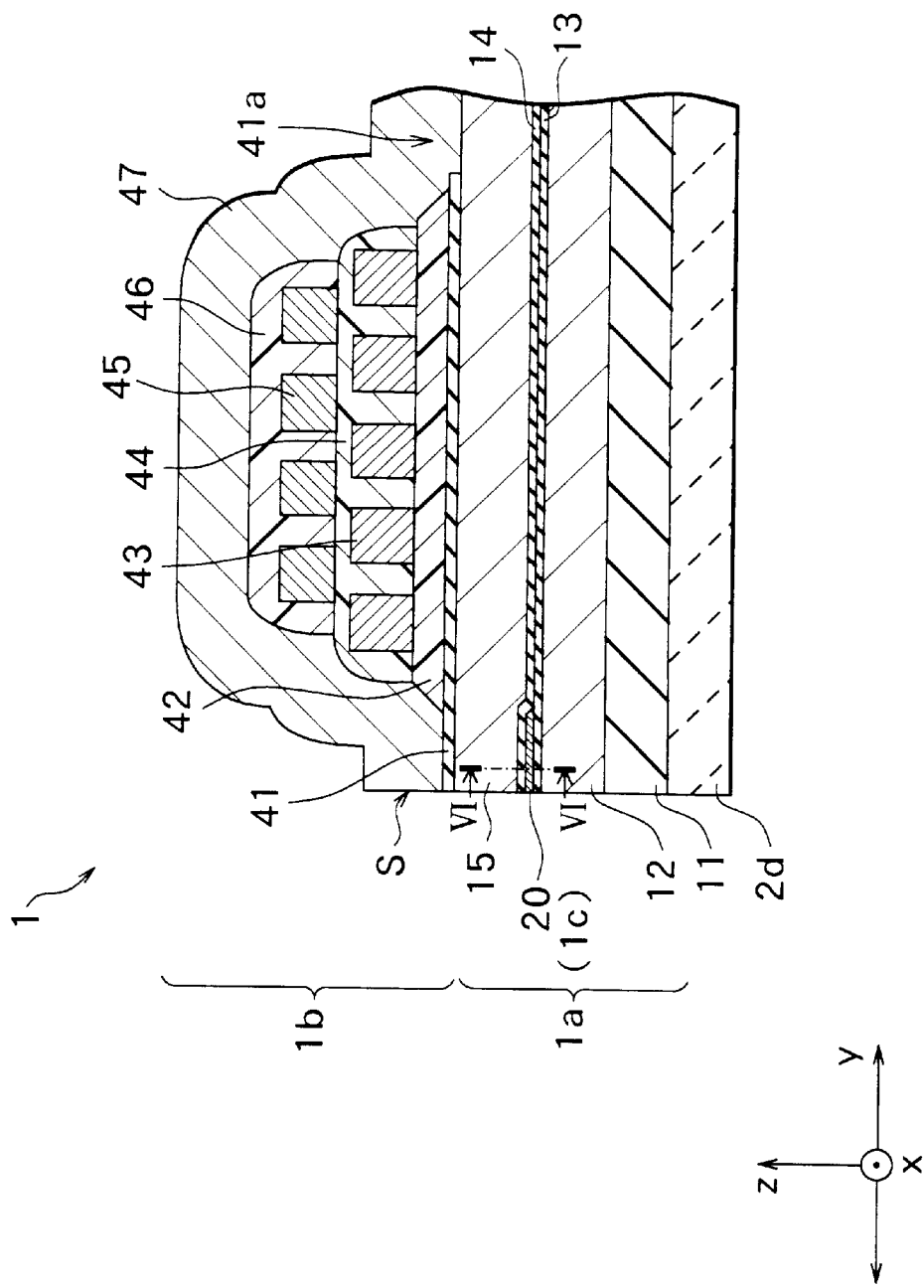
FIG. 5 is a cross sectional view taken in the direction of the arrows along the line V—V of FIG. 4, showing the structure of the thin film magnetic head shown in FIG. 3.
Figure 6:
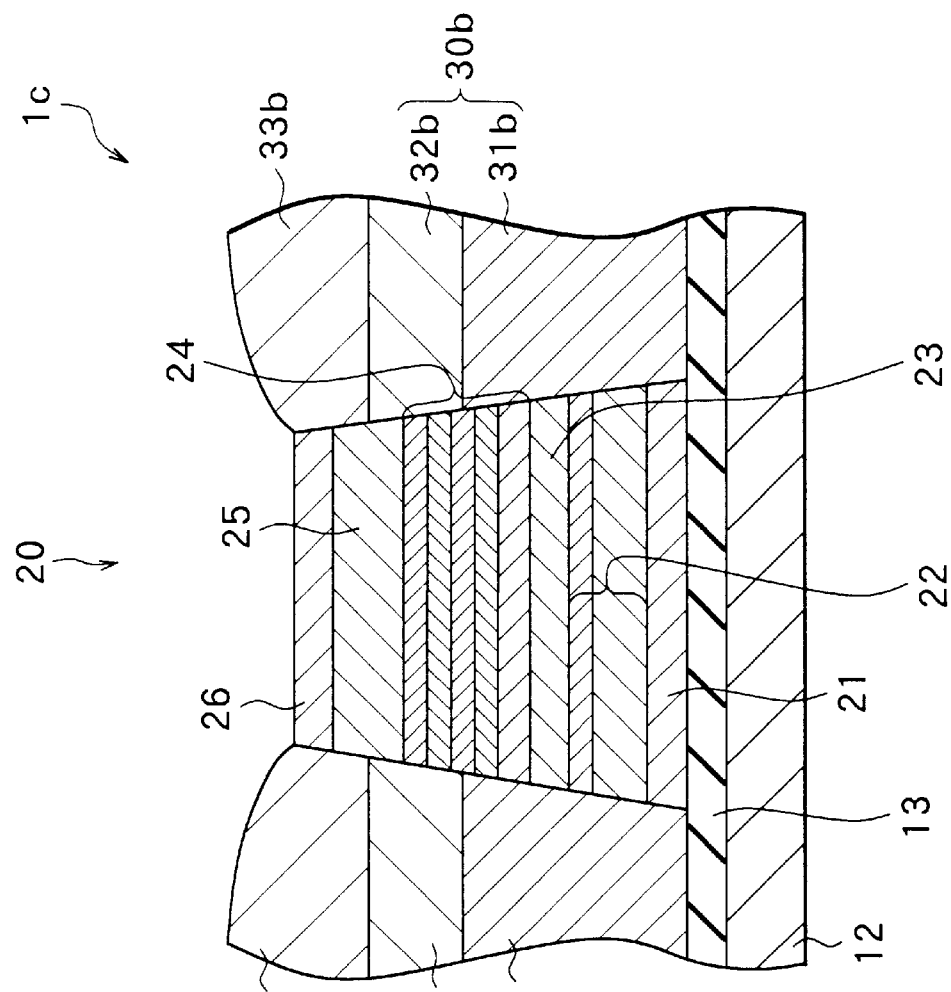
FIG. 6 is a cross sectional view taken in the direction of the arrows along the line VI—VI of FIG. 4, i.e., in the direction of the arrows along the line VI—VI of FIG. 5, showing the structure of the thin film magnetic head shown in FIG. 3.
Figure 7:
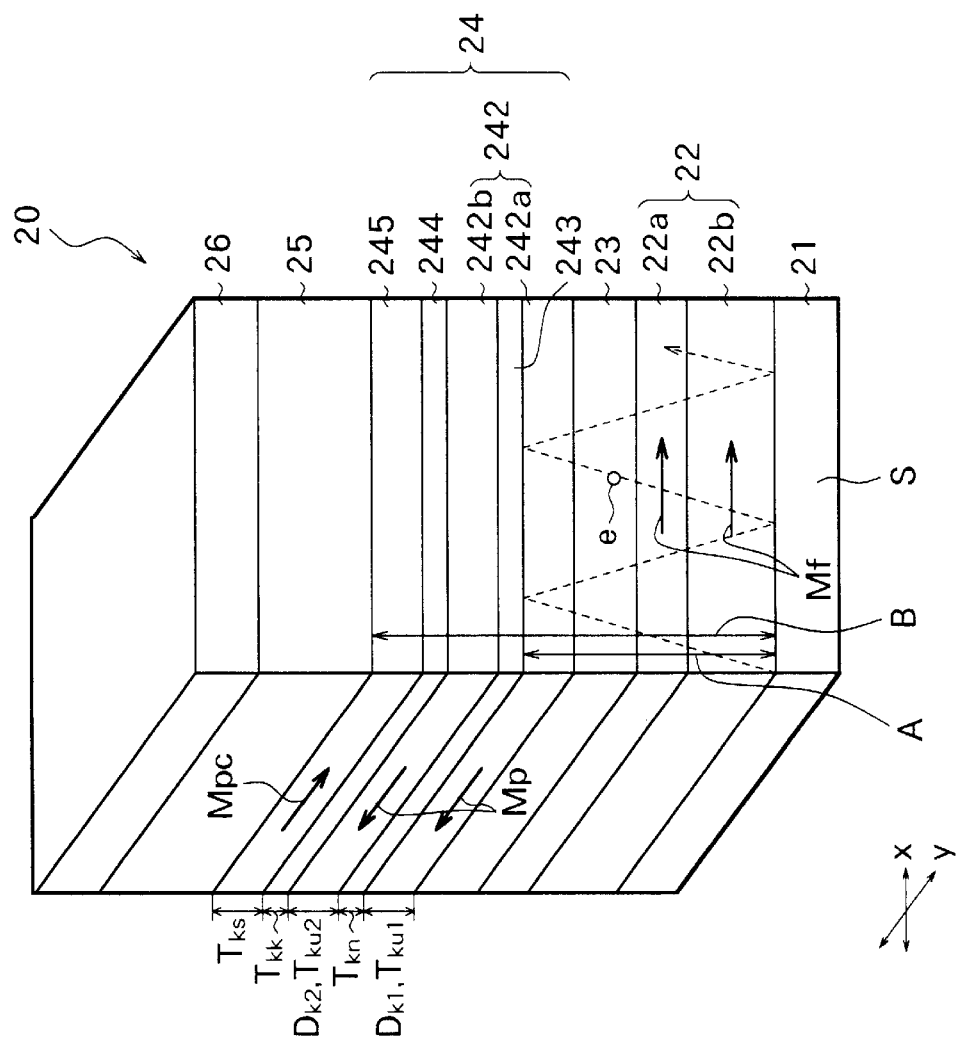
FIG. 7 is a perspective view of the structure of a stack of the MR element shown in FIG. 6.

FIG. 3 shows the exploded configuration of the thin film magnetic head 1. FIG. 4 shows a plan structure viewed from the direction of arrow IV of FIG. 3. FIG. 5 shows a sectional structure taken in the direction of the arrows along the line V—V of FIG. 4. FIG. 6 shows the sectional structure taken in the direction of the arrows along the line VI—VI of FIG. 4, i.e., in the direction of the arrows along the line VI—VI of FIG. 5. FIG. 7 shows a part of the structure shown in FIG. 6. The thin film magnetic head 1 has an integral structure comprising a reproducing head section 1a for reproducing magnetic information recorded on the magnetic recording medium 3 and a recording head section 1b for recording the magnetic information on the track line of the magnetic recording medium 3.

As shown in FIGS. 3 and 5, for example, the reproducing head section 1a has a stacked structure comprising an insulating layer 11, a bottom shield layer 12, a bottom shield gap layer 13, a top shield gap layer 14 and a top shield layer 15, the layers 11, 12, 13, 14 and 15 being stacked in this order on the base 2d close to the air bearing surface 2e. For example, the insulating layer 11 is 2 $\mu$m to 10 $\mu$m in thickness in the direction of stack (hereinafter referred to as a thickness) and is made of $Al_2O_3$ (alumina). For example, the bottom shield layer 12 is 1 $\mu$m to 3 $\mu$m in thickness and is made of a magnetic material such as NiFe (a nickel-iron alloy:permalloy). For example, each of the bottom shield gap layer 13 and the top shield gap layer 14 is 10 nm to 100 nm in thickness and is made of $Al_2O_3$ or AlN (aluminum nitride). For example, the top shield layer 15 is 1 $\mu$m to 4 $\mu$m in thickness and is made of the magnetic material such as NiFe. The top shield layer 15 also functions as a bottom magnetic pole for the recording head section 1b.

An MR element 1c including a stack 20 that is a spin valve film is buried between the bottom shield gap layer 13 and the top shield gap layer 14. The reproducing head section 1a utilizes a change in electrical resistance in the stack 20 in response to a signal magnetic field from the magnetic recording medium 3, thereby reading the information recorded on the magnetic recording medium 3.

As shown in FIGS. 6 and 7, for example, the stack 20 has the stacked structure comprising an underlying layer 21, a soft magnetic layer 22, a nonmagnetic layer 23, a ferromagnetic layer 24, an antiferromagnetic layer 25 and a protective layer 26, the layers 21, 22, 23, 24, 25 and 26 being stacked in this order on the bottom shield gap layer 13. For example, the underlying layer 21 has a thickness of 5 nm and contains Ta.

The soft magnetic layer 22 is sometimes called a free layer and changes in the orientation of the magnetic field thereof in response to the signal magnetic field from the magnetic recording medium 3. For example, the soft magnetic layer 22 has a thickness of 3 nm to 8 nm and is composed of two layers, namely, a nonmagnetic-layer-side layer 22a near the nonmagnetic layer 23 and an underlying-layer-side layer 22b near the underlying layer 21. For example, the nonmagnetic-layer-side layer 22a is 0.5 nm to 3 nm in thickness and is made of the magnetic material containing at least Co in a group consisting of Ni, Co and Fe. Specifically, it is preferable that the nonmagnetic-layer-side layer 22a is composed of $Co_xFe_yNi_{100-(x+y)}$ whose (111) plane is oriented in the direction of stack. In the above expression, x and y are within a range of $70 \leq x \leq 100$ and $0 \leq y \leq 25$ in units of atom %, respectively.

For instance, the underlying-layer-side layer 22b is 1 nm to 8 nm in thickness and is made of the magnetic material containing at least Ni in the group consisting of Ni, Co, Fe, Ta, Cr, Rh, Mo and Nb. Specifically, it is preferable that the underlying-layer-side layer 22b is made of $[Ni_xCo_yFe_{100-(x+y)}]_{100-z}M_{Iz}$. In the above expression, $M_I$ indicates at least one of Ta, Cr, Rh, Mo and Nb, and x, y and z are within a range of $75 \leq x \leq 90$, $0 \leq y \leq 15$ and $0 \leq z \leq 15$ in units of atom %, respectively.

For example, the nonmagnetic layer 23 is 1.8 nm to 3.0 nm in thickness and is made of a nonmagnetic material containing 80% by weight or more of at least one kind of element in the group consisting of Cu (copper), Au (gold) and Ag (silver).

The ferromagnetic layer 24 is sometimes called a pinned layer, and the orientation of magnetization thereof is fixed by exchange coupling on an interface between the ferromagnetic layer 24 and the antiferromagnetic layer 25. As shown in FIG. 7, for example, the ferromagnetic layer 24 has the stacked structure comprising an inner ferromagnetic layer 242, a coupling layer 244 and an outer ferromagnetic layer 245, the layers 242, 244 and 245 being stacked in this order on the nonmagnetic layer 23. The inner ferromagnetic layer 242 and the outer ferromagnetic layer 245 are made of the magnetic material containing at least Co in the group consisting of Co and Fe. It is particularly preferable that the (111) plane of this magnetic material is oriented in the direction of stack. The thickness of both of the inner ferromagnetic layer 242 and the outer ferromagnetic layer 245 is 3 nm to 4.5 nm, for instance.

For example, the coupling layer 244 sandwiched between the inner ferromagnetic layer 242 and the outer ferromagnetic layer 245 is 0.2 nm to 1.2 nm in thickness and is made of the nonmagnetic material containing at least one kind of element in the group consisting of ruthenium (Ru), rhodium (Rh), rhenium (Re), chromium (Cr) and zirconium (Zr). The coupling layer 244 causes antiferromagnetic exchange coupling between the inner ferromagnetic layer 242 and the outer ferromagnetic layer 245, thereby orienting magnetization Mp of the inner ferromagnetic layer 242 and magnetization Mpc of the outer ferromagnetic layer 245 in opposite directions. In this specification, the phrase "the magnetizations are oriented in opposite directions" means not only that the orientation of one magnetization differs by 180° from that of the other magnetization but also that the orientations of two magnetizations differ by 180°±20° from each other.

In this embodiment, the orientation of the magnetization Mpc of the outer ferromagnetic layer 245 is fixed, for example, in the y-direction and toward the air bearing surface (the surface indicated by reference symbol S in FIG. 7) by the exchange coupling on the interface between the outer ferromagnetic layer 245 and the antiferromagnetic layer 25. The orientation of the magnetization Mp of the inner ferromagnetic layer 242 is fixed, for example, in the y-direction and away from the air bearing surface by the antiferromagnetic exchange coupling between the inner ferromagnetic layer 242 and the outer ferromagnetic layer 245 sandwiching the coupling layer 244. Thus, the stack 20 can reduce an influence of the magnetic field generated by the ferromagnetic layer 24 upon the soft magnetic layer 22.

For example, the inner ferromagnetic layer 242 is divided into a first inner ferromagnetic layer 242a located close to the nonmagnetic layer 23 in the direction of stack and a second inner ferromagnetic layer 242b located close to the coupling layer 244. The ferromagnetic layer 24 has a ferromagnetic interlayer 243, which has magnetism and the electrical resistance higher than the electrical resistance of the inner ferromagnetic layer 242, between the first inner ferromagnetic layer 242a and the second inner ferromagnetic layer 242b. When a sense current flows through the stack 20, the ferromagnetic interlayer 243 reflects at least some electrons e and thus limits a route by which the electrons e move, thereby increasing a rate of resistance change of the stack 20.

Since the ferromagnetic interlayer 243 has the magnetism, the respective magnetizations Mp of the first inner ferromagnetic layer 242a and the second inner ferromagnetic layer 242b facing each other across the ferromagnetic interlayer 243 are fixed in the same direction, e.g., in the y-direction and away from the air bearing surface as described above. The magnetization of the ferromagnetic interlayer 243 is also fixed in the same direction as the direction of the respective magnetizations Mp of the first inner ferromagnetic layer 242a and the second inner ferromagnetic layer 242b. In this specification, the phrase "the magnetizations are oriented in the same direction" means not only that the orientation of one magnetization is precisely identical with that of the other magnetization but also that the orientations of two magnetizations is within a range of 0°±20°.

For example, the ferromagnetic interlayer 243 is made of the material having the higher electrical resistance than that of the inner ferromagnetic layer 243. Preferably, the ferromagnetic interlayer 243 contains at least one of oxide, nitride and nitride oxide. Such a material is used because this material is magnetically stable and can reduce a variation in output. Preferably, the ferromagnetic interlayer 243 has some common elements with the inner ferromagnetic layer 242, for example. Specifically, it is preferable that the ferromagnetic interlayer 243 contains at least Co in the group consisting of Ni, Co, Fe, Ta, Cr, Rh, Mo and Nb and at least one kind of element in the group consisting of Co, O (oxygen) and N (nitrogen). For example, the inner ferromagnetic layer 242 is partly formed by oxidation, nitriding or oxidation and nitriding, whereby the good ferromagnetic interlayer 243 can be easily obtained. Preferably, a thickness $T_{kn}$ of the ferromagnetic interlayer 243 is from 0.5 nm to 1.0 nm inclusive, for example. Too thick ferromagnetic interlayer 243 weaken magnetic coupling between the first inner ferromagnetic layer 242a and the second inner ferromagnetic layer 242b and also heat resistance decreases considerably. As a consequence, a high rate of resistance change cannot be obtained. Too thin ferromagnetic interlayer 243 cannot sufficiently limit the route for the electrons e and thus the high rate of resistance change cannot be obtained.

Desirably, the position of the ferromagnetic interlayer 243, e.g., a ratio $D_{k1}/D_{k2}$ of a distance $D_{k1}$ between the nonmagnetic layer 23 and the ferromagnetic interlayer 243 to a distance $D_{k2}$ between the ferromagnetic interlayer 243 and the coupling layer 244 is within a range of $1.2 \leq D_{k1}/D_{k2} \leq 3$. That is, in this embodiment, the distance $D_{k1}$ between the nonmagnetic layer 23 and the ferromagnetic interlayer 243 is equal to a thickness $T_{ku1}$ of the first inner ferromagnetic layer 242a. The distance $D_{k2}$ between the ferromagnetic interlayer 243 and the coupling layer 244 is equal to a thickness $T_{ku2}$ of the second inner ferromagnetic layer 242b. Thus, a relationship between the thickness $T_{ku1}$ of the first inner ferromagnetic layer 242a and the thickness $T_{ku2}$ of the second inner ferromagnetic layer 242b is defined as preferably $1.2 \leq T_{ku1}/T_{ku2} \leq 3$ and more preferably, within a range of from 1.5 nm to 2.5 nm inclusive. The position of the ferromagnetic interlayer 243 is expressed below as a specific numerical value. Preferably, the distance $D_{k1}$ between the nonmagnetic layer 23 and the ferromagnetic interlayer 243 is within a range of from 1.5 nm to 3 nm inclusive. If the distance $D_{k1}$ is longer than this range, an effect of limiting the route for the electrons e cannot be fully obtained and thus the high rate of resistance change cannot be obtained. If the distance $D_{k1}$ is shorter than this range, the electrons e are excessively concentrated on a narrow range. Thus, the magnetism applied to the electrons e is scattered, and consequently the rate of resistance change cannot be sufficiently increased.

Preferably, the relationship between the sum total of the thickness $T_{kn}$ of the ferromagnetic interlayer 243, the thickness $T_{ku1}$ of the first inner ferromagnetic layer 242a and the thickness $T_{ku2}$ of the second inner ferromagnetic layer 242b, and a thickness $T_{ks}$ of the outer ferromagnetic layer 245 is defined as $1.2 \leq (T_{ku1}+T_{ku2}+T_{kn})/T_{ks} \leq 3$. If $(T_{ku1}+T_{ku2}+T_{kn})/T_{ks}$ is smaller than 1.2, the thickness of the ferromagnetic layer 24 is increased and thus the rate of resistance change cannot be sufficiently reduced. If $(T_{ku1}+T_{ku2}+T_{kn})/T_{ks}$ is larger than 3, the magnetic coupling between the outer ferromagnetic layer 245 and the second inner ferromagnetic layer 242b is weakened. Thus, the orientations of the magnetizations Mp of the inner ferromagnetic layer 242 and the ferromagnetic interlayer 243 are unstable, and consequently the high rate of resistance change cannot be obtained.

The first inner ferromagnetic layer 242a of this embodiment corresponds to one specific example of "a first ferromagnetic layer" of the invention. The second inner ferromagnetic layer 242b corresponds to one specific example of "a second ferromagnetic layer" of the invention. The outer ferromagnetic layer 245 corresponds to one specific example of "a third ferromagnetic layer" of the invention. Moreover, the ferromagnetic interlayer 243 corresponds to one specific example of "a magnetic interlayer" of the invention. The coupling layer 244 corresponds to one specific example of "a nonmagnetic interlayer" of the invention.

For example, the antiferromagnetic layer 25 is 5 nm to 30 nm in thickness and is made of an antiferromagnetic material containing at least one kind of element $M_{II}$ in the group consisting of Pt (platinum), Ru, Rh, Pd (palladium), Ni, Au, Ag, Cu, Ir (iridium), Cr and Fe, and manganese (Mn). Preferably, a content of Mn is from 45 atom % to 95 atom % inclusive and a content of the other element $M_{II}$ is from 5 atom % to 65 atom % inclusive. Such antiferromagnetic materials include a non-heat-treatment type antiferromagnetic material exhibiting antiferromagnetism without heat treatment and inducing an exchange coupling magnetic field between a ferromagnetic material and the antiferromagnetic material, and a heat-treatment type antiferromagnetic material exhibiting the antiferromagnetism by the heat treatment. The antiferromagnetic layer 25 may be made of either antiferromagnetic material.

Non-heat-treatment type antiferromagnetic materials include an Mn alloy having a γ-phase, and so on. Specifically, RuRhMn (a ruthenium-rhodium-manganese alloy), FeMn (an iron-manganese alloy), IrMn (an iridium-manganese alloy) or the like are included. Heat-treatment type antiferromagnetic materials include the Mn alloy having regular crystal structures, and so on. Specifically, PtMn (a platinum-manganese alloy), NiMn (a nickel-manganese alloy), PtRhMn (a platinum-rhodium-manganese alloy) or the like are included. For example, the protective layer 26 is 5 nm in thickness and is made of Ta.

Magnetic domain control films 30a and 30b are formed on both the sides of the stack 20, i.e., on both the sides in the direction perpendicular to the direction of stack. Thus, the magnetizations of the soft magnetic layer 22 are oriented in the same direction, so that a single magnetic domain is formed and thus the so-called Barkhausen noise is prevented. The magnetic domain control film 30a has the stacked structure comprising a magnetic domain controlling ferromagnetic film 31a and a magnetic domain controlling antiferromagnetic film 32a, the films 31a and 32a being stacked in this order on the bottom shield gap layer 13. The magnetic domain control film 30b also has the same structure as the magnetic domain control film 30a. The orientations of the magnetizations of the magnetic domain controlling ferromagnetic films 31a and 31b are fixed by the exchange coupling on the interfaces between the magnetic domain controlling ferromagnetic films 31a and 31b and the magnetic domain controlling antiferromagnetic films 32a and 32b. Thus, for example, as shown in FIG. 7, a biasing magnetic field Hb to the soft magnetic layer 22 is generated in the x-direction near the magnetic domain controlling ferromagnetic films 31a and 31b.

For example, each of the magnetic domain controlling ferromagnetic films 31a and 31b is 10 nm to 40 nm in thickness and is formed in accordance with the soft magnetic layer 22. Moreover, for example, each of the magnetic domain controlling ferromagnetic films 31a and 31b is made of NiFe, a stacked film of NiFe and CoFe or the magnetic material containing at least one kind of element in the group consisting of Ni, Fe and Co. For example, each of the magnetic domain controlling antiferromagnetic films 32a and 32b is 10 nm to 20 nm in thickness and is made of the antiferromagnetic material. Although this antiferromagnetic material may be the non-heat-treatment type antiferromagnetic material or the heat-treatment type antiferromagnetic material, the non-heat-treatment type antiferromagnetic material is more preferable.

The magnetic domain control films 30a and 30b may be made of a hard magnetic material (a hard magnet) such as the stacked film of TiW (a titanium-tungsten alloy) and CoPt (a cobalt-platinum alloy) or the stacked film of TiW and CoCrPt (a cobalt-chromium-platinum alloy), for example, instead of the magnetic domain controlling ferromagnetic films 31a and 31b and the magnetic domain controlling antiferromagnetic films 32a and 32b, respectively.

Lead layers 33a and 33b made of the stacked film of Ta and Au, the stacked film of TiW and Ta (tantalum), the stacked film of TiN (titanium nitride) and Ta, or the like are formed on the magnetic domain control films 30a and 30b, respectively. Thus, the current can flow through the stack 20 through the magnetic domain control films 30a and 30b.

As shown in FIGS. 3 to 5, for example, the recording head section 1b has a recording gap layer 41 of 0.1 μm to 0.5 μm thick which comprises an insulating film made of $Al_2O_3$ or the like, on the top shield layer 15. The recording gap layer 41 has an opening 41a at the position corresponding to the center of thin film coils 43 and 45 described below. The thin film coil 43 of 1 μm to 3 μm thick and a photoresist layer 44 coating the thin film coil 43 therewith are formed on the recording gap layer 41 sandwiching a photoresist layer 42 of 1.0 μm to 5.0 μm thick for determining a throat height. The thin film coil 45 of 1 μm to 3 μm thick and a photoresist layer 46 coating the thin film coil 45 therewith are formed on the photoresist layer 44. Although stacked two thin film coils are exemplified in this embodiment, the number of stacks of thin film coils may be one, three or more.

For example, an top magnetic pole 47 of about 3 μm thick made of the magnetic material such as NiFe or FeN (iron nitride) having high saturation magnetic flux density is formed on the recording gap layer 41 and the photoresist layers 42, 44 and 46. The top magnetic pole 47 is in contact with and is magnetically coupled to the top shield layer 15 through the opening 41a of the recording gap layer 41 located at the position corresponding to the center of the thin film coils 43 and 45. Although not shown in FIGS. 3 to 6, an overcoat layer (an overcoat layer 48 in FIG. 16B) of 20 μm to 30 μm thick made of $Al_2O_3$, for example, is formed on the top magnetic pole 47 so that the whole top magnetic pole 47 may be coated with the overcoat layer. Thus, the recording head section 1b generates the magnetic flux between the bottom magnetic pole, i.e., the top shield layer 15 and the top magnetic pole 47 by the current flowing through the thin film coils 43 and 45 and magnetizes the magnetic recording medium 3 by the magnetic flux generated near the recording gap layer 41, thereby recording information.

<Operation of MR Element and Thin Film Magnetic Head>

Next, a reproducing operation by the MR element 1c and the thin film magnetic head 1 thus configured will be described mainly with reference to FIGS. 6 and 7.

In the thin film magnetic head 1, the information recorded on the magnetic recording medium 3 is readout by the reproducing head section 1a. In the reproducing head section 1a, the orientation of the magnetization Mpc of the outer ferromagnetic layer 245 is fixed, for example, in the y-direction and toward the air bearing surface (indicated by reference symbol S in the drawing) by the exchange coupling magnetic field resulting from the exchange coupling on the interface between the outer ferromagnetic layer 245 and the antiferromagnetic layer 25 of the stack 20. Moreover, the orientations of the magnetizations Mp of the inner ferromagnetic layer 242 and the ferromagnetic interlayer 243 are fixed, for example, in the y-direction and away from the air bearing surface, namely, in the direction opposite to the magnetization Mpc of the outer ferromagnetic layer 245 by antiferromagnetic exchange coupling action through the coupling layer 244. The inner ferromagnetic layer 242 is divided into the first inner ferromagnetic layer 242a and the second inner ferromagnetic layer 242b by the ferromagnetic interlayer 243. However, the magnetizations Mp of the first inner ferromagnetic layer 242a and the second inner ferromagnetic layer 242b are fixed in the same direction because the ferromagnetic interlayer 243 has the magnetism.

Moreover, magnetizations Mf of the soft magnetic layer 22 are oriented in the direction of the biasing magnetic field Hb (in the x-direction herein) by the biasing magnetic field Hb generated by the magnetic domain control films 30a and 30b. The biasing magnetic field Hb is substantially perpendicular to the orientations of the magnetizations Mp of the inner ferromagnetic layer 242 and the ferromagnetic interlayer 243.

For reading out information, the sense current that is a stationary current flows through the stack 20 through the lead layers 33a and 33b in the direction of the biasing magnetic field Hb, for example. At this time, many electrons e move about the nonmagnetic layer 23 between the soft magnetic layer 22 having low electrical resistance and the inner ferromagnetic layer 242. However, since the electrical resistance of the ferromagnetic interlayer 243 is higher than that of the inner ferromagnetic layer 242, almost all the electrons e moving from the first inner ferromagnetic layer 242a of the inner ferromagnetic layer 242 toward the ferromagnetic interlayer 243 are reflected by the surface of the ferromagnetic interlayer 243. That is, the current flows mainly through the soft magnetic layer 22, the nonmagnetic layer 23 and the first inner ferromagnetic layer 242a.

Figure 8:
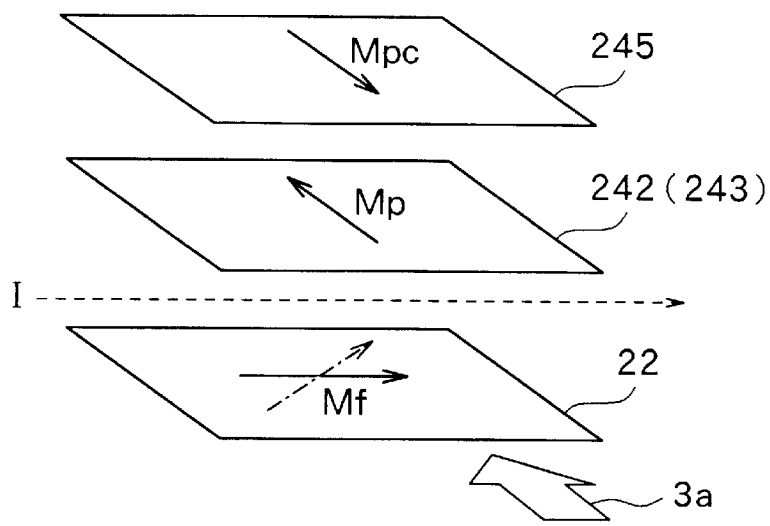
FIG. 8 is an illustration of the orientation of magnetization of the stack shown in FIG. 7.

FIG. 8 shows the orientations of the magnetizations of the soft magnetic layer 22, the inner ferromagnetic layer 242, the ferromagnetic interlayer 243 and the outer ferromagnetic layer 245. On receiving a signal magnetic field 3a from the magnetic recording medium 3, the orientation of the magnetization Mf of the soft magnetic layer 22 is changed. On the other hand, since the orientation of the magnetization Mpc of the outer ferromagnetic layer 245 and the orientations of the magnetizations Mp of the inner ferromagnetic layer 242 and the ferromagnetic interlayer 243 are fixed by the antiferromagnetic layer 25, respectively, these orientations are not changed even receiving the signal magnetic field 3a from the magnetic recording medium 3.

When the orientation of the magnetization Mf of the soft magnetic layer 22 is changed, the current flowing through the stack 20 is subjected to the resistance in accordance with a relative angle between the orientation of the magnetization Mf of the soft magnetic layer 22 and the orientations of the magnetizations Mp of the inner ferromagnetic layer 242 and the ferromagnetic interlayer 243. This is caused by a phenomenon called "spin depending scattering" in which the degree of electron scattering on the interface between the nonmagnetic layer 23 and the soft magnetic layer 22 and the interface between the nonmagnetic layer 23 and the ferromagnetic layer 24 depends on the directions of the magnetizations of the soft magnetic layer 22 and the ferromagnetic layer 24. The amount of change in the resistance of the stack 20 is detected as the amount of change in voltage, and thus the information recorded on the magnetic recording medium 3 is readout.

Figure 9:
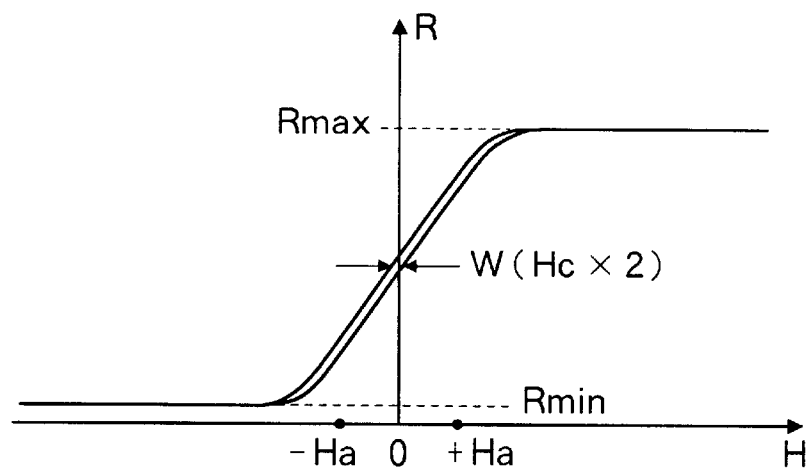
FIG. 9 is a graph of an example of a relationship between an external magnetic field and electrical resistance of the stack shown in FIG. 7.

FIG. 9 shows the relationship between the signal magnetic field and the resistance of the stack 20 in this embodiment, not by real data but by a diagrammatic representation. When a maximum value of the resistance is taken as Rmax and a minimum value of the resistance is taken as Rmin, the rate of resistance change is expressed as (Rmax−Rmin)/Rmin×100. In the drawing, the width of hysteresis indicated by reference symbol w is equivalent to double a coercive force Hc of the soft magnetic layer 22. In the following description, "the coercive force Hc of the soft magnetic layer" is defined as ½ of the width w of the hysteresis on a curve (the so-called MR curve) representing the relationship between the signal magnetic field and the resistance of the stack 20.

If the ferromagnetic interlayer 243 is not provided, a main path for the electrons e in the stack 20 is in the range indicated by arrow B in FIG. 7, i.e., the soft magnetic layer 22, the nonmagnetic layer 23, the inner ferromagnetic layer 242, the coupling layer 244 and the outer ferromagnetic layer 245. On the other hand, in this embodiment, since the ferromagnetic interlayer 243 is provided in the inner ferromagnetic layer 242, the main path for the electrons e is in the range indicated by arrow A in FIG. 7, i.e., the limited range including the soft magnetic layer 22, the nonmagnetic layer 23 and the first inner ferromagnetic layer 242a. Thus, the electrons e are concentrated on the interface between the nonmagnetic layer 23 and the soft magnetic layer 22 and the interface between the nonmagnetic layer 23 and the inner ferromagnetic layer 242, the number of electrons contributing to the spin depending scattering is increased, and consequently the rate of resistance change is increased.

Figure 10:
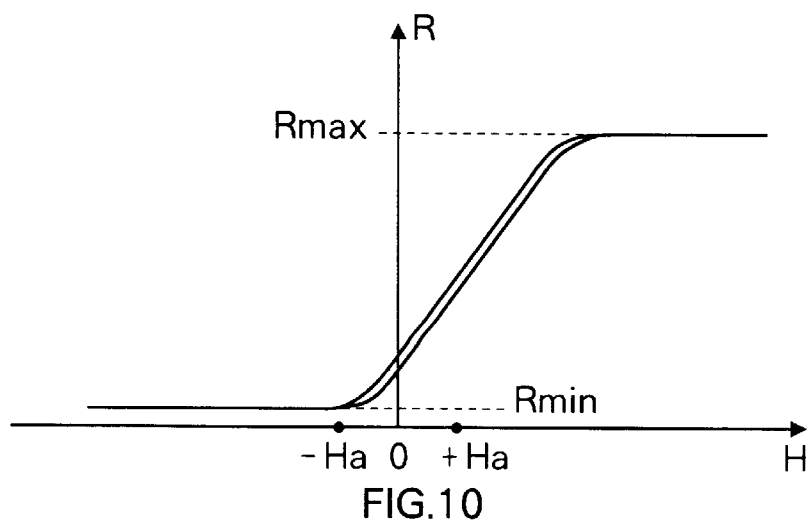
FIG. 10 is a graph of the relationship between the external magnetic field and the electrical resistance of a general stack.

Moreover, since the inner ferromagnetic layer 242 and the outer ferromagnetic layer 245 are formed with the coupling layer 244 sandwiched therebetween, the influence of the magnetic field generated by the ferromagnetic layer 24 upon the soft magnetic layer 22 can be reduced. When the magnetic field generated by the ferromagnetic layer 24 has a great influence upon the soft magnetic layer 22, a linear region of the MR curve is unevenly distributed on the plus side or the minus side of a signal magnetic field H as shown in FIG. 10, for example. In this case, since a nonlinear region (a saturation region) of the MR curve is in the range (of from −Ha to +Ha) in which the signal magnetic field H changes, the plus-side output of an output voltage V of the MR element 1c is less symmetrical to the minus-side output thereof.

Figure 11:
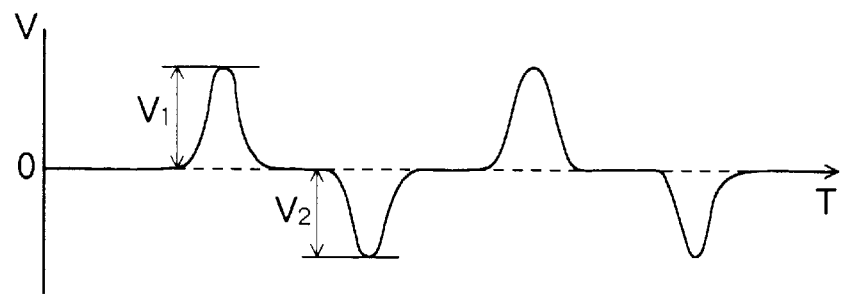
FIG. 11 is a chart of an example of a voltage output waveform of the MR element.

The output voltage V of the MR element 1c is obtained in the form of the output from 0 V to a peak height of an output waveform shown in FIG. 11 which is obtained when a predetermined sense current I is fed through the prepared thin film magnetic head structure. Peak voltages V1 and V2 are taken as the value (absolute value) not having a plus sign and a minus sign. Moreover, asymmetry Asym that is a constant for evaluating asymmetry of the output voltage of the MR element 1c is defined as the following equation (1).

$$\text{Asym (\%)}=(V1-V2)/(V1+V2)\times 100 \quad (1)$$

Figure 12:
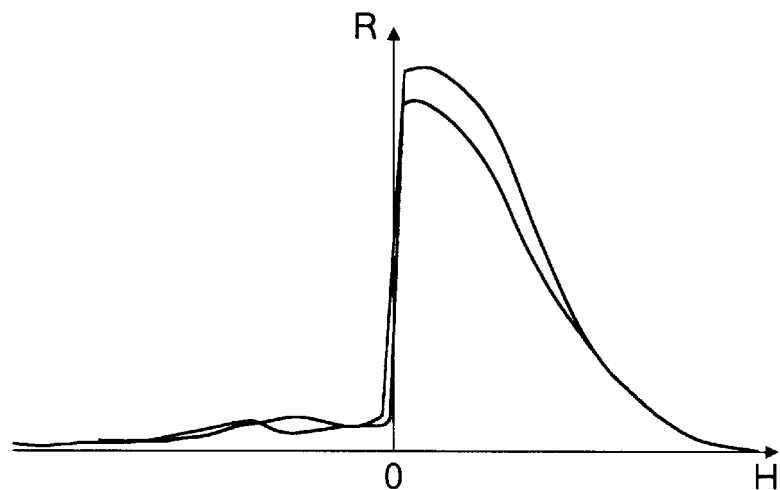
FIG. 12 is a graph of the relationship between the external magnetic field and the electrical resistance of the stack according to the first embodiment.

On the other hand, since the MR element 1c provides the reduced influence of the magnetic field generated by the ferromagnetic layer 24 upon the soft magnetic layer 22, the resistance is located near the center of the linear region of the MR curve when the signal magnetic field H is zero, as shown in FIG. 9, for example. Accordingly, the plus-side output of the output voltage V of the MR element 1c is more symmetrical to the minus-side output thereof. FIG. 12 shows the real data of a resistance curve of the MR element 1c according to this embodiment. As shown in this drawing, the resistance is located substantially at the center of the linear region of the MR curve when the signal magnetic field H is zero. The data shown in FIG. 12 is not the measured data of the thin film magnetic head but the measured data of the stack 20.

<Method of Manufacturing MR Element and Thin Film Magnetic Head>

Next, a method of manufacturing the MR element 1c and the thin film magnetic head 1 will be described with reference to FIGS. 13 to 18A and 18B. FIGS. 13, 17A and 17B, and 18A and 18B show the sectional structure taken along the line V—V of FIG. 4. FIGS. 14A, 14B and 14C to 16 show the sectional structure taken along the line VI—VI of FIG. 4.

Figure 13:
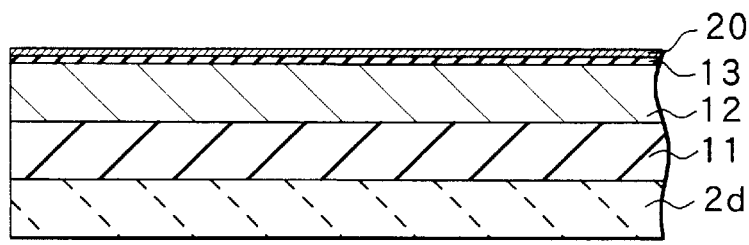
FIG. 13 is a cross sectional view for describing a step of a method of manufacturing the thin film magnetic head shown in FIG. 3.

In a method of manufacturing according to this embodiment, first, as shown in FIG. 13, for example, the insulating layer 11 made of $Al_2O_3$ is deposited with a thickness of about 2 $\mu$m to 10 $\mu$m on one side of the base 2d made of $Al_2O_3$.TiC by sputtering. Then, the bottom shield layer 12 made of the magnetic material is formed with a thickness of 1 $\mu$m to 3 $\mu$m on the insulating layer 11 by plating, for example. Subsequently, the bottom shield gap layer 13 made of $Al_2O_3$ or AlN is deposited with a thickness of 10 nm to 100 nm on the bottom shield layer 12 by sputtering, for example. After that, the stack 20 is formed on the bottom shield gap layer 13.

Figure 14A:
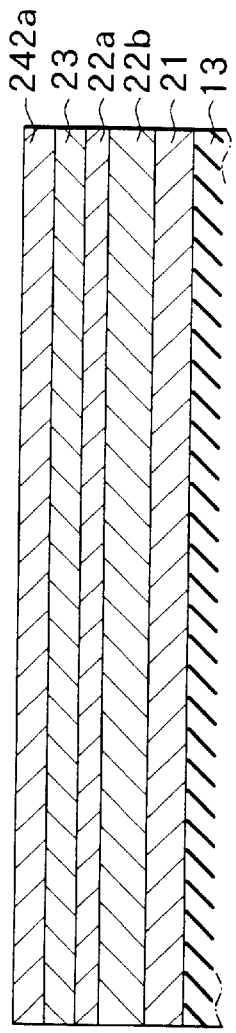
FIGS. 14A, 14B and 14C are cross sectional views for describing the following step of FIG. 13.

A step of forming the stack 20 will be described in detail. First, as shown in FIG. 14A, the underlying layer 21, the underlying-layer-side layer 22b, the nonmagnetic-layer-side layer 22a, the nonmagnetic layer 23 and the first inner ferromagnetic layer 242a are deposited in sequence on the bottom shield gap layer 13 by using the materials described in a section of the configuration by sputtering, for example. This step is performed in a vacuum chamber not shown, for example, under vacuum at an ultimate pressure of about $1.33\times10^{-8}$ Pa to $1.33\times10^{-6}$ Pa and at a deposition pressure of about $1.33\times10^{-3}$ Pa to $1.33\times10^{-1}$ Pa.

Figure 14B:
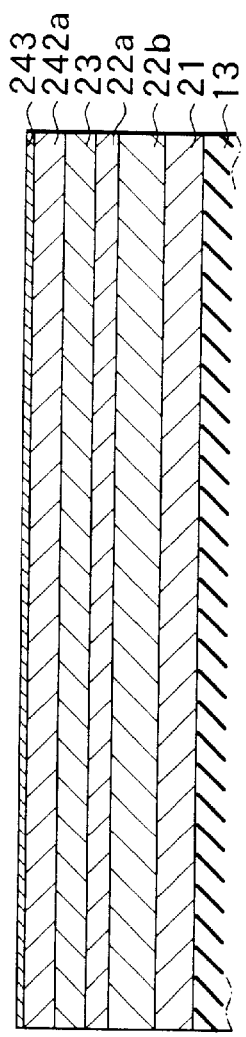

Then, for example, at least one of oxygen gas and nitrogen gas is introduced into the vacuum chamber not shown so that a degree of vacuum may be about 0.0133 Pa to $1.01\times10^5$ Pa. After that, for example, the surface of the first inner ferromagnetic layer 242a is exposed to an atmosphere containing at least one of oxygen and nitrogen for 0.01 minute to 60 minutes. Thus, for example, as shown in FIG. 14B, the surface of the first inner ferromagnetic layer 242a is oxidized, nitrided or oxidized and nitrided, so that the good ferromagnetic interlayer 243 is easily deposited. For this process of oxidation, nitriding or oxidation and nitriding, more preferably, the degree of vacuum in the vacuum chamber is set at 0.133 Pa to $2.66\times10^4$ Pa, and more preferably the time of exposure of the surface of the first inner ferromagnetic layer 242a is set at 0.1 minute to 30 minutes. Under such conditions, the film thickness can be easily controlled and thus the good ferromagnetic interlayer 243 can be easily obtained.

Figure 14C:
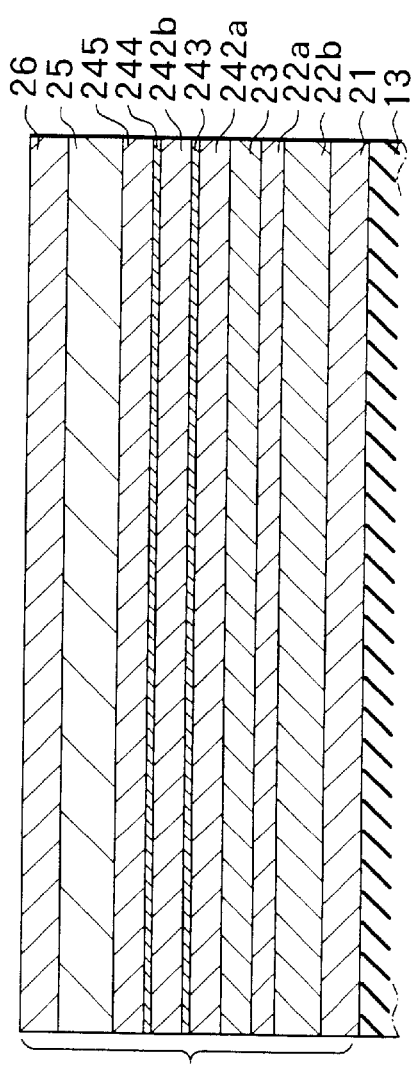

After forming the ferromagnetic interlayer 243, as shown in FIG. 14C, for example, the vacuum chamber not shown is again reduced in pressure so as to produce a high vacuum in the vacuum chamber. In a high vacuum, the second inner ferromagnetic layer 242b, the coupling layer 244, the outer ferromagnetic layer 25, the antiferromagnetic layer 25 and the protective layer 26 are deposited in sequence on the ferromagnetic interlayer 23 by using the materials described in the section of the configuration by sputtering. To form the antiferromagnetic layer 25 of the non-heat-treatment type antiferromagnetic material, the antiferromagnetic layer 25 is formed with the magnetic field applied in the y-direction, for example. Thus, the orientation of the magnetization Mpc of the outer ferromagnetic layer 245 is fixed in the direction of the applied magnetic field, i.e., the y-direction by the exchange coupling between the outer ferromagnetic layer 245 and the antiferromagnetic layer 25. The orientations of the magnetizations Mp of the inner ferromagnetic layer 242 and the ferromagnetic interlayer 243 are fixed in the direction opposite to the orientation of the magnetization Mpc of the outer ferromagnetic layer 245.

Figure 15A:
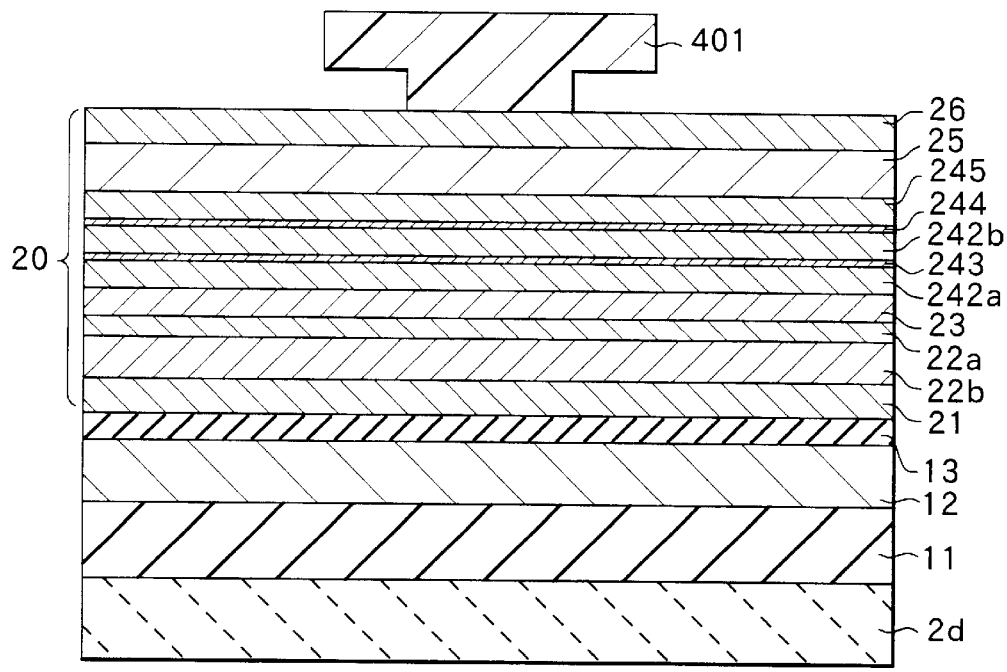
FIGS. 15A and 15B are cross sectional views for describing the following step of FIGS. 14A, 14B and 14C.

Then, as shown in FIG. 15A, for example, a photoresist film 401 corresponding to the region where the stack 20 is to be formed is selectively formed on the protective layer 26. Preferably, for example, the photoresist film 401 is T-shaped in cross section by forming a trench on the interface between the photoresist film 401 and the protective layer 26 so as to facilitate lift-off described below.

Figure 15B:
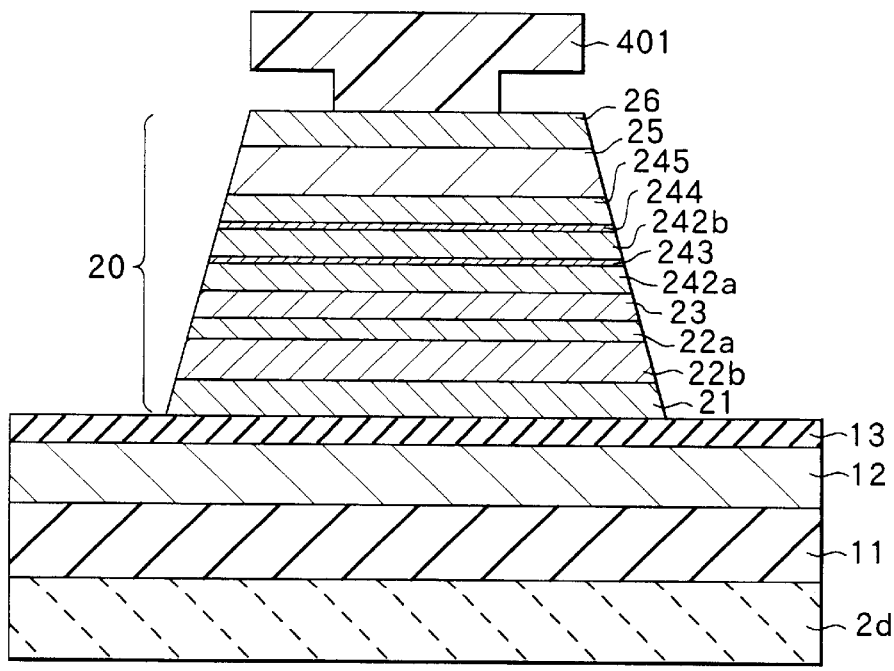

After forming the photoresist film 401, as shown in FIG. 15B, for example, the protective layer 26, the antiferromagnetic layer 25, the ferromagnetic layer 24, the nonmagnetic layer 23, a soft magnetic buffer layer 23, the soft magnetic layer 22 and the underlying layer 21 are etched in sequence and selectively removed by ion milling using the photoresist film 401 as a mask. Thus, each of the layers 21 to 26 is formed, so that the stack 20 is formed.

Figure 16A:
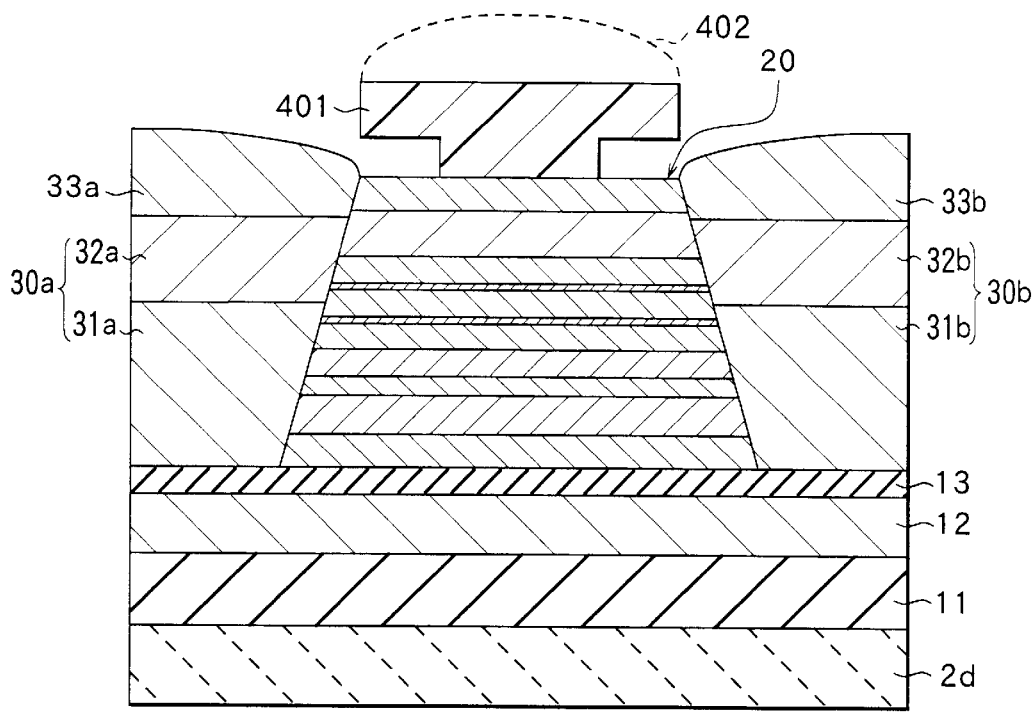
FIGS. 16A and 16B are cross sectional views for describing the following step of FIGS. 15A and 15B.

After forming the stack 20, as shown in FIG. 16A, for example, the magnetic domain controlling ferromagnetic films 31a and 31b and the magnetic domain controlling antiferromagnetic films 32a and 32b are formed in sequence on both sides of the stack 20 by sputtering. To form the magnetic domain controlling antiferromagnetic films 32a and 32b of the non-heat-treatment type antiferromagnetic material, the magnetic domain controlling antiferromagnetic films 32a and 32b are formed with the magnetic field applied in the x-direction, for example. Thus, the orientations of the magnetizations of the magnetic domain controlling ferromagnetic films 31a and 31b are fixed in the direction of the applied magnetic field, i.e., the x-direction by the exchange coupling between the magnetic domain controlling ferromagnetic films 31a and 31b and the magnetic domain controlling antiferromagnetic films 32a and 32b.

Instead of the magnetic domain controlling ferromagnetic films 31a and 31b and the magnetic domain controlling antiferromagnetic films 32a and 32b, the magnetic domain control films 30a and 30b may be formed of the stacked film of TiW and CoPt or the stacked film of TiW and CoCrPt by sputtering, for instance.

After forming the magnetic domain controlling ferromagnetic films 31a and 31b and the magnetic domain controlling antiferromagnetic films 32a and 32b, as similarly shown in FIG. 16A, the lead layers 33a and 33b are formed on the magnetic domain controlling antiferromagnetic films 32a and 32b, respectively, by sputtering, for example. Then, the photoresist film 401 and a deposit 402 stacked thereon (the materials of the magnetic domain controlling ferromagnetic film, the magnetic domain controlling antiferromagnetic film and the lead layer) are removed by lift-off, for example.

Figure 16B:
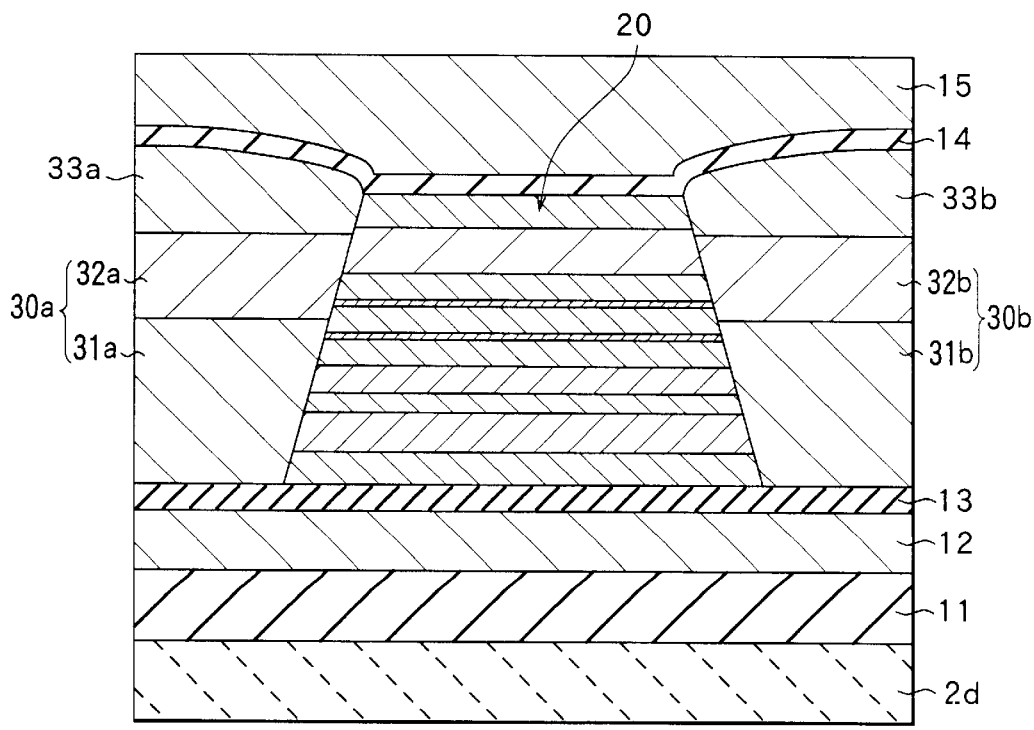
Figure 17A:
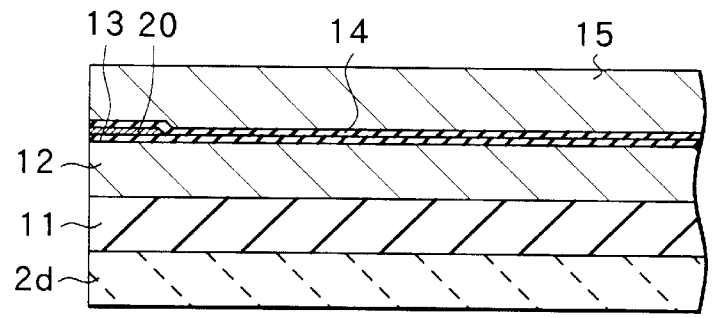
FIGS. 17A and 17B are cross sectional views for describing the following step of FIGS. 16A and 16B.

After lift-off, as shown in FIGS. 16B and 17A, the top shield gap layer 14 made of the insulating film of AlN or the like is formed with a thickness of about 10 nm to 100 nm by, for example, sputtering so that the bottom shield gap layer 13 and the stack 20 may be coated with the top shield gap layer 14. Thus, the stack 20 is buried between the bottom shield gap layer 13 and the top shield gap layer 14. Then, the top shield layer 15 made of the magnetic material is formed with a thickness of about 1 $\mu$m to 4 $\mu$m on the top shield gap layer 14 by sputtering, for example.

Figure 17B:
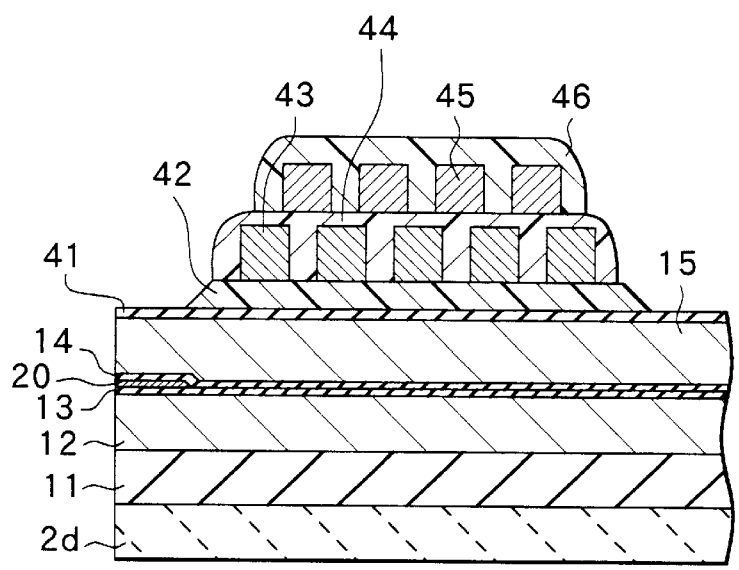

After forming the top shield layer 15, as shown in FIG. 17B, the recording gap layer 41 made of the insulating film is formed with a thickness of 0.1 $\mu$m to 0.5 $\mu$m on the top shield layer 15 by sputtering, for example. The photoresist layer 42 is formed into a predetermined pattern with a film thickness of about 1.0 $\mu$m to 2.0 $\mu$m on the recording gap layer 41. After forming the photoresist layer 42, the thin film coil 43 is formed with a film thickness of 1 $\mu$m to 3 $\mu$m on the photoresist layer 42, and the photoresist layer 44 is formed into a predetermined pattern to coat the thin film coil 43. After forming the photoresist layer 44, the thin film coil 45 is formed with a film thickness of 1 $\mu$m to 3 $\mu$m on the photoresist layer 44, and the photoresist layer 46 is formed into a predetermined pattern to coat the thin film coil 45.

Figure 18A:
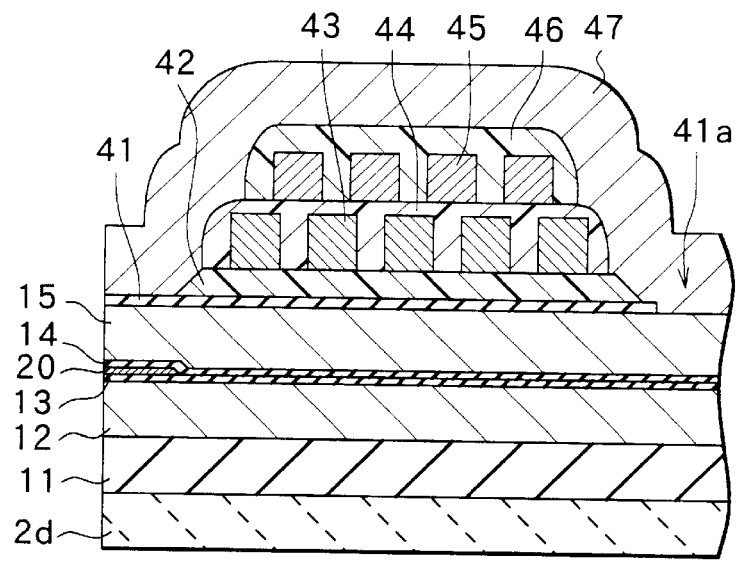
FIGS. 18A and 18B are cross sectional views for describing the following step of FIGS. 17A and 17B.
Figure 18B:
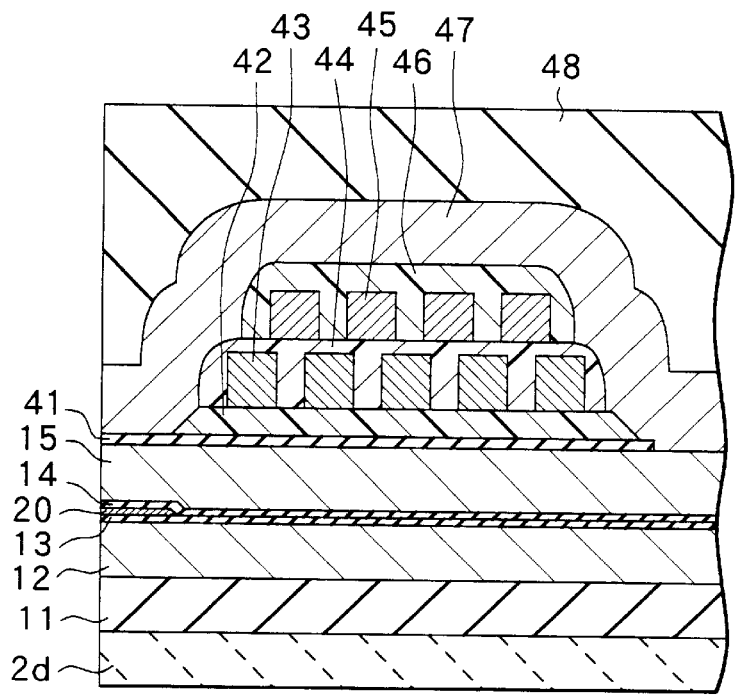

After forming the photoresist layer 46, as shown in FIG. 18A, for example, the recording gap layer 41 is partially etched at the position corresponding to the center of the thin film coils 43 and 45, whereby the opening 41a for forming a flux path is formed. Then, for instance, the top magnetic pole 47 made of the magnetic material having the high saturation magnetic flux density is formed with a thickness of about 3 $\mu$m to coat the recording gap layer 41, the opening 41a and the photoresist layers 42, 44 and 46. After forming the top magnetic pole 47, the recording gap layer 41 and the top shield layer 15 are selectively etched by the ion milling using the top magnetic pole 47 as the mask, for example. Then, as shown in FIG. 18B, the overcoat layer 48 made of alumina is formed with a film thickness of 20 $\mu$m to 30 $\mu$m on the top magnetic pole 47.

After forming the overcoat layer 48, for example, to form the ferromagnetic layer 24 of the stack 20 and the magnetic domain controlling ferromagnetic films 31a and 31b by the heat-treatment type antiferromagnetic material, the process of antiferromagnetizing for fixing the orientations of the magnetic fields of these layer and films takes place. Specifically, when a blocking temperature (the temperature at which the exchange coupling can occur on the interface) of the antiferromagnetic layer 25 and the ferromagnetic layer 24 is higher than the blocking temperature of the magnetic domain controlling antiferromagnetic films 32a and 32b and the magnetic domain controlling ferromagnetic films 31a and 31b, the thin film magnetic head 1 is heated to the blocking temperature of the antiferromagnetic layer 25 and the ferromagnetic layer 24 with the magnetic field applied in the y-direction, for example, by utilizing a magnetic field generating apparatus or the like. Thus, the orientation of the magnetization of the ferromagnetic layer 24 is fixed in the direction of the applied magnetic field, i.e., the y-direction by the exchange coupling between the ferromagnetic layer 24 and the antiferromagnetic layer 25. Then, the thin film magnetic head 1 is cooled to the blocking temperature of the magnetic domain controlling antiferromagnetic films 32a and 32b and the magnetic domain controlling ferromagnetic films 31a and 31b, whereby the magnetic field is applied in the x-direction, for instance. Thus, the orientations of the magnetizations of the magnetic domain controlling ferromagnetic films 31a and 31b are fixed in the direction of the applied magnetic field, i.e., the x-direction by the exchange coupling between the magnetic domain controlling ferromagnetic films 31a and 31b and the magnetic domain controlling antiferromagnetic films 32a and 32b.

When the blocking temperature of the antiferromagnetic layer 25 and the ferromagnetic layer 24 is lower than the blocking temperature of the magnetic domain controlling antiferromagnetic films 32a and 32b and the magnetic domain controlling ferromagnetic films 31a and 31b, the process is the reverse of the above procedure. To form the antiferromagnetic layer 25 and the magnetic domain controlling antiferromagnetic films 32a and 32b by the non-heat-treatment type antiferromagnetic material, the heat treatment is not necessary. Furthermore, in this embodiment, the heat treatment for the antiferromagnetizing takes place after forming the overcoat layer 48. However, after the deposition of the ferromagnetic layer 24 and the antiferromagnetic layer 25, the heat treatment may take place before forming the overcoat layer 48. After the deposition of the magnetic domain control films 30a and 30b, the heat treatment may take place before forming the overcoat layer 48. A combination of the antiferromagnetic materials of the antiferromagnetic layer 25 and the magnetic domain controlling antiferromagnetic films 32a and 32b may be the combination of the heat-treatment type antiferromagnetic materials or the combination of the non-heat-treatment type antiferromagnetic materials.

Finally, the air bearing surface is formed by, for example, machining the slider, so that the thin film magnetic head 1 shown in FIGS. 3 to 7 is completed.

<Effect of First Embodiment>

According to this embodiment, the ferromagnetic layer 24 includes the ferromagnetic interlayer 243 having the magnetism and the resistance higher than the resistance of the inner ferromagnetic layer 242. Thus, the path for the electrons e can be limited to the narrow range, and thus the electrons e can be concentrated on the interface between the nonmagnetic layer 23 and the soft magnetic layer 22 and the interface between the nonmagnetic layer 23 and the inner ferromagnetic layer 242. Therefore, the number of electrons contributing to the spin depending scattering is increased, and consequently the rate of resistance change can be increased. Accordingly, even the low signal magnetic field can be detected, and this permits magnetic recording at high density exceeding 20 gigabits per square inch, for example.

Moreover, thermal stability is high. Thus, even a manufacturing process including the step of heat treatment causes less deterioration in properties, and therefore the high rate of resistance change can be obtained.

The inner ferromagnetic layer 242 and the outer ferromagnetic layer 245 are formed with the coupling layer 244 sandwiched therebetween, whereby the antiferromagnetic exchange coupling is caused between the inner ferromagnetic layer 242 and the outer ferromagnetic layer 245 so that the magnetization Mp of the inner ferromagnetic layer 242 and the magnetization Mpc of the outer ferromagnetic layer 245 are oriented in opposite directions. Thus, it is possible to reduce the influence of the magnetic field generated by the ferromagnetic layer 24 upon the soft magnetic layer 22. Therefore, the asymmetry of the output voltage waveform can be improved, and furthermore the asymmetry can be easily controlled so as to be 0%.

The thickness $T_{kn}$ of the ferromagnetic interlayer 243 is set to from 0.5 nm to 1.0 nm inclusive, whereby the route for the electrons can be effectively limited without weakening the magnetic coupling between the first inner ferromagnetic layer 242a and the second inner ferromagnetic layer 242b and without decreasing the heat resistance, and therefore the high rate of resistance change can be obtained.

In addition, the distance $D_{k1}$ between the nonmagnetic layer 23 and the ferromagnetic interlayer 243 is set to from 1.5 nm to 3 nm inclusive. Also, the ratio $D_{k1}/D_{k2}$ of the distance $D_{k1}$ between the nonmagnetic layer 23 and the ferromagnetic interlayer 243 to the distance $Dk_2$ between the ferromagnetic interlayer 243 and the coupling layer 244, i.e., the ratio $T_{ku1}/T_{ku2}$ of the thickness $T_{ku1}$ of the first inner ferromagnetic layer 242a to the thickness $T_{ku2}$ of the second inner ferromagnetic layer 242b is set to from 1.2 to 3 inclusive. Thus, the route for the electrons e can be effectively limited without excessively concentrating the electrons e on the narrow range, and therefore the higher rate of resistance change can be obtained.

The ferromagnetic interlayer 243 contains at least one of oxide, nitride and nitride oxide, whereby the ferromagnetic interlayer 243 can be magnetically stabilized and can reduce the variation in output. Therefore, stable properties can be obtained.

Additionally, the ferromagnetic interlayer 243 comprises some common elements with the inner ferromagnetic layer 242. Thus, for example, the inner ferromagnetic layer 242 is partially oxidized, nitrided or oxidized and nitrided, whereby the good ferromagnetic interlayer 243 can be easily obtained.

The relationship between the sum total of the thickness $T_{ku1}$ of the first inner ferromagnetic layer 242a, the thickness $T_{ku2}$ of the second inner ferromagnetic layer 242b and the thickness $T_{kn}$ of the ferromagnetic interlayer 243 and the thickness $T_{ks}$ of the outer ferromagnetic layer 245 is set to $1.2 \leq (T_{ku1}+T_{ku2}+T_{kn})/T_{ks} \leq 3$. Thus, the rate of resistance change of the stack 20 can be increased without weakening the magnetic coupling between the outer ferromagnetic layer 245 and the second inner ferromagnetic layer 242b.

The first inner ferromagnetic layer 242a, the ferromagnetic interlayer 243, the second inner ferromagnetic layer 242b, the coupling layer 244 and the outer ferromagnetic layer 245 are arranged in this order on the nonmagnetic layer 23. Thus, the route for the electrons can be effectively limited, and therefore the rate of resistance change can be further increased.

[Alternative to First Embodiment]

An alternative to the first embodiment will be described with reference to FIG. 19. This alternative has the same structure as the first embodiment except that a soft magnetic layer 52 of a stack 50 has two magnetizations oriented in opposite directions. Accordingly, the same elements are indicated by the same reference numerals and the detailed description of these elements is omitted.

FIG. 19 shows the structure of the stack 50 of the alternative. The soft magnetic layer 52 of the stack 50 has the structure comprising an inner soft magnetic layer 522, a coupling layer 524 and an outer soft magnetic layer 525, these layers being arranged in this order from the side of the nonmagnetic layer 23. The inner soft magnetic layer 522 is composed of two layers: a nonmagnetic-layer-side layer 522a located close to the nonmagnetic layer 23 and a coupling-layer-side layer 522b located close to the coupling layer 524. The nonmagnetic-layer-side layer 522a and the coupling-layer-side layer 522b differ from each other in material or composition. The nonmagnetic-layer-side layer 522a corresponds to the "nonmagnetic-layer-side layer 22a" of the first embodiment and has the same structure as the nonmagnetic-layer-side layer 22a. The coupling-layer-side layer 522b, in conjunction with the outer soft magnetic layer 525, corresponds to the "underlying-layer-side layer 22b" of the first embodiment and is made of the same material as the underlying-layer-side layer 22b. The total thickness of the coupling-layer-side layer 522b and the outer soft magnetic layer 525 is equal to the thickness of the underlying-layer-side layer 22b.

The coupling layer 524 causes the antiferromagnetic exchange coupling between the inner soft magnetic layer 522 and the outer soft magnetic layer 525, thereby orienting the magnetization Mf of the inner soft magnetic layer 522 and magnetization Mfc of the outer soft magnetic layer 525 in opposite directions. The coupling layer 524 has the same structure as the coupling layer 244 of the ferromagnetic layer 24. In this alternative, the magnetization Mf of the inner soft magnetic layer 522 and the magnetization Mfc of the outer soft magnetic layer 525 are thus oriented in opposite directions, whereby an effective thickness of the soft magnetic layer 52 is reduced and thus the rate of resistance change of the stack 50 can be increased.

Preferably, the relationship between a thickness $T_{nu}$ of the inner soft magnetic layer 522, i.e., the sum total of a thickness $T_{nua}$ of the nonmagnetic-layer-side layer 522a and a thickness $T_{nub}$ of the coupling-layer-side layer 522b and a thickness $T_{ns}$ of the outer soft magnetic layer 525 is defined as $0.4 \leq T_{ns}/T_{nu} \leq 0.8$. If $T_{ns}/T_{nu}$ is less than 0.4, the effective thickness of the soft magnetic layer 52 cannot be sufficiently reduced and thus the high rate of resistance change cannot be obtained. If $T_{ns}/T_{nu}$ is more than 0.8, the thickness of the soft magnetic layer 52 is increased and thus the rate of resistance change cannot be sufficiently increased.

In this alternative, receiving the signal magnetic field from the magnetic recording medium 3, the orientation of the magnetization Mf of the inner soft magnetic layer 522 and the orientation of the magnetization Mfc of the outer soft magnetic layer 525 are integrally changed. Thus, the current flowing through the stack 50 operates in the same manner as the first embodiment except that the current is subjected to the resistance in accordance with the relative angle between the orientation of the magnetization Mf of the inner soft magnetic layer 522 and the orientations of the magnetizations Mp of the inner ferromagnetic layer 242 and the ferromagnetic interlayer 243. Moreover, this alternative can be manufactured in the same manner as the first embodiment.

According to this alternative, in addition to the effect described in the first embodiment, the effective thickness of the soft magnetic layer 52 can be reduced and thus the rate of resistance change can be further increased because the soft magnetic layer 52 has two magnetizations oriented in opposite directions.

[Second Embodiment]

Furthermore, a second embodiment of the invention will be described with reference to the drawing. This embodiment has the same structure as the first embodiment except that a stack 60 has a different structure. Accordingly, the same elements are indicated by the same reference numerals and the detailed description of these elements is omitted.

Figure 20:
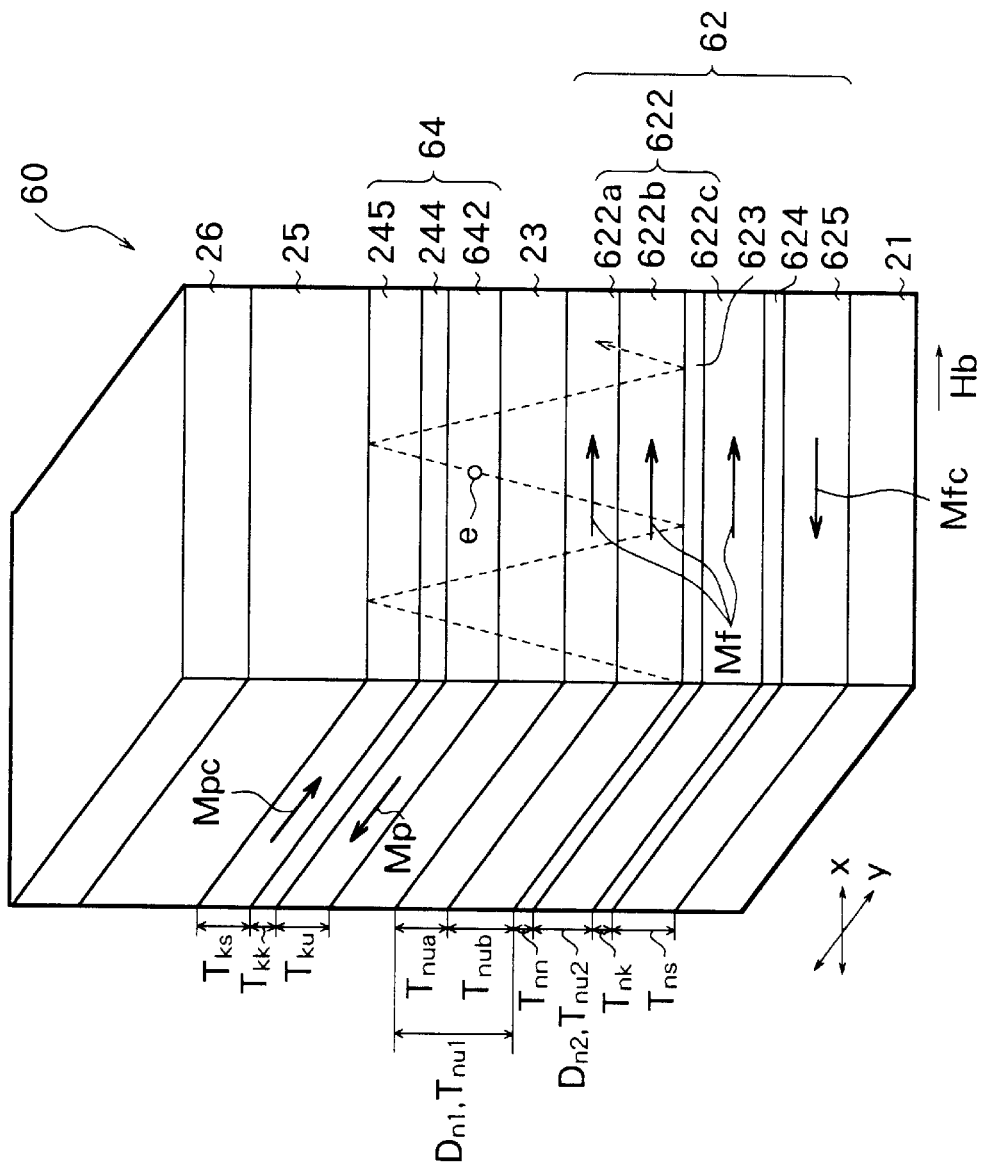
FIG. 20 is a perspective view of the structure of the stack of the MR element according to a second embodiment of the invention.

FIG. 20 shows the structure of the stack 60 of this embodiment. The stack 60 has the same structure as the stack 20 of the first embodiment except that a soft magnetic layer 62 and a ferromagnetic layer 64 have different structures. The soft magnetic layer 62 has the structure comprising a nonmagnetic-layer-side layer 622a, an interlayer-side layer 622b, a soft magnetic interlayer 623, a second inner soft magnetic layer 622c, a coupling layer 624 and an outer soft magnetic layer 625, these layers being arranged in this order from the side of the nonmagnetic layer 23. The nonmagnetic-layer-side layer 622a and the interlayer-side layer 622b compose a first inner soft magnetic layer. The layers 622a and 622b, in conjunction with the second inner soft magnetic layer 622c, compose an inner soft magnetic layer 622. That is, the soft magnetic layer 62 has the inner soft magnetic layer 622, the outer soft magnetic layer 625 and the coupling layer 624 sandwiched therebetween. The inner soft magnetic layer 622 is divided into the first inner soft magnetic layer located close to the nonmagnetic layer 23 and the second inner soft magnetic layer 622c located close to the coupling layer 624 by the soft magnetic interlayer 623.

The first inner soft magnetic layer (the nonmagnetic-layer-side layer 622a and the interlayer-side layer 622b) of this embodiment corresponds to one specific example of "a first soft magnetic layer" of the invention. The second inner soft magnetic layer 622c corresponds to one specific example of "a second soft magnetic layer" of the invention. The outer soft magnetic layer 625 corresponds to one specific example of "a third soft magnetic layer" of the invention. The soft magnetic interlayer 623 corresponds to one specific example of "a magnetic interlayer" of the invention. The coupling layer 624 corresponds to one specific example of "a nonmagnetic interlayer" of the invention.

The nonmagnetic-layer-side layer 622a corresponds to the nonmagnetic-layer-side layer 22a of the first embodiment and has the same structure as the nonmagnetic-layer-side layer 22a of the first embodiment. The interlayer-side layer 622b, the second inner soft magnetic layer 622c and the outer soft magnetic layer 625 correspond to the underlying-layer-side layer 22b of the first embodiment and are made of the same material as the underlying-layer-side layer 22b of the first embodiment. The total thickness of the layers 622b, 622c and 625 is equal to the thickness of the underlying-layer-side layer 22b.

When the sense current flows through the stack 60, the soft magnetic interlayer 623 reflects at least some electrons e and thus limits the route for the electrons e, thereby increasing the rate of resistance change of the stack 60, similarly to the ferromagnetic interlayer 243 of the first embodiment. The soft magnetic interlayer 623 has the magnetism and the electrical resistance higher than the electrical resistance of the inner soft magnetic layer 622. The soft magnetic interlayer 623 thus has the magnetism, whereby the nonmagnetic-layer-side layer 622a, the interlayer-side layer 622b and the second inner soft magnetic layer 622c are magnetically coupled to one another.

The soft magnetic interlayer 623 is also made of the material having the higher electrical resistance than the material making the inner soft magnetic layer 622. For example, it is preferable that the soft magnetic interlayer 623 contains at least one of oxide, nitride and nitride oxide, similarly to the ferromagnetic interlayer 243 of the first embodiment. Preferably, the soft magnetic interlayer 623 has some common elements with the second inner soft magnetic layer 622c, for example. Specifically, it is preferable that the soft magnetic interlayer 623 contains at least Ni in the group consisting of Ni, Co, Fe, Ta, Cr, Rh, Mo and Nb and at least one kind of element in the group consisting of O and N. For instance, the second inner soft magnetic layer 622c is partially oxidized, nitrided or oxidized and nitrided, whereby the good soft magnetic interlayer 623 can be easily obtained.

Preferably, a thickness $T_{nn}$ of the soft magnetic interlayer 623 is from 0.5 nm to 1.0 nm inclusive, similarly to the ferromagnetic interlayer 243 of the first embodiment, for example. If the soft magnetic interlayer 623 is too thick, the magnetic coupling between the nonmagnetic-layer-side and interlayer-side layers 622a and 622b and the second inner soft magnetic layer 622c is weakened and also the heat resistance decreases considerably. As a result, the high rate of resistance change cannot be obtained. If the soft magnetic interlayer 623 is too thin, the route for the electrons e cannot be sufficiently limited and thus the high rate of resistance change cannot be obtained.

Preferably, the position of the soft magnetic interlayer 623, e.g., a ratio $D_{n1}/D_{n2}$ of a distance $D_{n1}$ between the nonmagnetic layer 23 and the soft magnetic interlayer 623 to a distance $D_{n2}$ between the soft magnetic interlayer 623 and the coupling layer 624 is within a range of $1.2 \leq D_{n1}/D_{n2} \leq 3$. That is, in this embodiment, the distance $D_{n1}$ between the nonmagnetic layer 23 and the soft magnetic interlayer 623 is equal to a thickness $T_{nu1}$ of the first inner soft magnetic layer, i.e., the thickness $T_{nua}$ of the nonmagnetic-layer-side layer 622a plus the thickness $T_{nub}$ of the interlayer-side layer 622b. The distance $D_{n2}$ between the soft magnetic interlayer 623 and the coupling layer 624 is equal to a thickness $T_{nu2}$ of the second inner soft magnetic layer 622c. Thus, preferably, the relationship between the thickness $T_{nu1}$ of the first inner soft magnetic layer and the thickness $T_{nu2}$ of the second inner soft magnetic layer 622c is defined as $1.2 \leq T_{nu1}/T_{nu2} \leq 3$. The position of the soft magnetic interlayer 623 is expressed below as a specific numerical value. Preferably, the distance $D_{n1}$ between the nonmagnetic layer 23 and the soft magnetic interlayer 623 is within a range of from 1.5 nm to 3.0 nm inclusive. If the distance $D_{n1}$ is longer than this range, the effect of limiting the route for the electrons e cannot be fully obtained and thus the high rate of resistance change cannot be obtained. If the distance $D_{n1}$ is shorter than this range, the electrons e are excessively concentrated on the narrow range. Thus, the magnetism applied to the electrons e is scattered, and consequently the rate of resistance change is reduced.

Preferably, the distance $D_{n2}$ between the soft magnetic interlayer 623 and the coupling layer 624 is within a range of from 0.8 nm to 2.0 nm inclusive. If the distance $D_{n2}$ is shorter than this range, the magnetic coupling between the first inner soft magnetic layer and the second inner soft magnetic layer 622c and the magnetic coupling described below between the second inner soft magnetic layer 622c and the outer soft magnetic layer 625 is weakened and also the heat resistance decreases considerably. Thus, the high rate of resistance change cannot be obtained. Also if the distance $D_{n2}$ is longer than this range, the high rate of resistance change cannot be obtained.

The coupling layer 624 causes the antiferromagnetic exchange coupling between the inner soft magnetic layer 622 and the outer soft magnetic layer 625, thereby orienting the magnetizations Mf of the inner soft magnetic layer 622 and the soft magnetic interlayer 623 and the magnetization Mfc of the outer soft magnetic layer 625 in opposite directions. The coupling layer 624 has the same structure as the coupling layer 244 of the ferromagnetic layer 24 described in the first embodiment. In the second embodiment, the magnetizations Mf of the inner soft magnetic layer 622 and the soft magnetic interlayer 623 and the magnetization Mfc of the outer soft magnetic layer 625 are thus oriented in opposite directions, whereby the effective thickness of the soft magnetic layer 62 is reduced and thus the rate of resistance change of the stack 60 can be increased.

Preferably, the relationship between the sum total of the thickness $T_{nu1}$ of the first inner soft magnetic layer (i.e., the thickness $T_{nua}$ of the nonmagnetic-layer-side layer 622a plus the thickness $T_{nub}$ of the interlayer-side layer 622b), the thickness $T_{nn}$ of the soft magnetic interlayer 623 and the thickness $T_{nu2}$ of the second inner soft magnetic layer 622c, and the thickness $T_{ns}$ of the outer soft magnetic layer 625 is defined as $0.35 \leq T_{ns}/(T_{nu1}+T_{nn}+T_{nu2}) \leq 0.70$. If $T_{ns}/(T_{nu1}+T_{nn}+T_{nu2})$ is less than 0.35, the effective thickness of the soft magnetic layer 62 cannot be sufficiently reduced and thus the high rate of resistance change cannot be obtained. If $T_{ns}/(T_{nu1}+T_{nn}+T_{nu2})$ is more than 0.70, the thickness of the soft magnetic layer 62 is increased and thus the rate of resistance change cannot be sufficiently increased.

The ferromagnetic layer 64 has the same structure as the ferromagnetic layer 24 of the first embodiment, except that the ferromagnetic interlayer 243 of the first embodiment is eliminated and thus an inner ferromagnetic layer 642 is not divided. Preferably, the relationship between a thickness $T_{ku}$ of the inner ferromagnetic layer 642 and the thickness $T_{ks}$ of the outer ferromagnetic layer 245 is defined as $1.2 \leq T_{ku}/T_{ks} \leq 3$. If $T_{ku}/T_{ks}$ is less than 1.2, the thickness of the ferromagnetic layer 64 is increased and thus the rate of resistance change cannot be sufficiently increased. If $T_{ku}/T_{ks}$ is more than 3, the magnetic coupling between the outer ferromagnetic layer 245 and the inner ferromagnetic layer 642 is weakened and thus the orientation of the magnetization Mp of the inner ferromagnetic layer 642 is not fixed with stability. Consequently, the high rate of resistance change cannot be obtained.

The stack 60 can be manufactured in the same manner as the first embodiment. For example, the soft magnetic interlayer 623 is deposited in the same manner as the ferromagnetic interlayer 243 of the first embodiment. That is, after the second inner soft magnetic layer 622c is deposited, at least one of oxygen gas and nitrogen gas is introduced into the vacuum chamber not shown. Then, the surface of the second inner soft magnetic layer 622c is exposed to the atmosphere containing at least one of oxygen and nitrogen so that the surface of the second inner soft magnetic layer 622c is oxidized, nitrided or oxidized and nitrided, whereby the soft magnetic interlayer 623 is deposited.

Moreover, in this embodiment, the information recorded on the magnetic recording medium is readout in the same manner as the first embodiment. In this embodiment, the soft magnetic interlayer 623 having the higher electrical resistance than the inner soft magnetic layer 622 is included in the inner soft magnetic layer 622. Thus, when the sense current flows through the stack 60, at least some electrons e moving from the inner soft magnetic layer 622 toward the soft magnetic interlayer 623 are reflected in the surface of the soft magnetic interlayer 623. Thus, the path for the electrons e is narrowed, and therefore the rate of resistance change of the stack 60 can be increased similarly to the first embodiment. Moreover, since the inner soft magnetic layer 622 and the outer soft magnetic layer 625 are formed with the coupling layer 624 sandwiched therebetween, the effective thickness of the soft magnetic layer 62 is reduced and thus the rate of resistance change is increased.

According to this embodiment, the soft magnetic layer 62 includes the soft magnetic interlayer 623 having the magnetism and the electrical resistance higher than the electrical resistance of the inner soft magnetic layer 622. Thus, the path for the electrons e can be limited to the narrow range, and thus the rate of resistance change can be increased. Moreover, the thermal stability is high. Thus, even if the manufacturing process includes the step of heat treatment, less deterioration in properties occurs and therefore the high rate of resistance change can be obtained.

Moreover, the inner soft magnetic layer 622 and the outer soft magnetic layer 625 are formed sandwiching the coupling layer 624, whereby the antiferromagnetic exchange coupling is caused between the inner soft magnetic layer 622 and the outer soft magnetic layer 625 so that the magnetization Mp of the inner soft magnetic layer 622 and the amagnetization Mpc of the outer soft magnetic layer 625 are oriented in opposite directions. Thus, the effective thickness of the soft magnetic layer 62 can be reduced, and therefore the rate of resistance change can be further increased.

Furthermore, the thickness $T_{nn}$ of the soft magnetic interlayer 623 is set to from 0.5 nm to 1.0 nm inclusive, whereby the route for the electrons can be effectively limited without weakening the magnetic coupling between the first inner soft magnetic layer and the second inner soft magnetic layer 622c and without decreasing the heat resistance, and therefore the high rate of resistance change can be obtained.

In addition, the distance $D_{n1}$ between the nonmagnetic layer 23 and the soft magnetic interlayer 623 is set to from 1.5 nm to 3.0 nm inclusive. Also, the ratio $D_{n1}/D_{n2}$ of the distance $D_{n1}$ between the nonmagnetic layer 23 and the soft magnetic interlayer 623 to the distance $D_{n2}$ between the soft magnetic interlayer 623 and the coupling layer 624, i.e., the ratio $T_{nu1}/T_{nu2}$ of the thickness $T_{nu1}$ of the first inner soft magnetic layer to the thickness $T_{nu2}$ of the second inner soft magnetic layer 622c is set to $1.2 \leq T_{nu1}/T_{nu2} \leq 3$. Thus, the route for the electrons e can be effectively limited without excessively concentrating the electrons e on the narrow range, and therefore the higher rate of resistance change can be obtained.

Furthermore, the distance $D_{n2}$ between the soft magnetic interlayer 623 and the coupling layer 624 is set to from 0.8 nm to 2.0 nm inclusive, whereby the high rate of resistance change can be obtained without weakening the magnetic coupling between the first inner soft magnetic layer and the second inner soft magnetic layer 622c and the magnetic coupling between the second inner soft magnetic layer 622c and the outer soft magnetic layer 625, and without decreasing the heat resistance.

The soft magnetic interlayer 623 contains at least one of oxide, nitride and nitride oxide, whereby the soft magnetic interlayer 623 can be magnetically stabilized and can reduce the variation in output. Therefore, the stable properties can be obtained.

The soft magnetic interlayer 623 comprises some common elements with the inner soft magnetic layer 622. For example, the inner soft magnetic layer 622 is partially oxidized, nitrided or oxidized and nitrided, whereby the good soft magnetic interlayer 623 can be easily obtained.

The relationship between the sum total of the thickness $T_{nu1}$ of the first inner soft magnetic layer, the thickness $T_{nn}$ of the soft magnetic interlayer 623 and the thickness $T_{nu2}$ of the second inner soft magnetic layer 622c, and the thickness $T_{ns}$ of the outer soft magnetic layer 625 is defined as $0.35 \leq T_{ns}/(T_{nu1}+T_{nn}+T_{nu2}) \leq 0.70$, whereby the effective thickness of the soft magnetic layer 62 can be effectively reduced, and therefore the higher rate of resistance change can be obtained.

The inner ferromagnetic layer 642 and the outer ferromagnetic layer 245 are formed sandwiching the coupling layer 244, whereby the antiferromagnetic exchange coupling is caused between the inner ferromagnetic layer 642 and the outer ferromagnetic layer 245 so that the magnetization Mp of the inner ferromagnetic layer 642 and the magnetization Mpc of the outer ferromagnetic layer 245 are oriented in opposite directions. Similarly to the first embodiment, it is thus possible to reduce the influence of the magnetic field generated by the ferromagnetic layer 64 upon the soft magnetic layer 62. Therefore, the asymmetry of the output voltage waveform can be improved, and thus the asymmetry can be easily controlled so as to be zero.

The relationship between the thickness $T_{ku}$ of the inner ferromagnetic layer 642 and the thickness $T_{ks}$ of the outer ferromagnetic layer 245 is defined as $1.2 \leq T_{ku}/T_{ks} \leq 3$, whereby the rate of resistance change can be increased without weakening the magnetic coupling between the outer ferromagnetic layer 245 and the inner ferromagnetic layer 642.

Furthermore, the first inner soft magnetic layer, the soft magnetic interlayer 623, the second inner soft magnetic layer 622c, the coupling layer 624 and the outer soft magnetic layer 625 are arranged in this order from the side of the nonmagnetic layer 23, whereby the route for the electrons can be limited to the particularly narrow range, and therefore the rate of resistance change can be further increased.

[Third Embodiment]

In addition, a third embodiment of the invention will be described with reference to the drawing. This embodiment has the same structure as the first embodiment except that a stack 70 has a different structure. Accordingly, the same elements are indicated by the same reference numerals and the detailed description of these elements is omitted.

Figure 21:
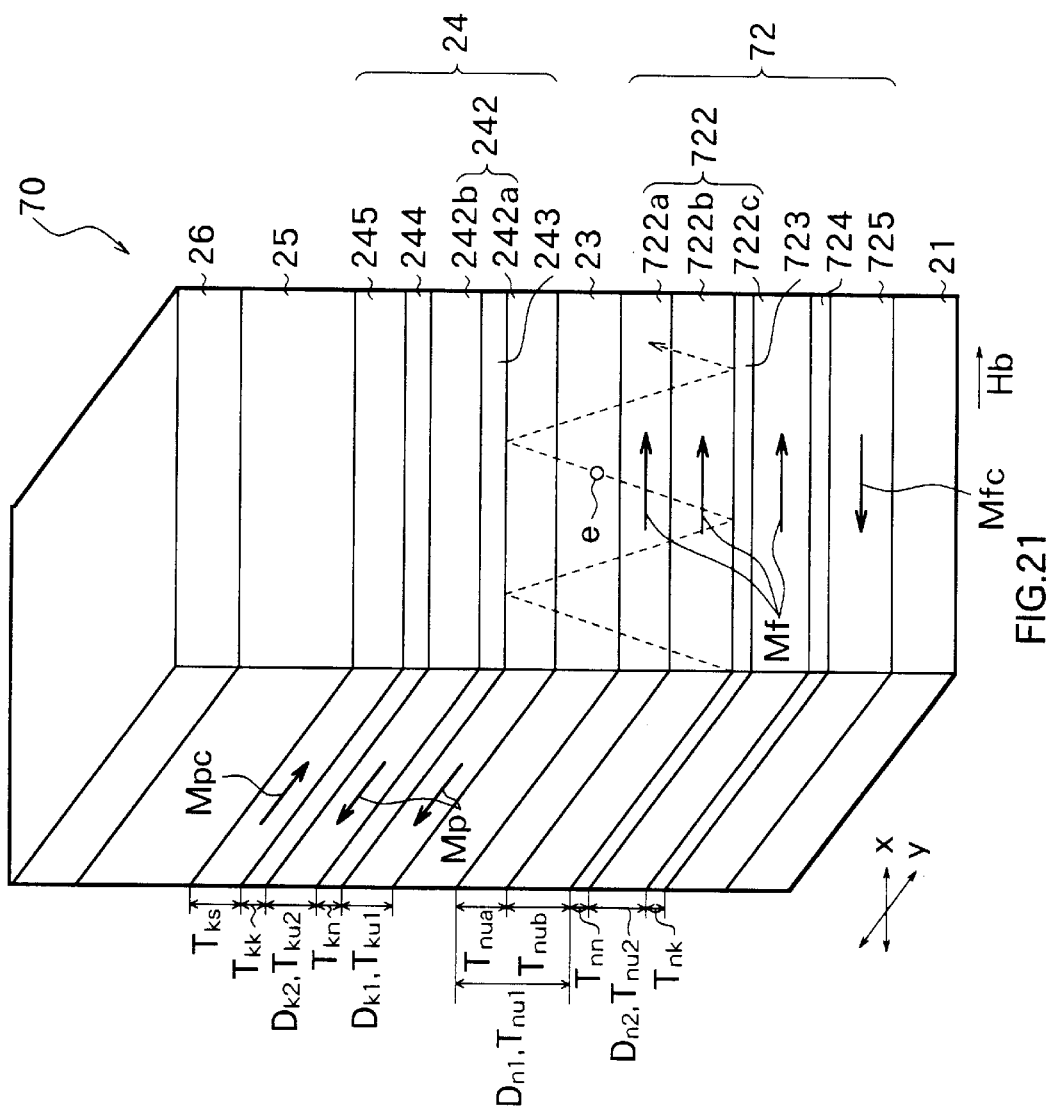
FIG. 21 is a perspective view of the structure of the stack of the MR element according to a third embodiment of the invention.
Figure 22:
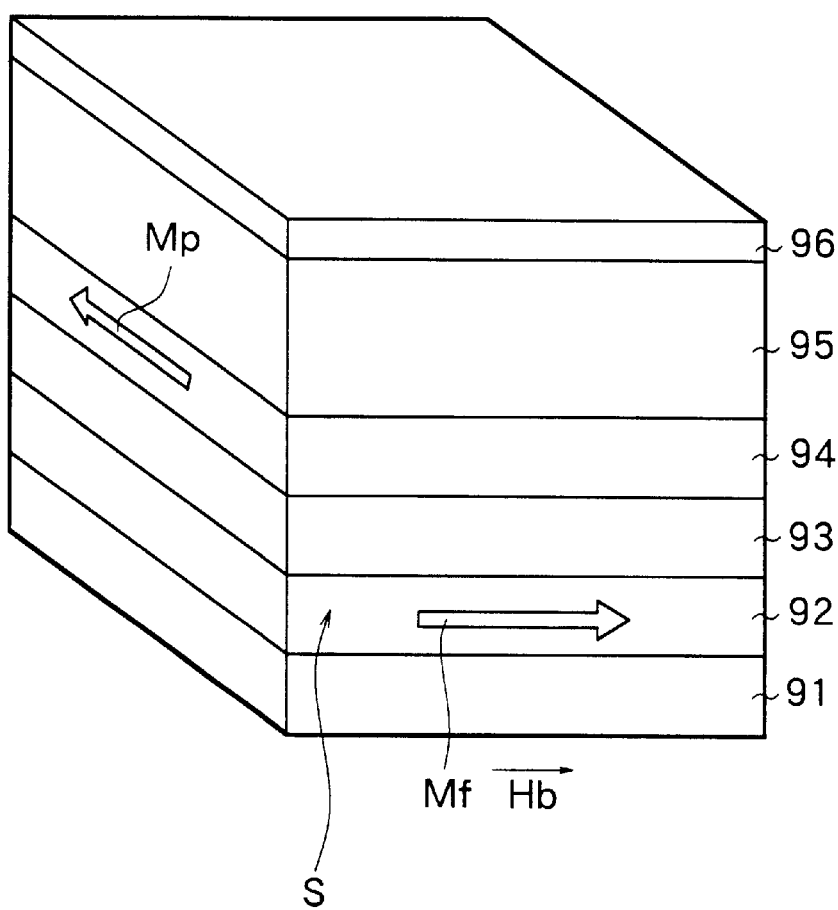
FIG. 22 is a perspective view of the structure of a spin valve film of a general MR element.

FIG. 21 shows the structure of the stack 70 of this embodiment. The stack 70 has the same structure as the stack 20 of the first embodiment except that a soft magnetic layer 72 has a different structure. The soft magnetic layer 72 has the same structure as the soft magnetic layer 62 of the second embodiment. That is, in the third embodiment, when the sense current flows through the stack 70, the route for the electrons e is narrowed by a soft magnetic interlayer 723 and the ferromagnetic interlayer 243, whereby the rate of resistance change of the stack 70 is increased. Moreover, the inner ferromagnetic layer 242 and the outer ferromagnetic layer 245 are formed sandwiching the coupling layer 244, whereby it is thus possible to reduce the influence of the magnetic field generated by the ferromagnetic layer 24 upon the soft magnetic layer 72. Furthermore, an inner soft magnetic layer 722 and an outer soft magnetic layer 725 are formed sandwiching a coupling layer 724, whereby the effective thickness of the soft magnetic layer 72 is reduced, and thus the rate of resistance change can be increased.

According to this embodiment, the soft magnetic layer 72 includes the soft magnetic interlayer 723 and the ferromagnetic layer 24 includes the ferromagnetic interlayer 243. Thus, this embodiment can obtain still higher rate of resistance change than the first and second embodiments.

Specific examples of the invention will be described in detail.

[EXAMPLES 1-1 to 1-9]

The stacks 20 were prepared as examples 1-1 to 1-9. As shown in FIG. 7, each stack 20 has the stacked structure comprising the underlying layer 21, the underlying-layer-side layer 22b, the nonmagnetic-layer-side layer 22a, the nonmagnetic layer 23, the first inner ferromagnetic layer 242a, the ferromagnetic interlayer 243, the second inner ferromagnetic layer 242b, the coupling layer 244, the outer ferromagnetic layer 245, the antiferromagnetic layer 25 and the protective layer 26, these layers being stacked in sequence on an insulating substrate. In the preparation, the layers except the ferromagnetic interlayer 243 were deposited by sputtering, and the ferromagnetic interlayer 243 was deposited by oxidizing the surface of the first inner ferromagnetic layer 242a.

Ta was used to deposit each underlying layer 21 and the thickness thereof was set to 3 nm. NiFe was used to deposit each underlying-layer-side layer 22b and the thickness thereof was set to 2 nm. CoFe was used to deposit each nonmagnetic-layer-side layer 22a and the thickness thereof was set to 2 nm. Cu was used to deposit each nonmagnetic layer 23 and the thickness thereof was set to 2.4 nm. The materials shown in Table 1 were used to deposit each first inner ferromagnetic layer 242a. Each first inner ferromagnetic layer 242a was deposited so that the thickness $T_{ku1}$ thereof may be 1.7 nm after each ferromagnetic interlayer 243 was deposited by oxidizing the surface. The thickness $T_{kn}$ of each ferromagnetic interlayer 243 was changed as shown in Table 1. The materials shown in Table 1 were used to deposit each second inner ferromagnetic layer 242b and the thickness $T_{ku2}$ thereof was set to 9 nm. Ru was used to deposit each coupling layer 244 and its thickness $T_{kk}$ was changed as shown in Table 1. RuRhMn was used to deposit each antiferromagnetic layer 25 and the thickness thereof was set to 11 nm. Since the non-heat-treatment type antiferromagnetic material was used to form the antiferromagnetic layer 25, each antiferromagnetic layer 25 was deposited while the magnetic field was applied to the antiferromagnetic layer 25. Ta was used to deposit each protective layer 26 and the thickness thereof was set to 3 nm.

TABLE 1

|  |  | Thickness (nm) | | Inner ferromagnetic | | |
|---|---|---|---|---|---|---|
|  |  | Ferromagnetic interlayer $T_{kn}$ | Coupling layer $T_{kk}$ | layer & Outer ferromagnetic layer | $(T_{ku1} + T_{kn} + T_{ku2})/T_{ks}$ | $D_{k1}/D_{k2}$ $(T_{ku1}/T_{ku2})$ |
| Example | 1-1 | 0.2 | 0.8 | Co | 2.8 | 1.9 |
|  | 1-2 | 0.6 | 0.5 | Co | 3.2 | 1.9 |
|  | 1-3 | 0.6 | 0.8 | Co | 3.2 | 1.9 |
|  | 1-4 | 0.6 | 1.1 | Co | 3.2 | 1.9 |
|  | 1-5 | 0.9 | 0.5 | Co | 3.5 | 1.9 |

TABLE 1-continued

|  |  | Thickness (nm) | | Inner ferromagnetic | | |
|---|---|---|---|---|---|---|
|  |  | Ferromagnetic interlayer $T_{kn}$ | Coupling layer $T_{kk}$ | layer & Outer ferromagnetic layer | $(T_{ku1} + T_{kn} + T_{ku2})/T_{ks}$ | $D_{k1}/D_{k2}$ $(T_{ku1}/T_{ku2})$ |
|  | 1-6 | 0.9 | 0.8 | Co | 3.5 | 1.9 |
|  | 1-7 | 1.2 | 0.8 | Co | 3.8 | 1.9 |
|  | 1-8 | 0.8 | 0.6 | $Co_{90}Fe_{10}$ | 3.4 | 1.9 |
|  | 1-9 | 0.8 | 0.6 | $Co_{80}Fe_{20}$ | 3.4 | 1.9 |
| Comparison | 1-1 | 0 | 0 | Co | — | — |
|  | 1-2 | 0 | 8 | Co | 2.6 | — |

That is, the examples 1-1 to 1-9 have varying thicknesses $T_{kn}$ of the ferromagnetic interlayer 243, varying thicknesses $T_{kk}$ of the coupling layer 244 or varying materials of the first inner ferromagnetic layer 242a, the second inner ferromagnetic layer 242b and the outer ferromagnetic layer 245. In each of the examples 1-1 to 1-9, the ratio $(T_{ku1}+T_{kn}+T_{ku2})/T_{ks}$ of the sum total of the thickness $T_{ku1}$ of the first inner ferromagnetic layer 242a, the thickness $T_{kn}$ of the ferromagnetic interlayer 243 and the thickness $T_{ku2}$ of the second inner ferromagnetic layer 242b to the thickness $T_{ks}$ of the outer ferromagnetic layer 245 is shown in Table 1. Also, the ratio $D_{k1}/D_{k2}$ of the distance $D_{k1}$ between the nonmagnetic layer 23 and the ferromagnetic interlayer 243 to the distance $D_{k2}$ between the coupling layer 244 and the ferromagnetic interlayer 243 (i.e., the ratio $T_{ku1}/T_{ku2}$ of the thickness $T_{ku1}$ of the first inner ferromagnetic layer 242a to the thickness $T_{ku2}$ of the second inner ferromagnetic layer 242b) is shown in Table 1.

After the stacks 20 were prepared, the stacks 20 underwent the heat treatment at 250° C. for 1 hour in order to stabilize the orientation of the magnetization of the ferromagnetic layer 24. After the 1-hour heat treatment, the magnetic field was applied to the stacks 20 while the current was fed through the stacks 20. At this time, the properties of the stacks 20 were examined. The results are shown in Table 2. Then, the stacks 20 underwent the heat treatment at 250° C. for another 5 hours, and the properties obtained after the 5-hour heat treatment were examined in the same manner. The results are also shown in Table 2. Moreover, when the thickness $T_{kn}$ of the ferromagnetic interlayer 243 was calculated from relativity of the magnetization, it was shown that the thickness $T_{kn}$ is substantial as shown in Table 1. Furthermore, when the thickness $T_{kn}$ of the ferromagnetic interlayer 243 was observed by a TEM (Transmission Electron Microscope), it was shown that the thickness $T_{kn}$ is substantial as shown in Table 1 as well.

TABLE 2

|  |  | Heat treatment time: 1 hour | | Heat treatment time: 1 hour + 5 hours | |
|---|---|---|---|---|---|
|  |  | Rate of resistance change (%) | Amount of resistance change ΔR (Ω) | Rate of resistance change (%) | Amount of resistance change ΔR (Ω) |
| Example | 1-1 | 8.2 | 0.27 | 7.5 | 0.22 |
|  | 1-2 | 10.8 | 0.33 | 11.5 | 0.35 |
|  | 1-3 | 10.6 | 0.31 | 11.3 | 0.32 |
|  | 1-4 | 10.5 | 0.33 | 11.5 | 0.35 |
|  | 1-5 | 10.9 | 0.36 | 11.9 | 0.39 |
|  | 1-6 | 10.7 | 0.35 | 11.3 | 0.38 |
|  | 1-7 | 8.0 | 0.31 | 7.3 | 0.27 |
|  | 1-8 | 10.5 | 0.33 | 11.6 | 0.36 |
|  | 1-9 | 10.3 | 0.32 | 11.5 | 0.34 |
| Comparison | 1-1 | 7.6 | 0.24 | 6.2 | 0.20 |
|  | 1-2 | 7.8 | 0.25 | 6.8 | 0.22 |

The stack was prepared as a comparison 1-1 to the examples under the same condition as the condition for the examples 1-1 to 1-7 except that the ferromagnetic interlayer and the coupling layer were not formed. Moreover, another stack was prepared as a comparison 1-2 under the same condition as the condition for the examples 1-1 to 1-7 except that the ferromagnetic interlayer was not formed and the thickness of the coupling layer was set to 0.8 nm. The properties of these comparisons 1-1 and 1-2 were examined in the same manner as the examples. The results are also shown in Table 2.

As can be seen from Table 2, according to the examples, after the 1-hour heat treatment and also after the another-5-hour heat treatment, the examples could obtain the higher rate of resistance change and the larger amount of resistance change ΔR compared to the comparisons. The examples 1-2 to 1-6, 1-8 and 1-9, in which the thickness $T_{kn}$ of the ferromagnetic interlayer 243 was set to from 0.5 nm to 1.0 nm inclusive, obtained the high rate of resistance change exceeding 10% after the 1-hour heat treatment and exceeding 11% after the another-5-hour heat treatment. Furthermore, these examples obtained the large amount of resistance change exceeding 0.32Ω after the 5-hour heat treatment. On the other hand, the comparison 1-1 obtained only 0.20Ω and the comparison 1-2 obtained only 0.22Ω after the 5-hour heat treatment. When the example 1-3 and the comparison 1-2 having the same thickness $T_{kk}$ of the coupling layer 244 are compared, the properties of the example 1-3 are improved by as much as 55% in the rate of resistance change and by as much as 45% in the amount of resistance change ΔR after the 5-hour heat treatment.

In other words, it turned out that the ferromagnetic layer 24 includes the ferromagnetic interlayer 243, whereby the rate of resistance change and the amount of resistance change ΔR can be increased. More particularly, it turned out that the thickness $T_{kn}$ of the ferromagnetic interlayer 243 is set to from 0.5 nm to 1.0 nm inclusive, whereby the higher rate of resistance change and the larger amount of resistance change ΔR can be obtained.

[EXAMPLES 2-1 to 2-11]

The stacks 20 were prepared as examples 2-1 to 2-11 under the same condition as the condition for the example 1-6, except that the thickness $T_{kn}$ of the ferromagnetic interlayer 243 was set to 0.6 nm, the thickness $T_{kk}$ of the coupling layer 244 was set to 0.8 nm, the thickness $T_{ku1}$ of the first inner ferromagnetic layer 242a, the thickness $T_{ku2}$ of the second inner ferromagnetic layer 242b and the thickness $T_{ks}$ of the outer ferromagnetic layer 245 were changed as shown in Table 3 and the thickness of the antiferromagnetic layer 25 was set to 10 nm. That is, the examples 2-1 to 2-11 have varying positions of the ferromagnetic interlayer 243 and the coupling layer 244. In each of the prepared stacks 20, the ratio $(T_{ku1}+T_{kn}+T_{ku2})/T_{ks}$ of the sum total of the thickness $T_{ku1}$ of the first inner ferromagnetic layer 242a, the thickness $T_{kn}$ of the ferromagnetic interlayer 243 and the thickness $T_{ku2}$ of the second inner ferromagnetic layer 242b to the thickness $T_{ks}$ of the outer ferromagnetic layer 245 is shown in Table 3. Also, the ratio $D_{k1}/D_{k2}$ of the distance $D_{k1}$ between the nonmagnetic layer 23 and the ferromagnetic interlayer 243 to the distance $D_{k2}$ between the coupling layer 244 and the ferromagnetic interlayer 243 (i.e., the ratio $T_{ku1}/T_{ku2}$) is shown in Table 3. The properties of these stacks 20 were examined in the same manner as the example 1-6. The results are shown in Table 4.

could obtain the higher rate of resistance change and the larger amount of resistance change ΔR compared to the example 2-8 having $(T_{ku1}+T_{kn}+T_{ku2})/T_{ks}$ less than 1.2 and the example 2-9 having $(T_{ku1}+T_{kn}+T_{ku2})/T_{ks}$ more than 3. Moreover, the examples 2-1 to 2-7, in which the thickness $T_{ku1}$ of the first inner ferromagnetic layer 242a (i.e., the distance $D_{k1}$ between the nonmagnetic layer 23 and the ferromagnetic interlayer 243) is 1.5 nm or more, could obtain the higher rate of resistance change and the larger amount of resistance change ΔR compared to the example 2-9 having $T_{ku1}$ ($D_{k1}$) less than 1.5 nm. Furthermore, the examples 2-1 to 2-7 having $D_{k1}/Dk_2$ of from 1.2 to 3.0 inclusive could obtain the higher rate of resistance change and the larger amount of resistance change ΔR compared to the example 2-10 having $D_{k1}/D_{k2}$ less than 1.2 and the example 2-11 having $D_{k1}/D_{k2}$ more than 3.

In other words, it turned out that the coupling layer 244 is positioned so that $(T_{ku1}+T_{kn}+T_{ku2})/T_{ks}$ may be from 1.2 to 3.0 inclusive, whereby the higher rate of resistance change and the larger amount of resistance change ΔR can be obtained. Moreover, it turned out that the ferromagnetic interlayer 243 is positioned so that $D_{k1}/Dk_{k2}$ (i.e., $T_{ku1}/T_{ku2}$)

TABLE 3

| | | Thickness (nm) | | | | |
|---|---|---|---|---|---|---|
| | | First inner ferromagnetic layer $T_{ku1}$ | Second inner ferromagnetic layer $T_{ku2}$ | Outer ferromagnetic layer $T_{ks}$ | $(T_{ku1} + T_{kn} + T_{ku2})/T_{ks}$ | $D_{k1}/D_{k2}$ $(T_{ku1}/T_{ku2})$ |
| Example | 2-1 | 1.7 | 9 | 1.2 | 2.7 | 1.9 |
| | 2-2 | 1.7 | 9 | 1.5 | 2.1 | 1.9 |
| | 2-3 | 1.7 | 9 | 2.0 | 1.6 | 1.9 |
| | 2-4 | 2.1 | 9 | 2.5 | 1.4 | 2.3 |
| | 2-5 | 1.5 | 9 | 2.0 | 1.5 | 1.7 |
| | 2-6 | 1.7 | 1.3 | 1.5 | 2.4 | 1.3 |
| | 2-7 | 2.4 | 1.0 | 2.5 | 1.6 | 2.4 |
| | 2-8 | 1.7 | 1.0 | 3.1 | 1.1 | 1.7 |
| | 2-9 | 1.0 | 1.8 | 1.1 | 3.1 | 0.6 |
| | 2-10 | 1.9 | 1.7 | 2.0 | 2.1 | 1.1 |
| | 2-11 | 1.6 | 0.5 | 2.0 | 1.4 | 3.2 |

TABLE 4

| | | Heat treatment time: 1 hour | | Heat treatment time: 1 hour + 5 hours | |
|---|---|---|---|---|---|
| | | Rate of resistance change (%) | Amount of resistance change ΔR (Ω) | Rate of resistance change (%) | Amount of resistance change ΔR (Ω) |
| Example | 2-1 | 9.8 | 0.30 | 10.0 | 0.31 |
| | 2-2 | 10.4 | 0.31 | 10.9 | 0.33 |
| | 2-3 | 10.8 | 0.32 | 11.5 | 0.34 |
| | 2-4 | 11.2 | 0.34 | 11.7 | 0.36 |
| | 2-5 | 10.5 | 0.30 | 11.3 | 0.32 |
| | 2-6 | 10.2 | 0.28 | 11.0 | 0.31 |
| | 2-7 | 11.3 | 0.35 | 11.9 | 0.39 |
| | 2-8 | 8.1 | 0.24 | 7.6 | 0.24 |
| | 2-9 | 8.2 | 0.22 | 7.6 | 0.24 |
| | 2-10 | 8.3 | 0.26 | 7.7 | 0.25 |
| | 2-11 | 8.0 | 0.24 | 7.8 | 0.23 |

As can be seen from Table 4, according to the examples, after the 1-hour heat treatment and also after the another-5-hour heat treatment, the examples could obtain the higher rate of resistance change and the larger amount of resistance change ΔR compared to the comparisons 1-1 and 1-2 shown in Tables 1 and 2. More particularly, the examples 2-1 to 2-7 having $(T_{ku1}+T_{kn}+T_{ku2})/T_{ks}$ of from 1.2 to 3.0 inclusive may be from 1.2 to 3.0 inclusive, whereby the higher rate of resistance change and the larger amount of resistance change ΔR can be obtained. Furthermore, it turned out that the distance $D_{k1}$ between the nonmagnetic layer 23 and the ferromagnetic interlayer 243 is set to 1.5 nm or more, whereby the higher rate of resistance change and the larger amount of resistance change ΔR can be obtained.

[EXAMPLES 3-1 to 3-8]

The stacks 60 were prepared as examples 3-1 to 3-8. As shown in FIG. 20, each stack 60 has the stacked structure comprising the underlying layer 21, the outer soft magnetic layer 625, the coupling layer 624, the second inner soft magnetic layer 622c, the soft magnetic interlayer 623, the interlayer-side layer 622b, the nonmagnetic-layer-side layer 622a, the nonmagnetic layer 23, the inner ferromagnetic layer 242, the coupling layer 244, the outer ferromagnetic layer 245, the antiferromagnetic layer 25 and the protective layer 26, these layers being stacked in sequence on the insulating substrate. In the preparation, the layers except the soft magnetic interlayer 623 were deposited by sputtering, and the soft magnetic interlayer 623 was deposited by oxidizing the surface of the second inner soft magnetic layer 622c.

Ta was used to deposit each underlying layer 21 and the thickness thereof was set to 3 nm. NiFe was used to deposit each outer soft magnetic layer 625 and the thickness $T_{ns}$ thereof was changed as shown in Table 5. Ru was used to deposit each coupling layer 624 and its thickness $T_{nk}$ was set to 0.8 nm. NiFe was used to deposit each second inner soft magnetic layer 622c. The thickness $T_{nu2}$, which was obtained after the deposition of the soft magnetic interlayer 623 by the oxidation of the surface, was changed so as to have the values shown in Table 5. The thickness $T_{nn}$ of each soft magnetic interlayer 623 was set to 0.6 nm. NiFe was used to deposit each interlayer-side layer 622b and the thickness $T_{nub}$ thereof was changed as shown in Table 5. Co was used to deposit each nonmagnetic-layer-side layer 622a and the thickness $T_{nua}$ thereof was changed as shown in Table 5. Cu was used to deposit each nonmagnetic layer 23 and the thickness thereof was set to 2.4 nm. Co was used to deposit each inner ferromagnetic layer 642 and the thickness $T_{ku}$ thereof was set to 2 nm. Ru was used to deposit each coupling layer 244 and the thickness $T_{kk}$ thereof was set to 0.8 nm. Co was used to deposit each outer ferromagnetic layer 245 and the thickness $T_{ks}$ thereof was set to 1 nm. PtMn was used to deposit each antiferromagnetic layer 25 and the thickness thereof was set to 20 nm. Ta was used to deposit each protective layer 26 and the thickness thereof was set to 3 nm.

TABLE 5

| | | Thickness (nm) | | | |
|---|---|---|---|---|---|
| | | Outer soft magnetic layer $T_{ns}$ | Second inner soft magnetic layer $T_{nu2}$ | Interlayer-side layer $T_{nub}$ | Nonmagnetic-layer-side layer $T_{nua}$ |
| Example | 3-1 | 2 | 0.8 | 0.8 | 1.0 |
| | 3-2 | 2 | 1.0 | 1.0 | 1.0 |
| | 3-3 | 2 | 1.5 | 1.0 | 1.0 |
| | 3-4 | 2 | 2.0 | 2.0 | 1.0 |
| | 3-5 | 3 | 1.5 | 1.5 | 1.0 |
| | 3-6 | 3 | 2.0 | 2.0 | 1.0 |
| | 3-7 | 1.5 | 1.0 | 1.0 | 1.0 |
| | 3-8 | 2 | 0.4 | 2.0 | 2.0 |
| Comparison | 3-1 | — | 2.0 | | 1.0 |
| | 3-2 | — | 3.0 | | 1.0 |
| | 3-3 | 3 | 2.0 | 2.0 | 1.0 |
| | 3-4 | 2 | 4.0 | | 1.0 |

That is, the examples 3-1 to 3-8 have varying positions of the soft magnetic interlayer 623 and the coupling layer 624. In each of the prepared stacks 60, the ratio $T_{ns}/(T_{nu2}+T_{nn}+T_{nub}+T_{nua})$ of the thickness $T_{ns}$ of the outer soft magnetic layer 625 to the sum total of the thickness $T_{nu2}$ of the second inner soft magnetic layer 622c, the thickness $T_{nn}$ of the soft magnetic interlayer 623, the thickness $T_{nub}$ of the interlayer-side layer 622b and the thickness $T_{nua}$ of the nonmagnetic-layer-side layer 622a, i.e., the ratio $T_{ns}/(T_{nu2}+T_{nn}+T_{nu1})$ of the thickness $T_{ns}$ of the outer soft magnetic layer 625 to the sum total of the thickness $T_{nu2}$ of the second inner soft magnetic layer 622c, the thickness $T_{nn}$ of the soft magnetic interlayer 623 and the thickness $T_{nu1}$ of the first inner soft magnetic layer is shown in Table 6. Moreover, the ratio $D_{n1}/D_{n2}$ of the distance $D_{n1}$ between the nonmagnetic layer 23 and the soft magnetic interlayer 623 to the distance $D_{n2}$ between the coupling layer 624 and the soft magnetic interlayer 623, i.e., the ratio $(T_{nub}+T_{nua})/T_{nu2}$ of the thickness $T_{nu1}$ of the first inner soft magnetic layer (the thickness $T_{nub}$ of the interlayer-side layer 622b plus the thickness $T_{nua}$ of the nonmagnetic-layer-side layer 622a) to the thickness $T_{nu2}$ of the second inner soft magnetic layer 622c is shown in Table 6.

After the stacks 60 were prepared, the stacks 60 underwent the heat treatment at 250° C. for 3 hours in order to antiferromagnetize the antiferromagnetic layer 25. Then, the magnetic field was applied to the stacks 60 while the current was fed through the stacks 60. At this time, the properties of the stacks 60 were examined. The results are shown in Table 6.

TABLE 6

| | | $T_{ns}/(T_{nu2} + T_{nn} + T_{nub} + T_{nua})$ | $D_{n1}/D_{n2}$ $(T_{nub} + T_{nua})/T_{nu2}$ | Rate of resistance change (%) | Amount of resistance change $\Delta R$ ($\Omega$) | Coercive force HC (Oe) |
|---|---|---|---|---|---|---|
| Example | 3-1 | 0.63 | 2.3 | 9.3 | 0.34 | 0.3 |
| | 3-2 | 0.55 | 2.0 | 9.4 | 0.35 | 0.4 |
| | 3-3 | 0.49 | 1.3 | 9.2 | 0.34 | 0.3 |
| | 3-4 | 0.36 | 1.5 | 9.0 | 0.33 | 0.3 |
| | 3-5 | 0.65 | 1.7 | 8.3 | 0.29 | 0.3 |
| | 3-6 | 0.54 | 1.5 | 8.6 | 0.30 | 0.3 |
| | 3-7 | 0.42 | 2.0 | 9.0 | 0.33 | 0.3 |
| | 3-8 | 0.40 | 10 | 8.7 | 0.29 | 0.4 |
| Comparison | 3-1 | — | — | 6.8 | 0.22 | 1.5 |
| | 3-2 | — | — | 6.7 | 0.21 | 1.0 |
| | 3-3 | 0.75 | — | 7.5 | 0.26 | 0.3 |
| | 3-4 | 0.33 | — | 7.3 | 0.25 | 0.2 |

The stacks were prepared as comparisons 3-1 and 3-2 to the examples under the same condition as the condition for the examples 3-1 to 3-8, except that the coupling layer and the soft magnetic interlayer were not formed and the thickness of the underlying-layer-side layer corresponding to the second inner soft magnetic layer and the interlayer-side layer and the thickness of the nonmagnetic-layer-side layer were changed as shown in Table 5. Moreover, the stacks were prepared as comparisons 3-3 and 3-4 under the same condition as the condition for the examples 3-1 to 3-8, except that the soft magnetic interlayer was not formed and the thicknesses of the outer soft magnetic layer, the second inner soft magnetic layer and the first inner soft magnetic layer were changed as shown in Table 5. The properties of these comparisons were examined in the same manner as the examples. The results are also shown in Table 6.

As can be seen from Table 6, according to the examples, the examples could obtain the higher rate of resistance change and the larger amount of resistance change $\Delta R$ compared to the comparisons. For example, when the comparison 3-4 is compared to the example 3-4 having the soft magnetic interlayer 623 inserted in the comparison 3-4, the properties of the example 3-4 are improved by as much as 64% in the rate of resistance change and by as much as 65% in the amount of resistance change $\Delta R$.

Moreover, the coercive force Hc of the soft magnetic layer 62 could be reduced to sufficiently less than 3 (Oe) considered as an acceptable limit of a spin valve type MR element. Furthermore, the examples 3-1 to 3-7, in which the thickness $T_{nu2}$ of the second inner soft magnetic layer 622c (i.e., the distance $D_{n2}$ between the coupling layer 624 and the soft magnetic interlayer 623) was set to from 0.8 nm to 2.0 nm inclusive, could obtain the higher rate of resistance change and the larger amount of resistance change $\Delta R$ compared to the example 3-8 having $T_{nu2}$ less than 0.8 nm.

In other words, it turned out that the soft magnetic layer 62 includes the soft magnetic interlayer 623, whereby the rate of resistance change and the amount of resistance change $\Delta R$ can be increased. More particularly, it turned out that the thickness $T_{nu2}$ of the second inner soft magnetic layer 622c (i.e., the distance $D_{n2}$ between the coupling layer 624 and the soft magnetic interlayer 623) is set to from 0.8 nm to 2.0 nm inclusive, whereby the higher rate of resistance change and the larger amount of resistance change $\Delta R$ can be obtained. Moreover, it turned out that the coupling layer 624 is positioned so that $T_{ns}/(T_{nu2}+T_{nn}+T_{nub}+T_{nua})$, i.e., $T_{ns}/(T_{nu2}+T_{nn}+T_{nu1})$ may be from 0.35 to 0.70 inclusive, whereby the higher rate of resistance change and the larger amount of resistance change ΔR can be obtained.

[EXAMPLES 4-1 to 4-7]

The stacks 60 were prepared as examples 4-1 to 4-7 under the same condition as the condition for the examples 3-1 to 3-8, except that the thickness $T_{ns}$ of the outer soft magnetic layer 625 was set to 2 nm, the thickness $T_{nu2}$ of the second inner soft magnetic layer 622c, the thickness $T_{nub}$ of the interlayer-side layer 622b and the thickness $T_{nua}$ of the nonmagnetic-layer-side layer 622a were set to 1 nm and the thickness $T_{ku}$ of the inner ferromagnetic layer 642 and the thickness $T_{ks}$ of the outer ferromagnetic layer 245 were changed as shown in Table 7. That is, the examples 4-1 to 4-7 have varying positions of the coupling layer 244. In each of the prepared stacks 60, the ratio $T_{ku}/T_{ks}$ of the thickness $T_{ku}$ of the inner ferromagnetic layer 642 to the thickness $T_{ks}$ of the outer ferromagnetic layer 245 is shown in Table 7. The properties of these stacks 60 were examined in the same manner as the examples 3-1 to 3-8. The results are also shown in Table 7.

TABLE 7

| | | Thickness (nm) | | | |
|---|---|---|---|---|---|
| | | Inner ferro-magnetic layer $T_{ku}$ | Outer ferro-magnetic layer $T_{ks}$ | $T_{ku}/T_{ks}$ | Rate of resistance change (%) | Amount of resistance change ΔR (Ω) |
| Example | 4-1 | 1.0 | 2.0 | 0.5 | 8.0 | 0.26 |
| | 4-2 | 2.0 | 2.0 | 1.0 | 8.1 | 0.28 |
| | 4-3 | 2.0 | 1.5 | 1.3 | 9.2 | 0.35 |
| | 4-4 | 2.0 | 1.0 | 2.0 | 8.9 | 0.32 |
| | 4-5 | 3.0 | 2.0 | 1.5 | 9.0 | 0.33 |
| | 4-6 | 3.0 | 1.5 | 2.0 | 8.3 | 0.29 |
| | 4-7 | 3.0 | 1.0 | 3.0 | 8.6 | 0.30 |

As can be seen from Table 7, according to the examples, the examples could obtain the higher rate of resistance change and the larger amount of resistance change ΔR compared to the comparisons 3-1 to 3-4 shown in Tables 5 and 6. More particularly, the examples 4-3 to 4-7 having $T_{ku}/T_{ks}$ of 1.2 or more could obtain the higher rate of resistance change and the larger amount of resistance change ΔR compared to the examples 4-1 and 4-2 having $T_{ku}/T_{ks}$ less than 1.2. That is, it turned out that the coupling layer 244 is positioned so that the ratio $T_{ku}/T_{ks}$ of the thickness $T_{ku}$ of the inner ferromagnetic layer 242 to the thickness $T_{ks}$ of the outer ferromagnetic layer 245 may be 1.2 or more, whereby the higher rate of resistance change and the larger amount of resistance change ΔR can be obtained.

[EXAMPLES 5-1 to 5-9]

The stacks 70 were prepared as examples 5-1 to 5-9. As shown in FIG. 21, each stack 70 has the stacked structure comprising the underlying layer 21, the outer soft magnetic layer 725, the coupling layer 724, a second inner soft magnetic layer 722c, the soft magnetic interlayer 723, an interlayer-side layer 722b, a nonmagnetic-layer-side layer 722a, the nonmagnetic layer 23, the first inner ferromagnetic layer 242a, the ferromagnetic interlayer 243, the second inner ferromagnetic layer 242b, the coupling layer 244, the outer ferromagnetic layer 245, the antiferromagnetic layer 25 and the protective layer 26, these layers being stacked in sequence on the insulating substrate. In the preparation, the layers except the soft magnetic interlayer 723 and the ferromagnetic interlayer 243 were deposited by sputtering. The soft magnetic interlayer 723 was deposited by oxidizing the surface of the second inner soft magnetic layer 722c, and the ferromagnetic interlayer 243 was deposited by oxidizing the surface of the first inner ferromagnetic layer 242a.

Ta was used to deposit each underlying layer 21 and the thickness thereof was set to 3 nm. NiFe was used to deposit each outer soft magnetic layer 725 and the thickness $T_{ns}$ thereof was changed as shown in Table 8. Ru was used to deposit each coupling layer 724 and the thickness $T_{nk}$ thereof was set to 0.8 nm. NiFe was used to deposit each second inner soft magnetic layer 722c. The thickness $T_{nu2}$, which was obtained after depositing the soft magnetic interlayer 723 by the oxidation of the surface, was changed so as to have the values shown in Table 8. The thickness $T_{nn}$ of each soft magnetic interlayer 723 was set to 0.6 nm. NiFe was used to deposit each interlayer-side layer 722b and the thickness $T_{nub}$ thereof was changed as shown in Table 8. CoFe was used to deposit each nonmagnetic-layer-side layer 722a and the thickness $T_{nua}$ thereof was changed as shown in Table 8. Cu was used to deposit each nonmagnetic layer 23 and the thickness thereof was set to 2.4 nm.

CoFe was used to deposit each first inner ferromagnetic layer 242a. The thickness $T_{ku1}$, which was obtained after depositing the ferromagnetic interlayer 243 by the oxidation of the surface, was changed so as to have the values shown in Table 8. The thickness $T_{kn}$ of each ferromagnetic interlayer 243 was set to 0.6 nm. CoFe was used to deposit each second inner ferromagnetic layer 242b and the thickness $T_{ku2}$ thereof was changed as shown in Table 8. Ru was used to deposit each coupling layer 244 and the thickness $T_{kk}$ thereof was set to 0.8 nm. CoFe was used to deposit each outer ferromagnetic layer 245 and the thickness $T_{ks}$ thereof was changed as shown in Table 8. PtMn was used to deposit each antiferromagnetic layer 25 and the thickness thereof was set to 15 nm. Ta was used to deposit each protective layer 26 and the thickness thereof was set to 3 nm.

TABLE 8

| | Thickness (nm) | | | | | | |
|---|---|---|---|---|---|---|---|
| EXAMPLE | Outer soft magnetic layer $T_{ns}$ | Second inner soft magnetic layer $T_{nu2}$ | Interlayer side layer $T_{nub}$ | Nonmagnetic-layer-side layer $T_{nua}$ | First inner ferromagnetic layer $T_{ku1}$ | Second inner ferromagnetic layer $T_{ku2}$ | Outer ferromagnetic layerr $T_{ks}$ |
| 5-1 | 2.0 | 0.8 | 0.8 | 1.0 | 1.7 | 0.9 | 1.2 |
| 5-2 | 2.0 | 1.0 | 1.0 | 1.0 | 1.7 | 0.9 | 1.5 |
| 5-3 | 2.0 | 1.5 | 1.0 | 1.0 | 1.7 | 0.9 | 2.0 |
| 5-4 | 2.0 | 2.0 | 2.0 | 1.0 | 2.1 | 0.9 | 2.5 |

TABLE 8-continued

| EXAMPLE | Thickness (nm) | | | | | | |
|---|---|---|---|---|---|---|---|
| | Outer soft magnetic layer $T_{ns}$ | Second inner soft magnetic layer $T_{nu2}$ | Interlayer side layer $T_{nub}$ | Nonmagnetic-layer-side layer $T_{nua}$ | First inner ferromagnetic layer $T_{ku1}$ | Second inner ferromagnetic layer $T_{ku2}$ | Outer ferromagnetic layerr $T_{ks}$ |
| 5-5 | 3.0 | 1.5 | 1.5 | 1.0 | 1.5 | 0.9 | 2.0 |
| 5-6 | 3.0 | 2.0 | 2.0 | 1.0 | 1.7 | 1.3 | 1.5 |
| 5-7 | 1.5 | 1.0 | 1.0 | 1.0 | 2.4 | 1.0 | 2.5 |
| 5-8 | 3.0 | 1.0 | 1.0 | 1.0 | 1.7 | 0.5 | 2.0 |
| 5-9 | 2.0 | 2.0 | 2.0 | 2.0 | 1.0 | 2.0 | 1.1 |

In each of the prepared stacks 70, the ratio $T_{ns}/(T_{nu2}+T_{nn}+T_{nub}+T_{nua})$ of the thickness $T_{ns}$ of the outer soft magnetic layer 725 to the sum total of the thickness $T_{nu2}$ of the second inner soft magnetic layer 722c, the thickness $T_{nn}$ of the soft magnetic interlayer 723, the thickness $T_{nub}$ of the interlayer-side layer 722b and the thickness $T_{nua}$ of the nonmagnetic-layer-side layer 722a, i.e., $T_{ns}/(T_{nu2}+T_{nn}+T_{nu1})$ is shown in Table 9. Moreover, the ratio $(T_{ku1}+T_{kn}+T_{ku2})/T_{ks}$ of the sum total of the thickness $T_{ku1}$ of the first inner ferromagnetic layer 242a, the thickness $T_{kn}$ of the ferromagnetic interlayer 243 and the thickness $T_{ku2}$ of the second inner ferromagnetic layer 242b to the thickness $T_{ks}$ of the outer ferromagnetic layer 245 is shown in Table 9. Also, the ratio $D_{k1}/Dk_2$ (i.e., $T_{ku1}/T_{ku2}$) of the distance $D_{k1}$ between the nonmagnetic layer 23 and the ferromagnetic interlayer 243 to the distance $D_{k2}$ between the coupling layer 244 and the ferromagnetic interlayer 243 is shown in Table 9.

TABLE 9

| Example | $T_{ns}/(T_{nu2}+T_{nn}+T_{nub}+T_{nua})$ | $(T_{ku1}+T_{kn}+T_{ku2})/T_{ks}$ | $D_{k1}/D_{k2}$ $(T_{ku1}/T_{ku2})$ | Rate of resistance change (%) | Amount of resistance change ΔR (Ω) | Coercive force Hc (Oe) |
|---|---|---|---|---|---|---|
| 5-1 | 0.63 | 2.7 | 1.9 | 13.0 | 0.50 | 0.3 |
| 5-2 | 0.56 | 2.1 | 1.9 | 13.2 | 0.47 | 0.2 |
| 5-3 | 0.49 | 1.6 | 1.9 | 13.6 | 0.44 | 0.3 |
| 5-4 | 0.36 | 1.4 | 2.3 | 14.8 | 0.46 | 0.2 |
| 5-5 | 0.65 | 1.5 | 1.7 | 13.9 | 0.40 | 0.2 |
| 5-6 | 0.54 | 2.4 | 1.3 | 13.0 | 0.37 | 0.4 |
| 5-7 | 0.42 | 1.6 | 2.4 | 12.8 | 0.35 | 0.3 |
| 5-8 | 0.83 | 1.4 | 3.4 | 8.0 | 0.20 | 0.3 |
| 5-9 | 0.30 | 3.3 | 0.5 | 8.3 | 0.18 | 0.2 |

After the stacks 70 were prepared, the stacks 70 underwent the heat treatment at 250° C. for 3 hours in order to antiferromagnetize the antiferromagnetic layer 25. Then, the magnetic field was applied to the stacks 70 while the current was fed through the stacks 70. At this time, the properties of the stacks 70 were examined. The results are shown in Table 9.

As can be seen from Table 9, the examples 5-1 to 5-7 having $T_{ns}/(T_{nu2}+T_{nn}+T_{nub}+T_{nua})$, i.e., $T_{ns}/(T_{nu2}+T_{nn}+T_{nu1})$ within a range of from 0.35 to 0.70 inclusive, $(T_{ku1}+T_{kn}+T_{ku2})/T_{ks}$ within a range of from 1.2 to 3 inclusive and $D_{k1}/D_{k2}$ $(T_{ku1}/T_{ku2})$ within a range of from 1.2 to 3 inclusive could obtain the higher rate of resistance change and the larger amount of resistance change ΔR. Moreover, the examples 5-1 to 5-7 could obtain the higher rate of resistance change and the larger amount of resistance change ΔR and could also reduce the coercive force Hc to the smaller value, compared to the examples 1-1 to 1-9, 2-1 to 2-11, 3-1 to 3-8 and 4-1 to 4-7.

In other words, it turned out that the provision of both of the soft magnetic interlayer 723 and the ferromagnetic interlayer 243 can obtain the higher rate of resistance change and the larger amount of resistance change ΔR compared to the provision of either the soft magnetic interlayer 723 or the ferromagnetic interlayer 243. Also in this case, it turned out that $T_{ns}/(T_{nu2}+T_{nn}+T_{nub}+T_{nua})$, i.e., $T_{ns}/(T_{nu2}+T_{nn}+T_{nu1})$ is set to from 0.35 to 0.70 inclusive, $(T_{ku1}+T_{kn}+T_{ku2})/T_{ks}$ is set to from 1.2 to 3 inclusive and $D_{k1}/D_{k2}$ $(T_{ku1}/T_{ku2})$ is set to from 1.2 to 3 inclusive, whereby the higher rate of resistance change and the larger amount of resistance change ΔR can be obtained.

In the examples 2-4, 3-2 and 5-4 of the above-mentioned examples, the thin film heads described in the aforementioned embodiments were prepared and the properties thereof were measured. The example 2-4 includes the ferromagnetic interlayer, the example 3-2 includes the soft magnetic interlayer and the example 5-4 includes both of the ferromagnetic interlayer and the soft magnetic interlayer. The results of measurement are shown in Table 10. The respective track widths, resistances and MR heights of the stacks 20, 60 and 70 of the prepared thin film heads are shown in Table 10. Moreover, a head output, a standardized output, asymmetry and an output variation (COV: Covariant) were determined to see the properties of the thin film head. The standardized output is equivalent to the head output per unit length of track width. Moreover, the asymmetry was determined by equation (1) described in the above-mentioned embodiments. Furthermore, the output variation was determined by dividing standard deviation (σ) of variations in the head outputs by a mean value of the head outputs after 100 repeats of recording and reproducing.

TABLE 10

| | | Track width of stack (μm) | Resistance of stack (Ω) | MR height (μm) | Head output (μv) | Standardized output (μv/μm) | Asymmetry (%) | Output variation (%) |
|---|---|---|---|---|---|---|---|---|
| Example | 2-4 | 0.78 | 48.2 | 0.51 | 1770 | 2269 | −0.8 | 0.9 |
| | 3-2 | 0.76 | 45.3 | 0.53 | 1950 | 2566 | −0.5 | 0.6 |
| | 5-4 | 0.82 | 46.8 | 0.46 | 2260 | 2756 | 0.2 | 0.5 |
| Comparison | 1-1 | 0.86 | 45.1 | 0.56 | 920 | 1070 | −6.5 | 2.5 |
| | 1-2 | 0.81 | 46.4 | 0.65 | 985 | 1216 | −1.3 | 2.0 |

Also in the comparisons 1-1 and 1-2, the thin film heads were prepared in the same manner and the properties thereof were examined. The comparison 1-1 does not include the soft magnetic interlayer and the ferromagnetic interlayer and does not include the coupling layer of the soft magnetic layer and the coupling layer of the ferromagnetic layer. The comparison 1-2 does not include the soft magnetic interlayer and the ferromagnetic interlayer, and it does not include the coupling layer of the soft magnetic layer, but it includes the coupling layer of the ferromagnetic layer. The results are also shown in Table 10. The track widths, resistances and MR heights of the stacks of the prepared thin film heads are shown in Table 10.

As can be seen from Table 10, according to the examples, the standardized head output exceeding 2000 μV could be obtained. Moreover, the asymmetry could be closer to 0 and the output variation could be as small as below 1.0. That is, according to the examples, it turned out that the higher output can be obtained and the stable waveform of less noise can be obtained.

In the above-described examples, the soft magnetic interlayers 623 and 723 and the ferromagnetic interlayer 243 contain oxide. However, the interlayers 623, 723 and 243 containing nitride or nitride oxide can obtain the same result.

In the above examples, the materials and thicknesses of the underlying layer 21, the underlying-layer-side layer 22b, the outer soft magnetic layers 625 and 725, the coupling layers 624 and 724, the second inner soft magnetic layers 622c and 722c, the interlayer-side layers 622b and 722b, the nonmagnetic-layer-side layers 622a and 722a, the nonmagnetic layer 23, the inner ferromagnetic layer 242, the first inner ferromagnetic layer 242a, the second inner ferromagnetic layer 242b, the coupling layer 244, the outer ferromagnetic layer 245, the antiferromagnetic layer 25 and the protective layer 26 have been described by taking specific examples. However, even if other materials described in the above embodiments are used or other thicknesses described in the above embodiments are set, the same result as the result of the above examples can be obtained.

Although the invention has been described above by referring to some embodiments and examples, the invention is not limited to these embodiments and examples and various modifications of the invention are possible. For example, in the above-described embodiments and examples, the soft magnetic layer, the nonmagnetic layer, the ferromagnetic layer and the antiferromagnetic layer are stacked in this order from bottom, but these layers may be stacked in reverse order. That is, the invention can be broadly applied to the magnetic transducer comprising a nonmagnetic layer having a pair of facing surfaces, a soft magnetic layer formed on one surface of the nonmagnetic layer, a ferromagnetic layer formed on the other surface of the nonmagnetic layer and an antiferromagnetic layer formed on the ferromagnetic layer on the side opposite to the nonmagnetic layer.

Furthermore, in the first embodiment, the soft magnetic layer has a two-layer structure comprising the nonmagnetic-layer-side layer and the underlying-layer-side layer differing from each other in material or composition. However, the soft magnetic layer may have a single-layer structure or the stacked structure comprising three layers or more differing from one another in material or composition. Similarly, in the alternative to the first embodiment, the inner soft magnetic layer has the two-layer structure comprising the nonmagnetic-layer-side layer and the coupling-layer-side layer differing from each other in material or composition. However, the inner soft magnetic layer may have the single-layer structure or the stacked structure comprising three layers or more differing from one another in material or composition.

In the second embodiment, the ferromagnetic layer has both of the coupling layer and the ferromagnetic interlayer. However, the invention also encompasses the example of not having the coupling layer. Furthermore, in the third embodiment, both of the soft magnetic layer and the ferromagnetic layer have the coupling layer. However, the invention also encompasses the example of either the soft magnetic layer or the ferromagnetic layer not having the coupling layer.

Furthermore, in the above-described embodiments, the ferromagnetic interlayer is included in the inner ferromagnetic layer. However, the ferromagnetic interlayer may be included in the outer ferromagnetic layer. Moreover, in the second and third embodiments, the soft magnetic interlayer is included in the inner soft magnetic layer. However, the soft magnetic interlayer may be included in the outer soft magnetic layer.

Additionally, in the above-described embodiments, the inner ferromagnetic layer, the coupling layer and the outer ferromagnetic layer are arranged in this order from the side of the nonmagnetic layer. However, the invention also encompasses the arrangement of the outer ferromagnetic layer, the coupling layer and the inner ferromagnetic layer in this order from the side of the nonmagnetic layer. Moreover, in the second and third embodiments, the inner soft magnetic layer, the coupling layer and the outer soft magnetic layer are arranged in this order from the side of the nonmagnetic layer. However, the invention also encompasses the arrangement of the outer soft magnetic layer, the coupling layer and the inner soft magnetic layer in this order from the side of the nonmagnetic layer.

Moreover, in the above-described embodiments, the stacked film of the ferromagnetic film and the antiferromagnetic film is used as the magnetic domain control film. However, this stacked film may be replaced with the hard magnetic material (the hard magnet).

Furthermore, in the above-described embodiments, the magnetic transducer of the invention is used in the thin film magnetic head for use in both of recording and reproducing.

However, the magnetic transducer of the invention can be also used in the thin film magnetic head for reproducing only. Moreover, the recording head and the reproducing head may be stacked in reverse order or have the stacked structure comprising three layers or more.

In addition, the structure of the magnetic transducer of the invention may be applied to a tunnel junction type magnetoresistive effect film (TMR film).

Furthermore, the magnetic transducer of the invention can be applied to, for example, a sensor for sensing a magnetic signal (e.g., an acceleration sensor), a memory for storing the magnetic signal or the like in addition to the thin film magnetic head described in the above-mentioned embodiments.

As described above, according to a magnetic transducer or a thin film magnetic head of the invention, the ferromagnetic layer includes the ferromagnetic interlayer having the magnetism, and the ferromagnetic interlayer has the higher electrical resistance than at least a part of the rest of the ferromagnetic layer. Thus, the route for the electrons is limited and therefore the rate of resistance change can be increased. Accordingly, even the low signal magnetic field can be detected, and thus the effect of permitting the magnetic recording at high density is achieved. Moreover, the thermal stability is high. Thus, even if the manufacturing process includes the step of heat treatment, less deterioration in properties occurs and therefore the high rate of resistance change can be obtained. Furthermore, the ferromagnetic layer has the magnetizations oriented in opposite directions, thereby reducing the influence of the magnetic field of the ferromagnetic layer upon the soft magnetic layer. As a result, the effect that symmetry of the output of the magnetic transducer can be improved is also achieved.

Moreover, according to another magnetic transducer or another thin film magnetic head of the invention, the soft magnetic layer includes the soft magnetic interlayer having the magnetism, and the soft magnetic interlayer has the higher electrical resistance than at least a part of the rest of the soft magnetic layer. Thus, the route for the electrons is limited and therefore the rate of resistance change can be increased. Moreover, the thermal stability can be increased. Thus, even if the manufacturing process includes the process of heat treatment, less deterioration in properties occurs. Therefore, the effect that the high rate of resistance change can be obtained is also achieved.

Moreover, according to still another magnetic transducer or still another thin film magnetic head of the invention, the soft magnetic layer has the magnetizations oriented in opposite directions. Thus, the effective thickness of the soft magnetic layer is reduced. Therefore, the rate of resistance change can be further increased.

More particularly, according to the magnetic transducer or the thin film magnetic head of one aspect of the invention, the distance between the nonmagnetic layer and the ferromagnetic interlayer is from 1.5 nm to 3 nm inclusive. Thus, the route for the electrons can be effectively limited without excessively concentrating the electrons on the narrow range, and therefore the higher rate of resistance change can be obtained.

Moreover, according to the magnetic transducer of another aspect of the invention, the relationship between the distance $D_{k1}$ between the nonmagnetic layer and the ferromagnetic interlayer and the distance $Dk_2$ between the ferromagnetic interlayer and the coupling layer is defined as $1.2 \leq D_{k1}/D_{k2} \leq 3$. Also, the relationship between the thickness $T_{ku1}$ of the first inner ferromagnetic layer and the thickness $T_{ku2}$ of the second inner ferromagnetic layer is defined as $1.2 \leq T_{ku1}/T_{ku2} \leq 3$. Thus, the route for the electrons can be effectively limited without excessively concentrating the electrons on the narrow range, and therefore the higher rate of resistance change can be obtained.

Additionally, according to the magnetic transducer or the thin film magnetic head of still another aspect of the invention, the distance between the nonmagnetic layer and the soft magnetic interlayer is 1.5 nm or more to less than 3 nm. Thus, the route for the electrons can be effectively limited without excessively concentrating the electrons on the narrow range, and therefore the higher rate of resistance change can be obtained.

Moreover, according to the magnetic transducer of a further aspect of the invention, the relationship between the distance $D_{n1}$ between the nonmagnetic layer and the soft magnetic interlayer and the distance $D_{n2}$ between the soft magnetic interlayer and the coupling layer is defined as $1.5 \leq D_{n1}/D_{n2} \leq 3$. Also, the relationship between the thickness $T_{nu1}$ of the first inner soft magnetic layer and the thickness $T_{nu2}$ of the second inner soft magnetic layer is defined as $1.2 \leq T_{nu1}/T_{nu2} \leq 3$. Thus, the route for the electrons can be effectively limited without excessively concentrating the electrons on the narrow range, and therefore the higher rate of resistance change can be obtained.

Furthermore, according to the magnetic transducer or the thin film magnetic head of a further aspect of the invention, the thickness of the ferromagnetic interlayer is from 0.5 nm to 1 nm inclusive. Also, the thickness of the soft magnetic interlayer is from 0.5 nm to 1 nm inclusive. Thus, the route for the electrons can be effectively limited without decreasing the heat resistance, and therefore the high rate of resistance change can be obtained.

Additionally, according to the magnetic transducer or the thin film magnetic head of a further aspect of the invention, the inner ferromagnetic layer and the outer ferromagnetic layer are magnetically coupled to each other sandwiching the coupling layer. Thus, the ferromagnetic layer can have two magnetizations oriented in opposite directions. It is therefore possible to reduce the influence of the magnetic field of the ferromagnetic layer upon the soft magnetic layer and to thus improve the symmetry of the output of the magnetic transducer.

Furthermore, according to the magnetic transducer or the thin film magnetic head of a further aspect of the invention, the inner soft magnetic layer and the outer soft magnetic layer are magnetically coupled to each other sandwiching the coupling layer. Thus, the soft magnetic layer can have two magnetizations oriented in opposite directions. Thus, the effective thickness of the soft magnetic layer can be reduced and therefore the rate of resistance change can be increased.

Furthermore, according to the magnetic transducer of a further aspect of the invention, the first inner ferromagnetic layer, the ferromagnetic interlayer, the second inner ferromagnetic layer, the coupling layer and the outer ferromagnetic layer are arranged in this order on the nonmagnetic layer. Thus, the route for the electrons can be limited to the particularly narrow range. Therefore, the effect that the rate of resistance change can be further increased is achieved.

Moreover, according to the magnetic transducer of a further aspect of the invention, the first inner soft magnetic layer, the soft magnetic interlayer, the second inner soft magnetic layer, the coupling layer and the outer soft magnetic layer are arranged in this order on the nonmagnetic layer. Thus, the route for the electrons can be limited to the particularly narrow range. Therefore, the rate of resistance change can be further increased.

Additionally, according to the magnetic transducer of a further aspect of the invention, the relationship among the thickness $T_{ku1}$ of the first inner ferromagnetic layer, the thickness $T_{ku2}$ of the second inner ferromagnetic layer, the thickness $T_{kn}$ of the ferromagnetic interlayer and the thickness $T_{ks}$ of the outer ferromagnetic layer is defined as $1.2 \leq (T_{ku1}+T_{ku2}+T_{kn})/T_{ks} \leq 3$. Thus, the rate of resistance change can be increased without weakening the magnetic coupling between the outer ferromagnetic layer and the second inner ferromagnetic layer.

Similarly, according to the magnetic transducer of a further aspect of the invention, the relationship among the thickness $T_{nu1}$ of the first inner soft magnetic layer, the thickness $T_{nu2}$ of the second inner soft magnetic layer, the thickness $T_{nn}$ of the soft magnetic interlayer and the thickness $T_{ns}$ of the outer soft magnetic layer is defined as $0.35 \leq (T_{nu1}+T_{nu2}+T_{nn})/T_{ns} \leq 0.7$. Thus, the following effect is achieved. The effective thickness of the soft magnetic layer can be reduced and the rate of resistance change can be increased without weakening the magnetic coupling between the first inner soft magnetic layer and the second inner soft magnetic layer.

Furthermore, according to the magnetic transducer of a further aspect of the invention, the ferromagnetic interlayer and the inner ferromagnetic layer comprise some common elements. Thus, the inner ferromagnetic layer is oxidized, nitrided or oxidized and nitrided, whereby the ferromagnetic interlayer can be easily obtained. Similarly, the soft magnetic interlayer and the inner soft magnetic layer comprise some common elements. Thus, the inner soft magnetic layer is oxidized, nitrided or oxidized and nitrided, whereby the soft magnetic interlayer can be easily obtained.

Additionally, according to the magnetic transducer of a further aspect of the invention, the ferromagnetic interlayer contains at least one of oxide, nitride and nitride oxide. Also, the soft magnetic interlayer contains at least one of oxide, nitride and nitride oxide. Thus, the ferromagnetic interlayer and the soft magnetic interlayer can be magnetically stabilized, and therefore the variation in output can be reduced.

Additionally, according to the magnetic transducer of a further aspect of the invention, the distance between the coupling layer and the soft magnetic interlayer of the soft magnetic layer is from 0.8 nm to 2.0 nm inclusive. Thus, the high rate of resistance change can be obtained without weakening the magnetic coupling between the layers on both sides of the coupling layer, without weakening the magnetic coupling between the layers on both sides of the soft magnetic layer and without decreasing the heat resistance.

Obviously many modifications and variations of the present invention are possible in the light of the above teachings. It is therefore to be understood that within the scope of the appended claims the invention may be practiced otherwise than as specifically described.

What is claimed is:

1. A magnetic transducer comprising:
   a nonmagnetic layer having a pair of facing surfaces;
   a soft magnetic layer formed on one surface of the nonmagnetic layer;
   a ferromagnetic layer formed on the other surface of the nonmagnetic layer and capable of having two magnetizations oriented in opposite directions; and
   an antiferromagnetic layer formed on the ferromagnetic layer on the side opposite to the nonmagnetic layer,
   wherein the ferromagnetic layer includes a ferromagnetic interlayer having magnetism, and
   the ferromagnetic interlayer has higher electrical resistance than at least a part of the rest of the ferromagnetic layer, the ferromagnetic interlayer reflecting at least a part of electrons, whereby a route in which the electrons travel is narrowed and the ferromagnetic interlayer containing at least one of oxide, nitride and nitride oxide.

2. A magnetic transducer according to claim 1, wherein a distance $D_1$ between the nonmagnetic layer and the ferromagnetic interlayer is from 1.5 nm to 3 nm inclusive.

3. A magnetic transducer according to claim 1, wherein a thickness of the ferromagnetic interlayer is larger than or equal to 0.5 nm and smaller than 1 nm.

4. A magnetic transducer according to claim 1, wherein the ferromagnetic layer includes an inner ferromagnetic layer, an outer ferromagnetic layer and a coupling layer sandwiched therebetween, and
   the inner ferromagnetic layer and the outer ferromagnetic layer are magnetically coupled to each other sandwiching the coupling layer so that the magnetizations thereof may be oriented in opposite directions.

5. A magnetic transducer according to claim 4, wherein a relationship between the distance $D_{k1}$ between the nonmagnetic layer and the ferromagnetic interlayer and a distance $D_{k2}$ between the ferromagnetic interlayer and the coupling layer of the ferromagnetic layer is defined as $1.2 \leq D_{k1}/D_{k2} \leq 3$.

6. A magnetic transducer according to claim 4, wherein the inner ferromagnetic layer has a first inner ferromagnetic layer and a second inner ferromagnetic layer, and
   the ferromagnetic interlayer is formed between the first inner ferromagnetic layer and the second inner ferromagnetic layer.

7. A magnetic transducer according to claim 6, wherein the first inner ferromagnetic layer, the ferromagnetic interlayer, the second inner ferromagnetic layer, the coupling layer and the outer ferromagnetic layer are arranged in this order on the non magnetic layer.

8. A magnetic transducer according to claim 6, wherein the first inner ferromagnetic layer and the second inner ferromagnetic layer have the magnetization oriented in the same direction.

9. A magnetic transducer according to claim 6, wherein a relationship between a thickness $T_{ku1}$ of the first inner ferromagnetic layer of the inner ferromagnetic layer and a thickness $T_{ku1}$ of the second inner ferromagnetic layer thereof is defined as $1.2 \leq T_{ku1}/T_{ku2} \leq 3$.

10. A magnetic transducer according to claim 6, wherein a relationship between the sum total of the thickness $T_{ku1}$ of the first inner ferromagnetic layer, the thickness $T_{ku2}$ of the second inner ferromagnetic layer and a thickness $T_{kn}$ of the ferromagnetic interlayer, and a thickness $T_{ks}$ of the outer ferromagnetic layer is defined as $1.2 \leq (T_{ku1}+T_{ku2}+T_{kn})/T_{ks} \leq 3$.

11. A magnetic transducer according to claim 4, wherein the inner ferromagnetic layer and the outer ferromagnetic layer contain at least one kind of element in a group consisting of nickel (Ni), cobalt (Co) and iron (Fe).

12. A magnetic transducer according to claim 4, wherein the coupling layer of the ferromagnetic layer contains at least one kind of element in a group consisting of ruthenium (Ru), rhodium (Rh), rhenium (Re), chromium (Cr) and zirconium (Zr), and
   the thickness of the coupling layer is from 0.2 nm to 1.2 nm inclusive.

13. A magnetic transducer according to claim 4, wherein the ferromagnetic interlayer has some common elements with the inner ferromagnetic layer.

14. A magnetic transducer according to claim 1, wherein the antiferromagnetic layer contains at least one kind of element in a group consisting of ruthenium, rhodium, platinum (Pt), palladium (Pd), iron, nickel, cobalt, chromium, iridium (Ir), rhenium and oxygen (O) and manganese(Mn).

15. A magnetic transducer according to claim 1, wherein the nonmagnetic layer contains at least one kind of element in a group consisting of gold (Au), silver (Ag) and copper (Cu).

16. A magnetic transducer according to claim 1, wherein the soft magnetic layer includes an inner soft magnetic layer, an outer soft magnetic layer and a coupling layer sandwiched therebetween, and the inner soft magnetic layer and the outer soft magnetic layer are magnetically coupled to each other sandwiching the coupling layer so that the magnetizations thereof may be oriented in opposite directions.

17. A magnetic transducer according to claim 16, wherein the inner soft magnetic layer has two layers or more differing in material or composition.

18. A magnetic transducer according to claim 1, wherein the soft magnetic layer includes a soft magnetic interlayer having magnetism, and the soft magnetic interlayer has higher electrical resistance than at least a part of the rest of the soft magnetic layer.

19. A magnetic transducer according to claim 18, wherein a distance $D_{n1}$ between the nonmagnetic layer and the soft magnetic interlayer is from 1.5 nm to 3 nm inclusive.

20. A magnetic transducer according to claim 18, wherein the thickness of the soft magnetic interlayer is from 0.5 nm to 1 nm inclusive.

21. A magnetic transducer according to claim 18, wherein the soft magnetic layer includes an inner soft magnetic layer, an outer soft magnetic layer and a coupling layer sandwiched therebetween, and the inner soft magnetic layer and the outer soft magnetic layer are magnetically coupled to each other sandwiching the coupling layer so that the magnetizations thereof may be oriented in opposite directions.

22. A magnetic transducer according to claim 21, wherein a distance $D_{n2}$ between the coupling layer and the soft magnetic interlayer of the soft magnetic layer is from 0.8 nm to 2.0 nm inclusive.

23. A magnetic transducer according to claim 21, wherein a relationship between the distance $D_{n1}$ between the nonmagnetic layer and the soft magnetic interlayer and the distance $D_{n2}$ between the soft magnetic interlayer and the coupling layer of the soft magnetic layer is defined as $1.2 \leq D_{n1}/D_{n2} \leq 3$.

24. A magnetic transducer according to claim 21, wherein the inner soft magnetic layer has a first inner soft magnetic layer and a second inner soft magnetic layer, and the soft magnetic interlayer is formed between the first inner soft magnetic layer and the second inner soft magnetic layer.

25. A magnetic transducer according to claim 24, wherein the first inner soft magnetic layer, the soft magnetic interlayer, the second inner soft magnetic layer, the coupling layer and the outer soft magnetic layer are arranged in this order on the nonmagnetic layer.

26. A magnetic transducer according to claim 24, wherein a relationship between the sum total of a thickness $T_{nu1}$ of the first inner soft magnetic layer, a thickness $T_{nu2}$ of the second inner soft magnetic layer and a thickness $T_{nn}$ of the soft magnetic interlayer and a thickness $T_{ns}$ of the outer soft magnetic layer is defined as $0.35 \leq T_{ns}/(T_{nu1}+T_{nn}+T_{nu2}) \leq 0.70$.

27. A magnetic transducer according to claim 24, wherein the first inner soft magnetic layer includes a nonmagnetic-layer-side layer close to the nonmagnetic layer and an interlayer-side layer close to the soft magnetic interlayer.

28. A magnetic transducer according to claim 27, wherein the nonmagnetic-layer-side layer contains at least cobalt in a group consisting of nickel, cobalt and iron, and the interlayer-side layer, the second inner soft magnetic layer and the outer soft magnetic layer contain at least nickel in a group consisting of nickel, cobalt, iron, tantalum, chromium, rhodium, molybdenum and niobium.

29. A magnetic transducer according to claim 21, wherein the coupling layer included in the soft magnetic layer contains at least one kind of element in a group consisting of ruthenium, rhodium, rhenium, chromium and zirconium, and the thickness of the coupling layer is from 0.2 nm to 1.2 nm inclusive.

30. A magnetic transducer according to claim 21, wherein the soft magnetic interlayer has some common elements with the inner soft magnetic layer.

31. A magnetic transducer according to claim 18, wherein the soft magnetic interlayer contains at least one of oxide, nitride and nitride oxide.

32. A magnetic transducer comprising:
a nonmagnetic layer having a pair of facing surfaces;
a soft magnetic layer formed on one surface of the nonmagnetic layer;
a ferromagnetic layer formed on the other surface of the nonmagnetic layer; and
an antiferromagnetic layer formed on the ferromagnetic layer on the side opposite to the nonmagnetic layer,
wherein the ferromagnetic layer has a first ferromagnetic layer, a second ferromagnetic layer, a third ferromagnetic layer, a magnetic interlayer sandwiched between the first ferromagnetic layer and the second ferromagnetic layer, and a nonmagnetic interlayer sandwiched between the second ferromagnetic layer and the third ferromagnetic layer, the magnetic interlayer having higher electrical resistance than that of at least the first ferromagnetic layer, the magnetic interlayer reflecting at least a part of electrons, whereby a route in which the electrons travel is narrowed and the magnetic interlayer containing at least one of oxide, nitride and nitride oxide.

33. A thin film magnetic head having a magnetic transducer,
the magnetic transducer comprising:
a nonmagnetic layer having a pair of facing surfaces;
a soft magnetic layer formed on one surface of the nonmagnetic layer;
a ferromagnetic layer formed on the other surface of the nonmagnetic layer and capable of having two magnetizations oriented in opposite directions; and
an antiferromagnetic layer formed on the ferromagnetic layer on the side opposite to the nonmagnetic layer,
wherein the ferromagnetic layer includes a ferromagnetic interlayer having magnetism, and
the ferromagnetic interlayer has higher electrical resistance than at least a part of the rest of the ferromagnetic layer, the ferromagnetic interlayer reflecting at least a part of electrons, whereby a route in which the electrons travel is narrowed and the ferromagnetic interlayer containing at least one of oxide, nitride and nitride oxide.

34. A thin film magnetic head according to claim 33, wherein the distance $D_1$ between the nonmagnetic layer and the ferromagnetic interlayer is from 1.5 nm to 3 nm inclusive.

35. A thin film magnetic head according to claim 33, wherein the thickness of the ferromagnetic interlayer is from 0.5 nm to 1 nm inclusive.

36. A thin film magnetic head according to claim 33, wherein the ferromagnetic layer includes an inner ferromagnetic layer, an outer ferromagnetic layer and a coupling layer sandwiched therebetween, and the inner ferromagnetic layer and the outer ferromagnetic layer are magnetically coupled to each other sandwiching the coupling layer so that the magnetizations thereof may be oriented in opposite directions.

37. A thin film magnetic head according to claim 33, wherein the soft magnetic layer includes an inner soft magnetic layer, an outer soft magnetic layer and a coupling layer sandwiched therebetween, and the inner soft magnetic layer and the outer soft magnetic layer are magnetically coupled to each other through the coupling layer so that the magnetizations thereof may be oriented in opposite directions.

38. A thin film magnetic head according to claim 33, wherein the soft magnetic layer includes a soft magnetic interlayer having magnetism, and the soft magnetic interlayer has higher electrical resistance than at least a part of the rest of the soft magnetic layer.

39. A thin film magnetic head having a magnetic transducer, the magnetic transducer comprising:

a nonmagnetic layer having a pair of facing surfaces;

a soft magnetic layer formed on one surface of the nonmagnetic layer;

a ferromagnetic layer formed on the other surface of the nonmagnetic layer; and an antiferromagnetic layer formed on the ferromagnetic layer on the side opposite to the nonmagnetic layer, wherein the ferromagnetic layer has a first ferromagnetic layer, a second ferromagnetic layer, a third ferromagnetic layer, a magnetic interlayer sandwiched between the first ferromagnetic layer and the second ferromagnetic layer, and a nonmagnetic interlayer sandwiched between the second ferromagnetic layer and the third ferromagnetic layer, the magnetic interlayer having higher electrical resistance than that of at least the first ferromagnetic layer, the magnetic interlayer reflecting at least a part of electrons, whereby a route in which the electrons travel is narrowed and the magnetic interlayer containing at least one of oxide, nitride and nitride oxide.

* * * * *